(12) United States Patent
Alsmeier

(10) Patent No.: US 9,230,976 B2
(45) Date of Patent: *Jan. 5, 2016

(54) METHOD OF MAKING ULTRAHIGH DENSITY VERTICAL NAND MEMORY DEVICE

(71) Applicant: SANDISK TECHNOLOGIES INC., Plano, TX (US)

(72) Inventor: Johann Alsmeier, San Jose, CA (US)

(73) Assignee: SANDISK TECHNOLOGIES INC., Plano, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/587,368

(22) Filed: Dec. 31, 2014

(65) Prior Publication Data

US 2015/0171099 A1 Jun. 18, 2015

Related U.S. Application Data

(60) Continuation of application No. 14/283,431, filed on May 21, 2014, now Pat. No. 8,946,810, which is a continuation of application No. 14/086,139, filed on Nov. 21, 2013, now Pat. No. 8,829,591, which is a (Continued)

(51) Int. Cl.
*H01L 21/336* (2006.01)
*H01L 27/115* (2006.01)
(Continued)

(52) U.S. Cl.
CPC .... *H01L 27/11556* (2013.01); *H01L 21/28273* (2013.01); *H01L 21/28282* (2013.01); *H01L 27/1157* (2013.01); *H01L 27/11517* (2013.01); *H01L 27/11519* (2013.01);

(Continued)

(58) Field of Classification Search
CPC ............ H01L 27/0688; H01L 27/1157; H01L 27/11582
USPC ......... 257/213, 316, 319, 314, 331, 324–326, 257/393, E29.131; 438/216, 257–259, 593, 438/264, 268, 278
See application file for complete search history.

(56) References Cited

U.S. PATENT DOCUMENTS 5,583,360 A 12/1996 Roth et al.
5,897,354 A 4/1999 Kachelmeier (Continued)

FOREIGN PATENT DOCUMENTS

WO WO02/15277 A2 2/2002

OTHER PUBLICATIONS

International Search Report & Written Opinion, PCT/US2011/042566, Jan. 17, 2012.

(Continued)

*Primary Examiner* — Dung Le
(74) *Attorney, Agent, or Firm* — The Marbury Law Group PLLC

(57) ABSTRACT

Monolithic, three dimensional NAND strings include a semiconductor channel, at least one end portion of the semiconductor channel extending substantially perpendicular to a major surface of a substrate, a plurality of control gate electrodes having a strip shape extending substantially parallel to the major surface of the substrate, the blocking dielectric comprising a plurality of blocking dielectric segments, a plurality of discrete charge storage segments, and a tunnel dielectric located between each one of the plurality of the discrete charge storage segments and the semiconductor channel.

20 Claims, 57 Drawing Sheets

Related U.S. Application Data continuation of application No. 14/051,627, filed on Oct. 11, 2013, now Pat. No. 8,765,543, which is a division of application No. 13/875,854, filed on May 2, 2013, now Pat. No. 8,580,639, which is a division of application No. 13/693,337, filed on Dec. 4, 2012, now Pat. No. 8,461,000, which is a division of application No. 12/827,761, filed on Jun. 30, 2010, now Pat. No. 8,349,681.

(51) Int. Cl.
| | |
|---|---|
| *H01L 29/66* | (2006.01) |
| *H01L 29/788* | (2006.01) |
| *H01L 29/792* | (2006.01) |
| *H01L 21/28* | (2006.01) |
| *H01L 29/49* | (2006.01) |

(52) U.S. Cl.
CPC ... *H01L 27/11551* (2013.01); *H01L 27/11565* (2013.01); *H01L 27/11578* (2013.01); *H01L 27/11582* (2013.01); *H01L 29/495* (2013.01); *H01L 29/66825* (2013.01); *H01L 29/66833* (2013.01); *H01L 29/7883* (2013.01); *H01L 29/7889* (2013.01); *H01L 29/7926* (2013.01)

(56) References Cited

U.S. PATENT DOCUMENTS

| | | | |
|---|---|---|---|
| 6,238,978 B1 | 5/2001 | Huster | |
| 6,953,697 B1 | 10/2005 | Castle et al. | |
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,271,444 B2 | 9/2007 | Furukawa et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 7,875,922 B2 | 1/2011 | Arai et al. | |
| 8,008,710 B2 | 8/2011 | Fukuzumi et al. | |
| 8,008,722 B2 | 8/2011 | Kim et al. | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,237,213 B2 | 8/2012 | Liu | |
| 8,349,681 B2 | 1/2013 | Alsmeier et al. | |
| 8,450,791 B2 | 5/2013 | Alsmeier | |
| 8,461,000 B2 | 6/2013 | Alsmeier et al. | |
| 8,580,639 B2 | 11/2013 | Alsmeier et al. | |
| 8,829,591 B2 | 9/2014 | Alsmeier | |
| 2007/0210338 A1 | 9/2007 | Orlowski | |
| 2007/0252201 A1 | 11/2007 | Kito et al. | |
| 2008/0173928 A1 | 7/2008 | Arai et al. | |
| 2009/0283819 A1 | 11/2009 | Ishikawa et al. | |
| 2009/0294828 A1 | 12/2009 | Ozawa et al. | |
| 2010/0044778 A1 | 2/2010 | Seol et al. | |
| 2010/0120214 A1 | 5/2010 | Park et al. | |
| 2010/0155810 A1 | 6/2010 | Kim et al. | |
| 2010/0155818 A1 | 6/2010 | Cho et al. | |
| 2010/0213527 A1 | 8/2010 | Shim et al. | |
| 2012/0012921 A1 | 1/2012 | Liu | |
| 2013/0237024 A1 | 9/2013 | Alsmeier et al. | |
| 2014/0045307 A1 | 2/2014 | Alsmeier et al. | |
| 2014/0131787 A1 | 5/2014 | Alsmeier | |
| 2014/0175530 A1 | 6/2014 | Chien et al. | |
| 2014/0225181 A1* | 8/2014 | Makala et al. | 257/321 |
| 2014/0252452 A1 | 9/2014 | Alsmeier | |
| 2014/0353738 A1 | 12/2014 | Makala et al. | |
| 2015/0072488 A1* | 3/2015 | Chien et al. | 438/264 |

OTHER PUBLICATIONS

Invitation to Pay Additional Fees and Partial International Search Report, PCT/US2011/042566, Sep. 28, 2011.

Endoh et al., "Novel Ultra High Density Memory with a Stacked-Surrounding Gate Transistor (S-SGT) Structured Cell," IEDM Proc., (2001), 33-36.

Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-shaped BiCS Flash Memory," 2009 Symposium on VLSI Technology Digest of Technical Papers, pp. 22-23.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

International Preliminary Report on Patentability, PCT/US2011/042566, Jan. 17, 2013.

First Office Action of Chinese Patent Application No. 201180030053.2, dated Nov. 20, 2014, (11 pages).

European Office Communication Article 94(3) EPC for Corresponding EP 11745848.9, dated May 12, 2015.

* cited by examiner

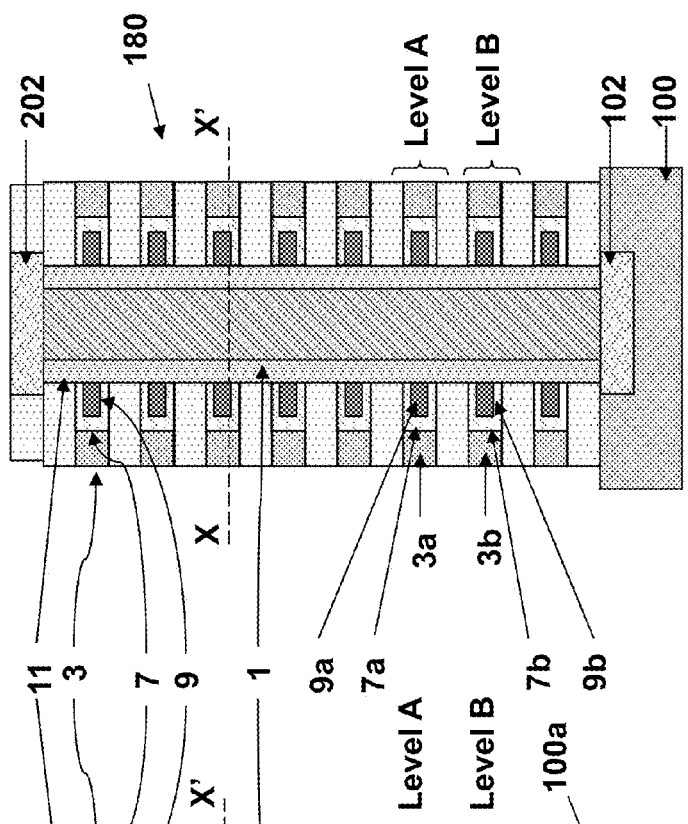
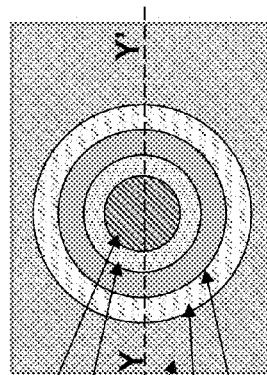
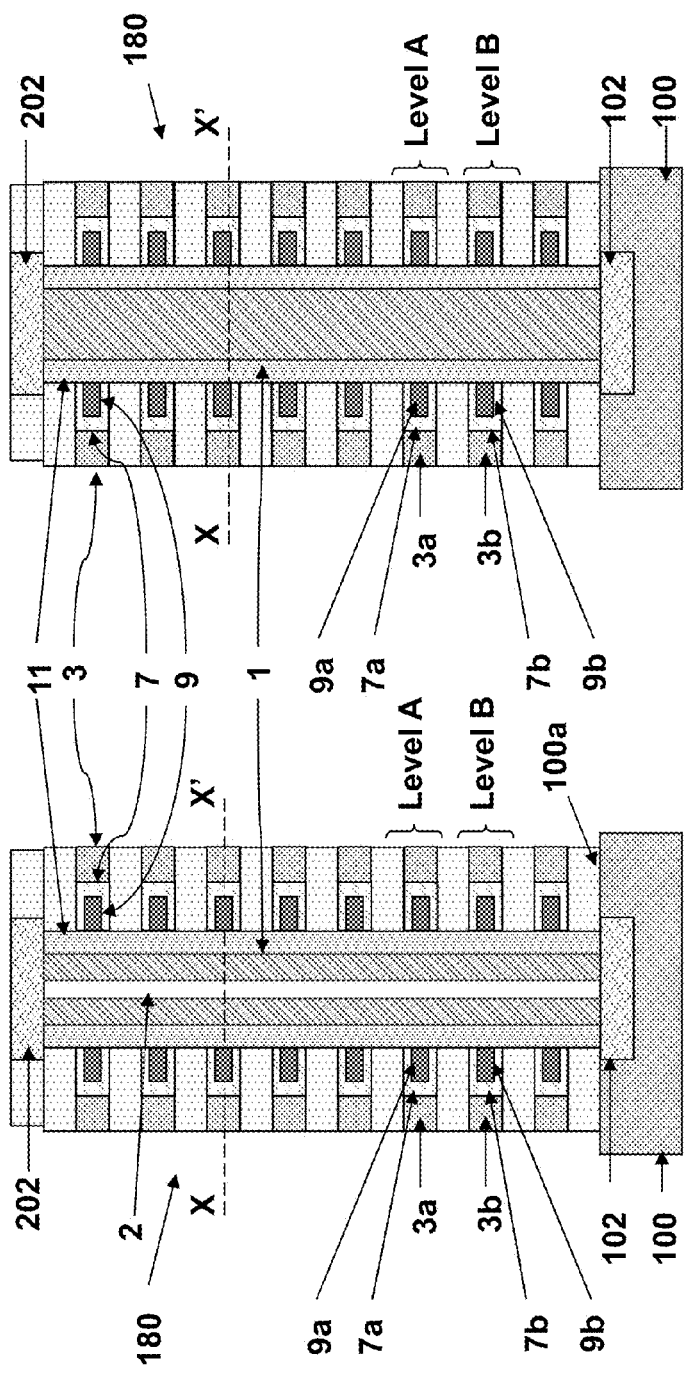
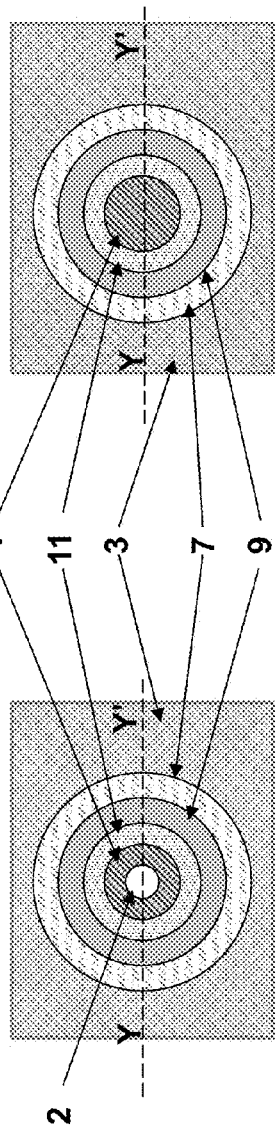

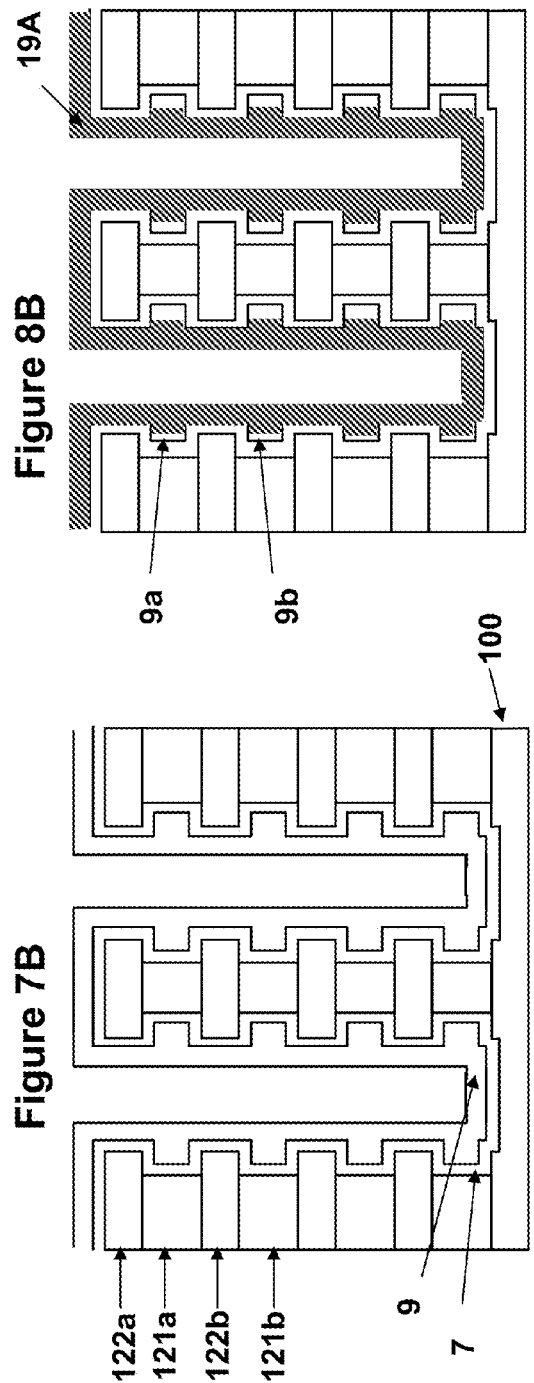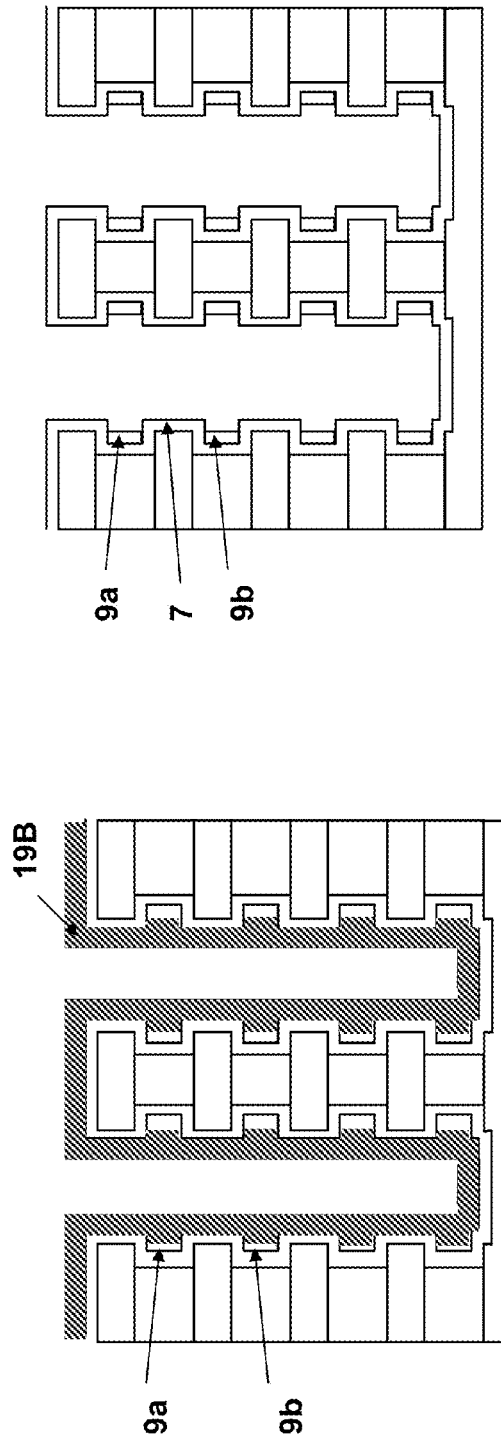

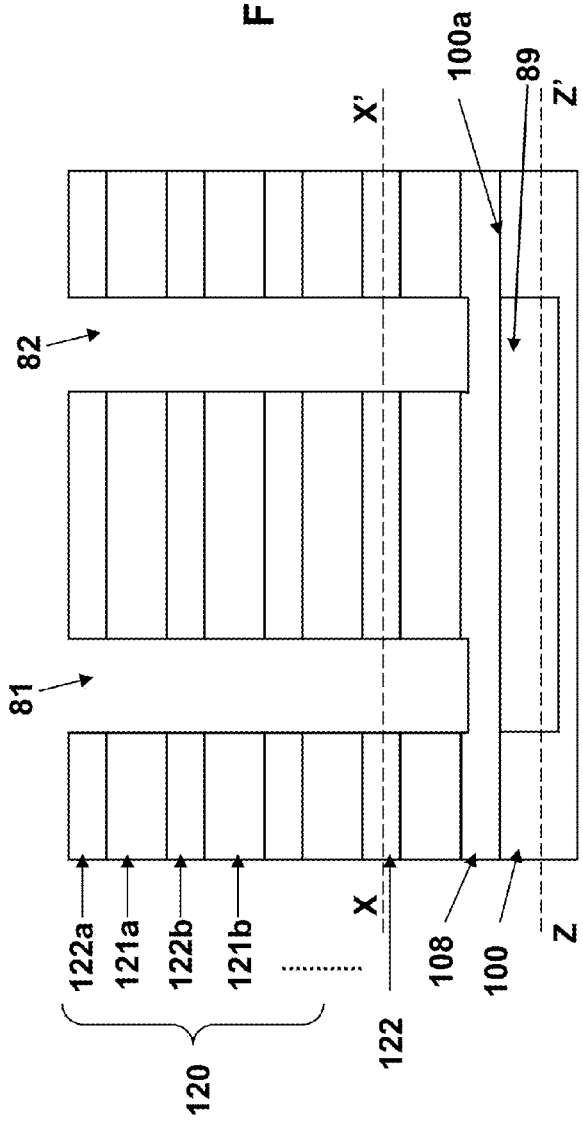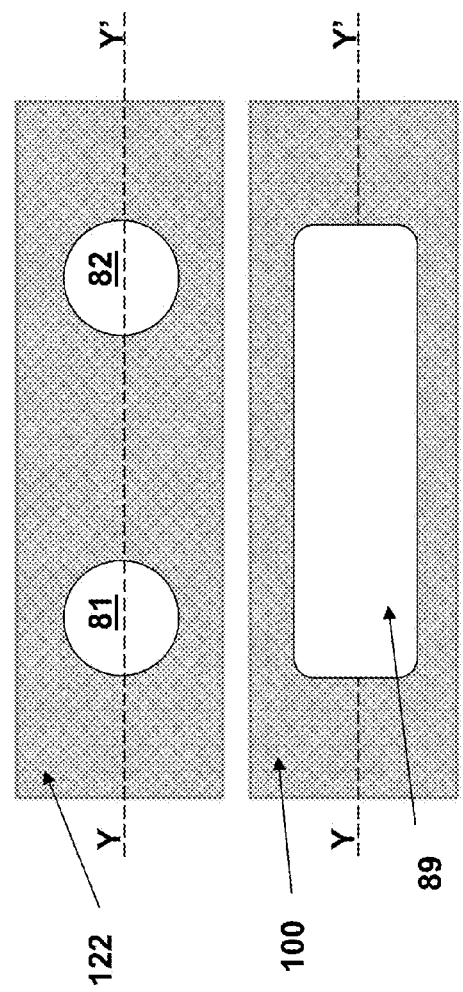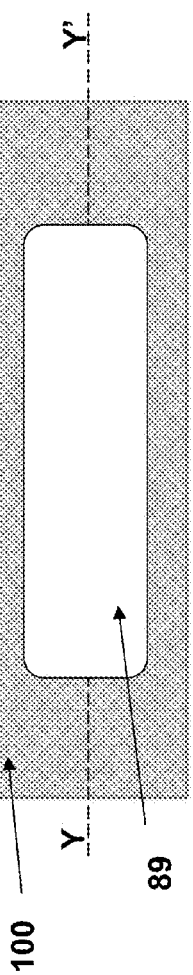

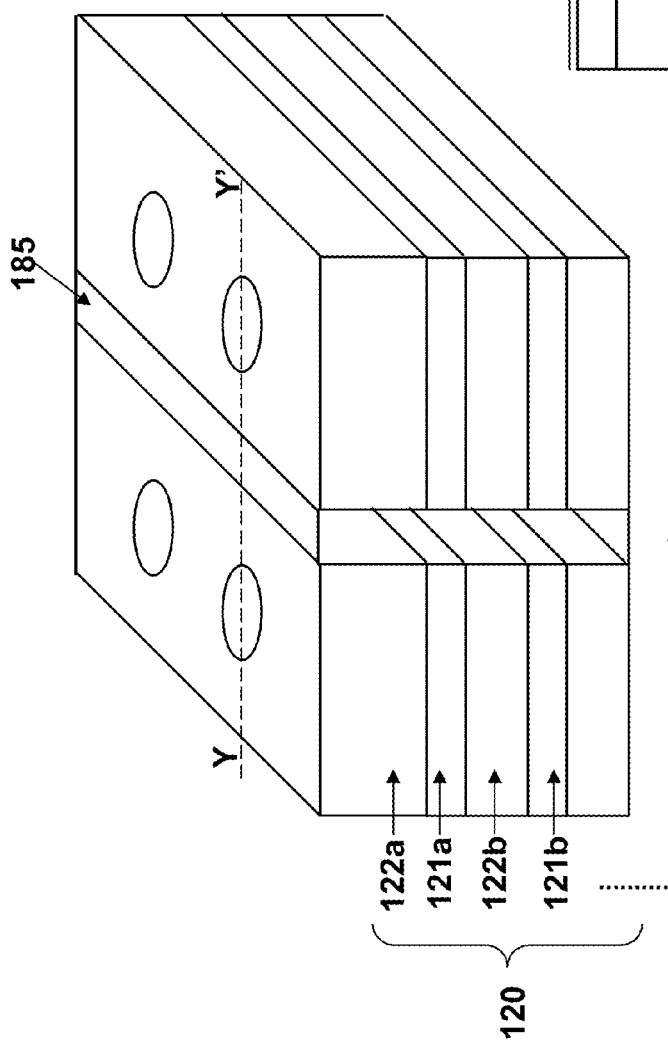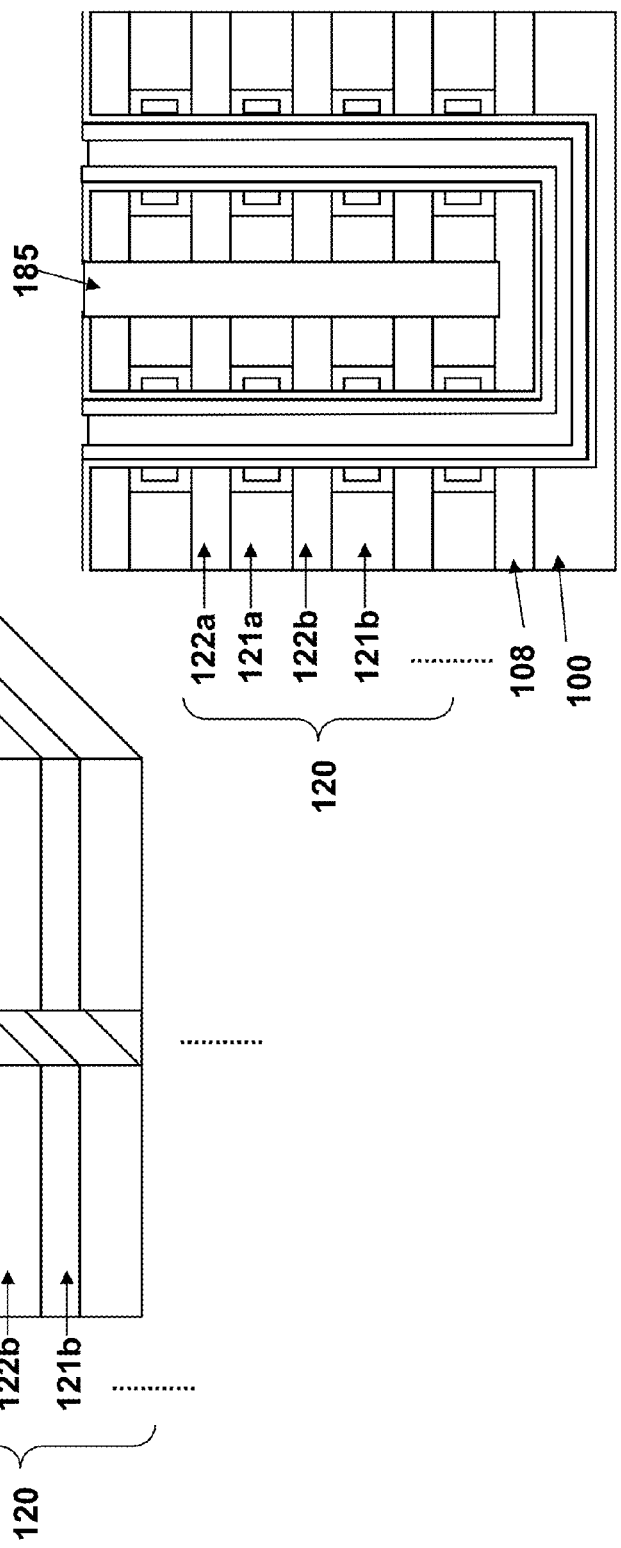

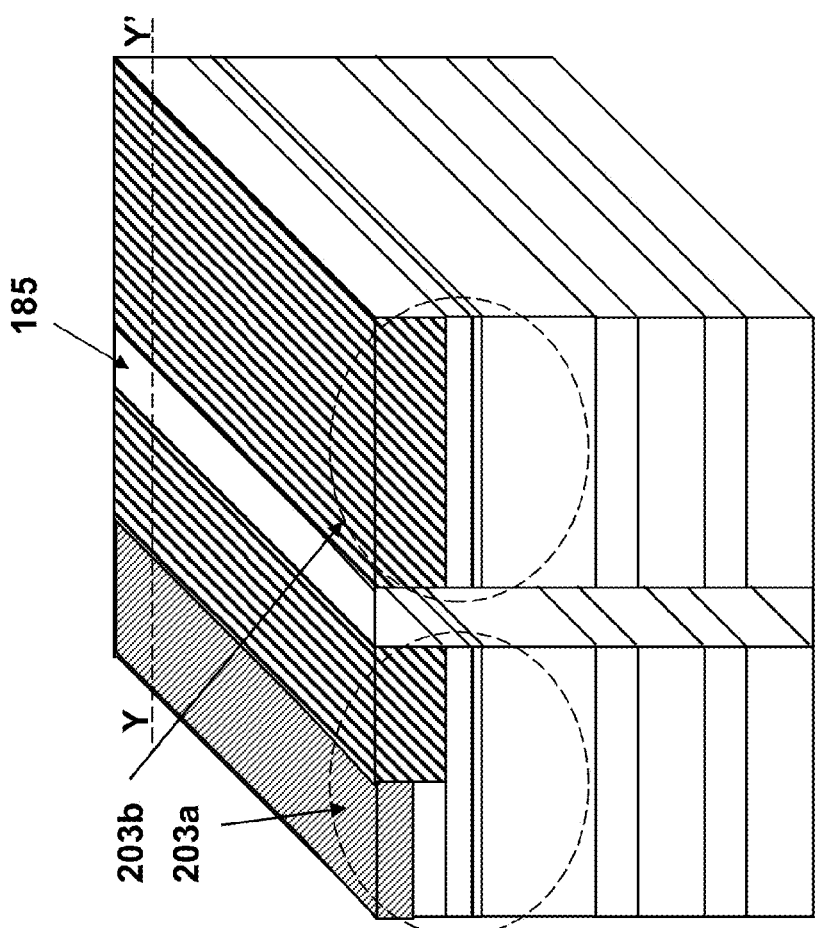
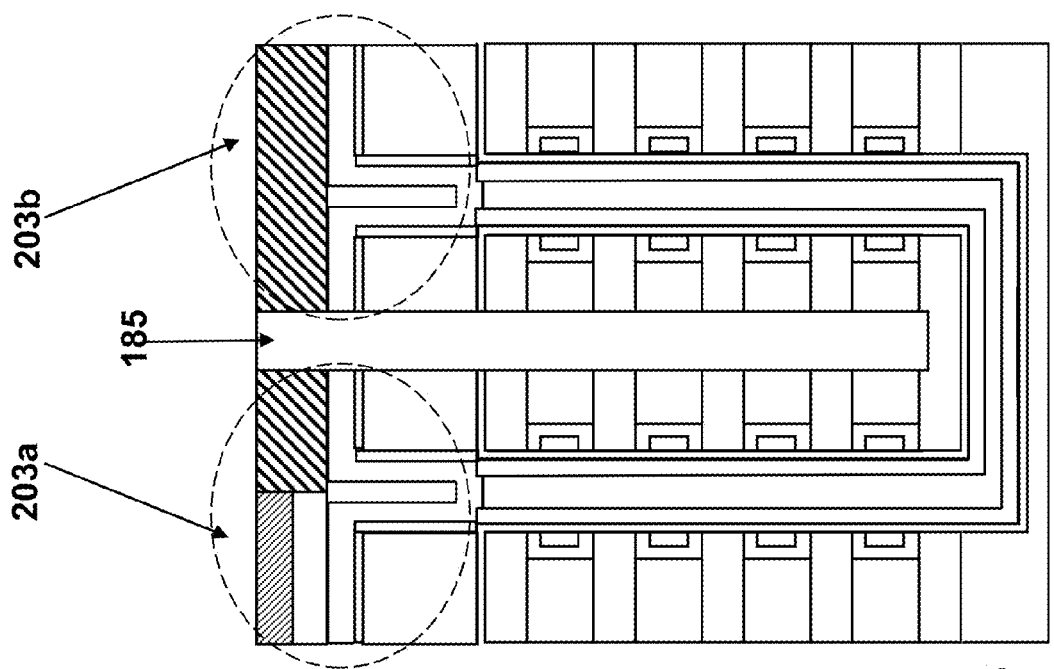
Figure 20A
Figure 20B

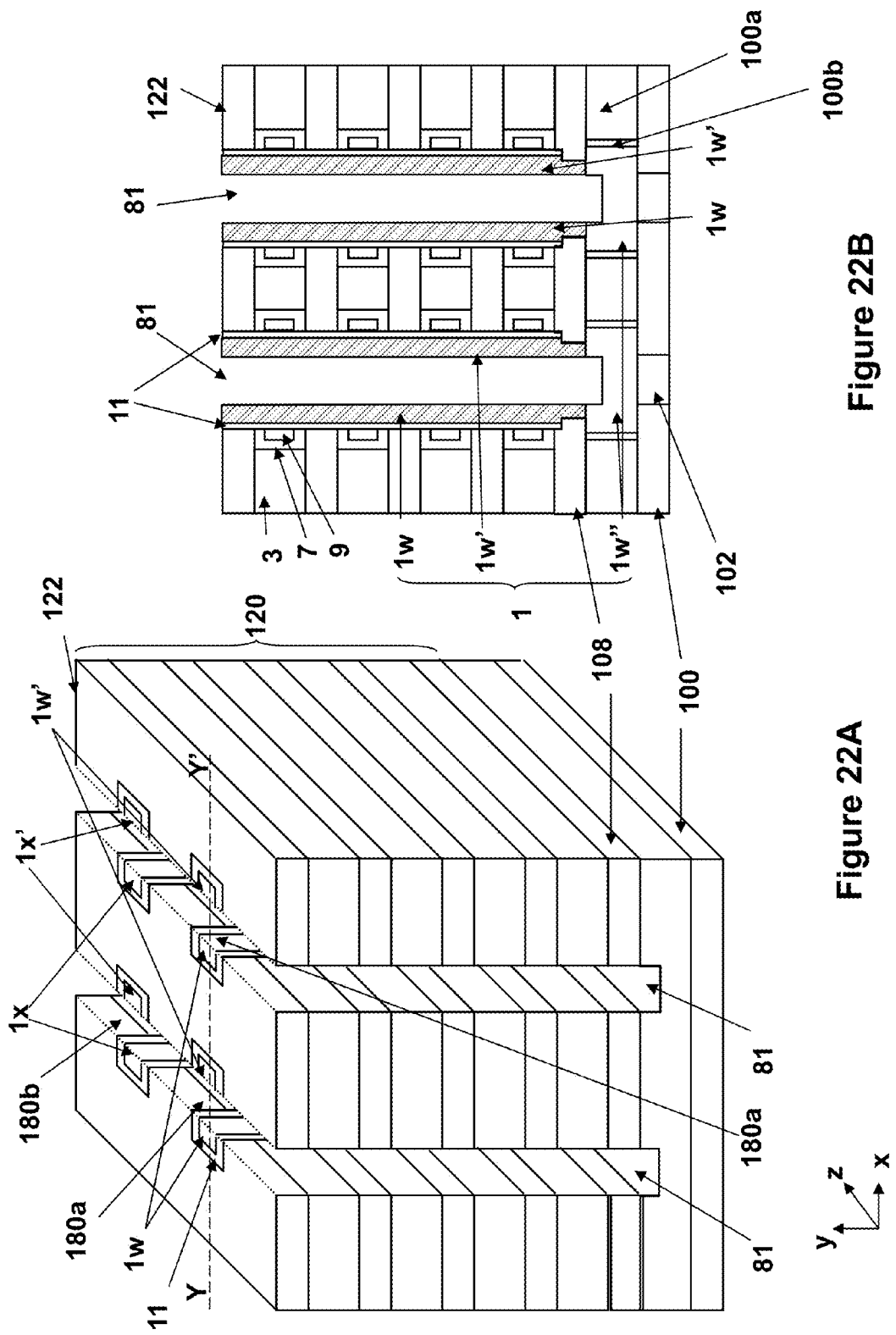

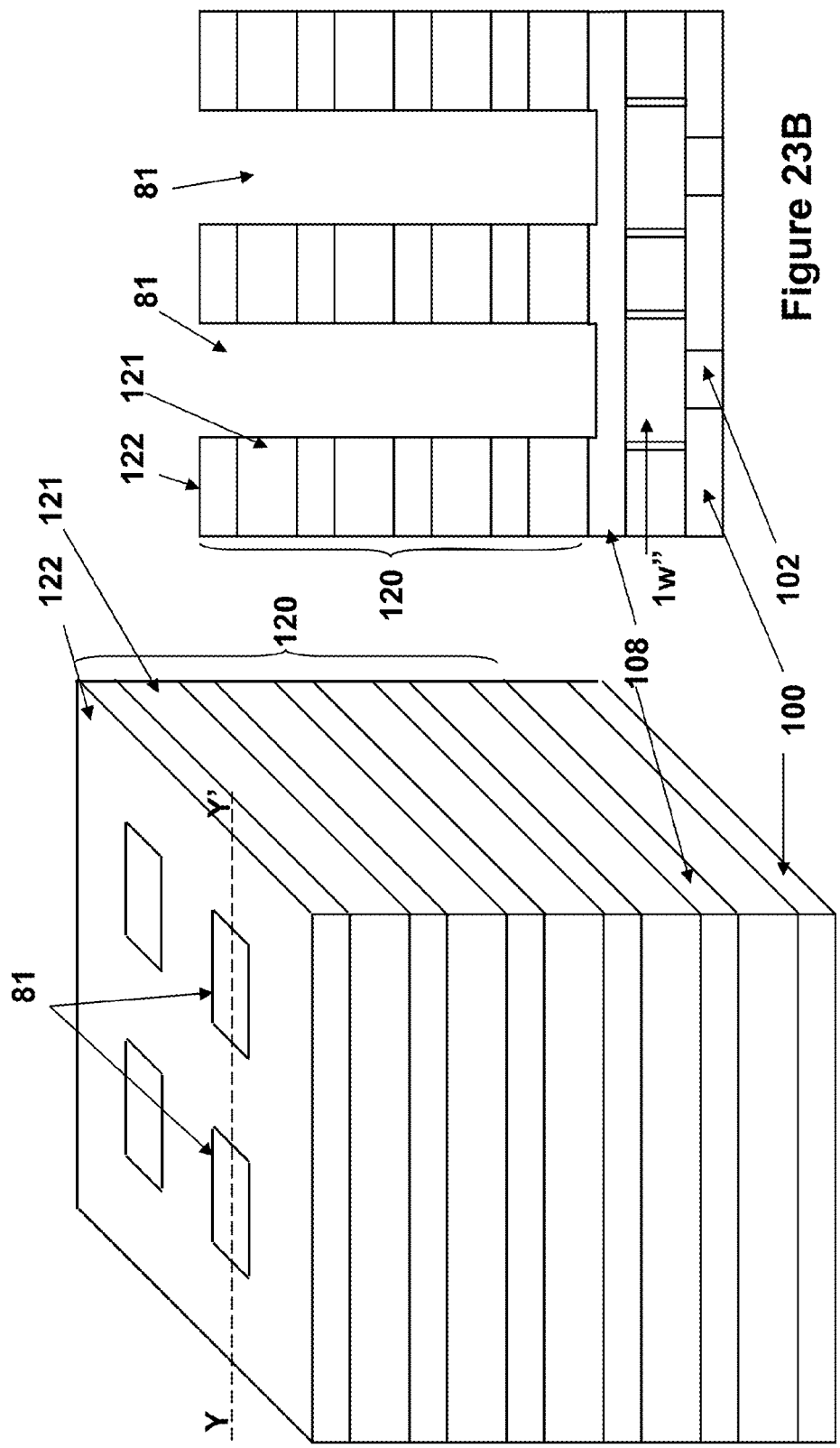

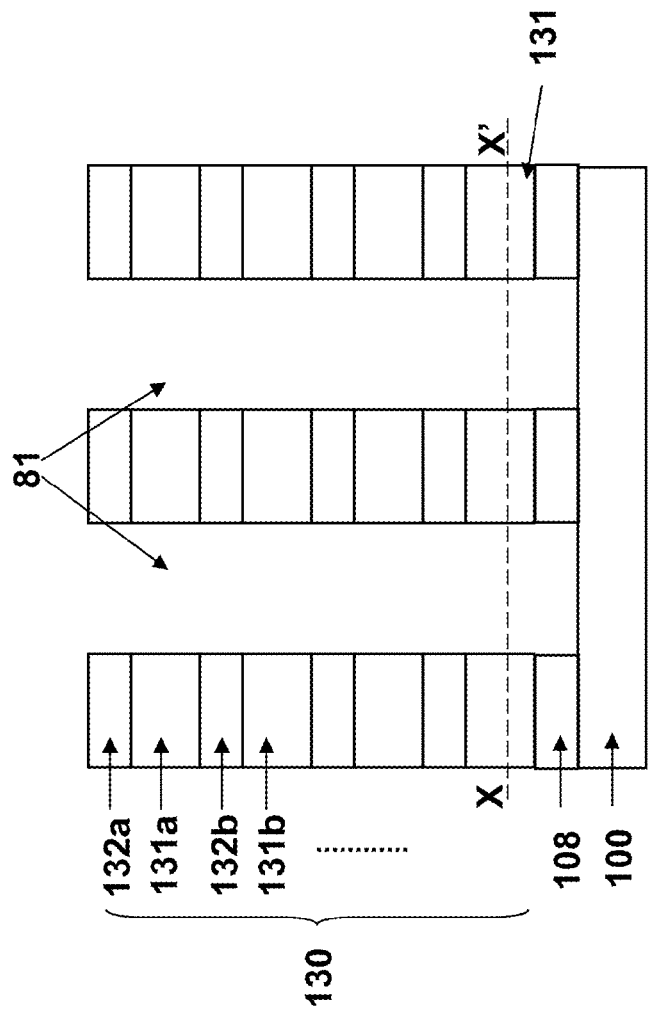
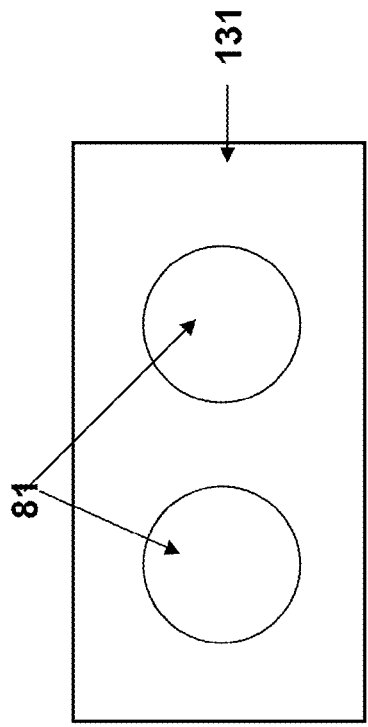
Figure 29A
Figure 29B

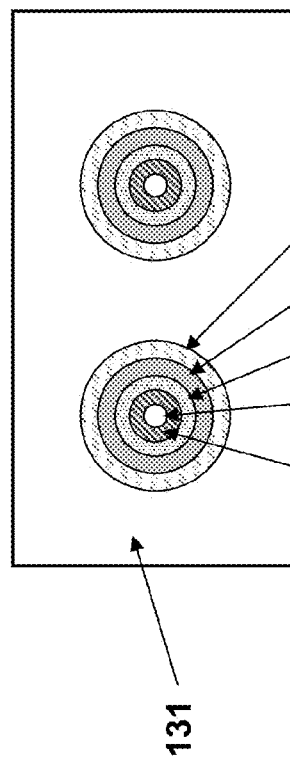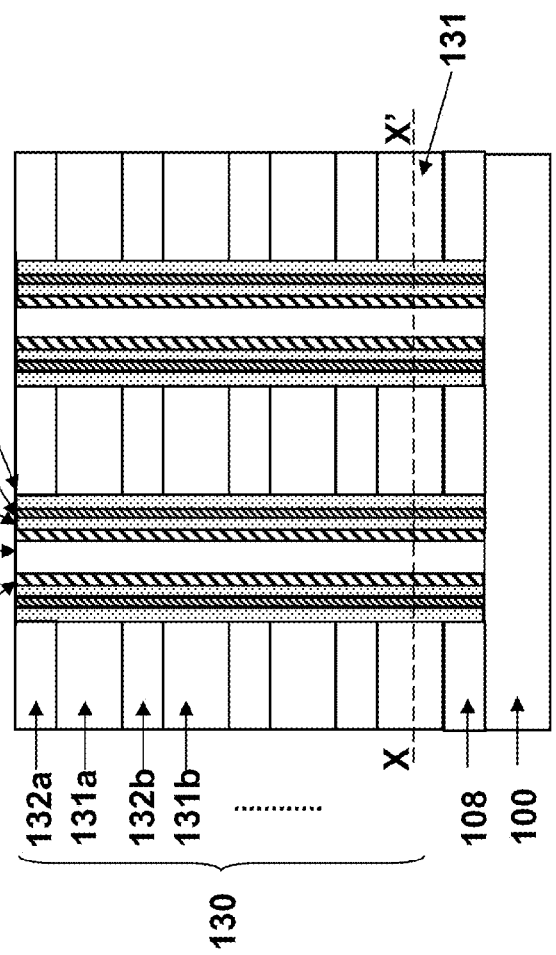

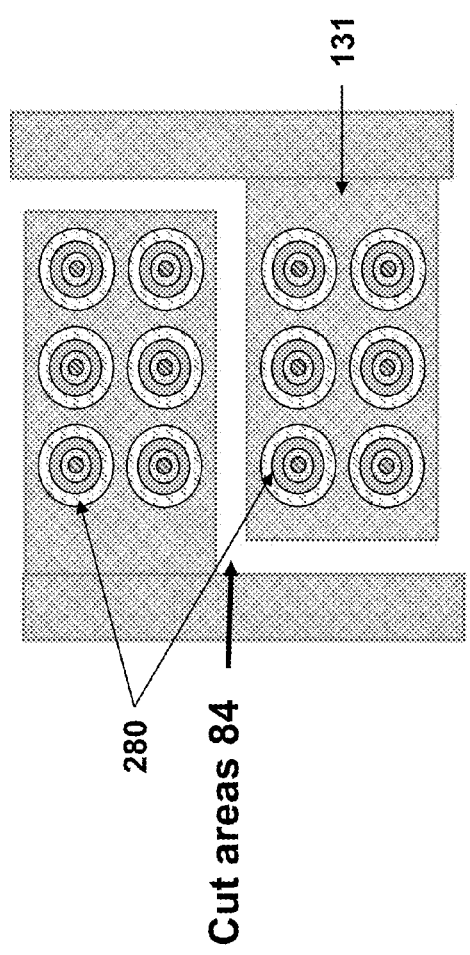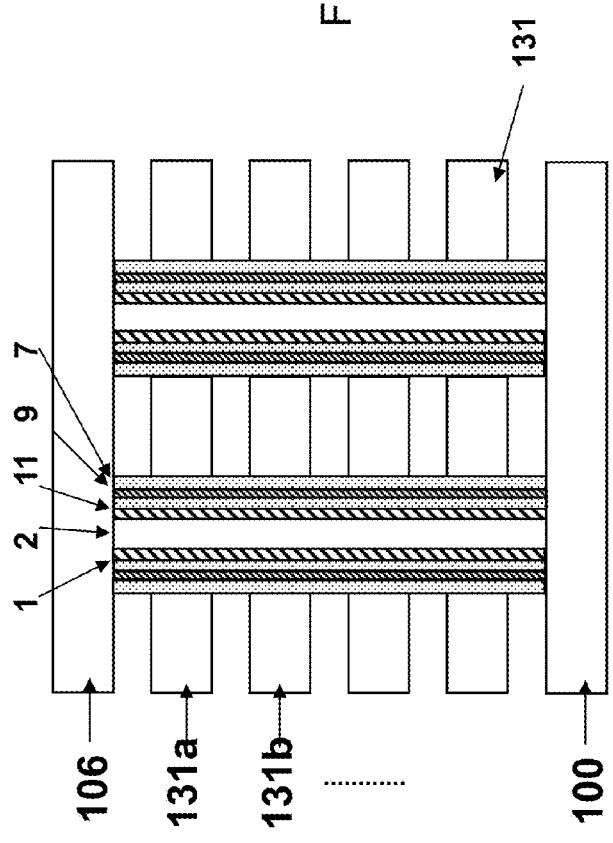

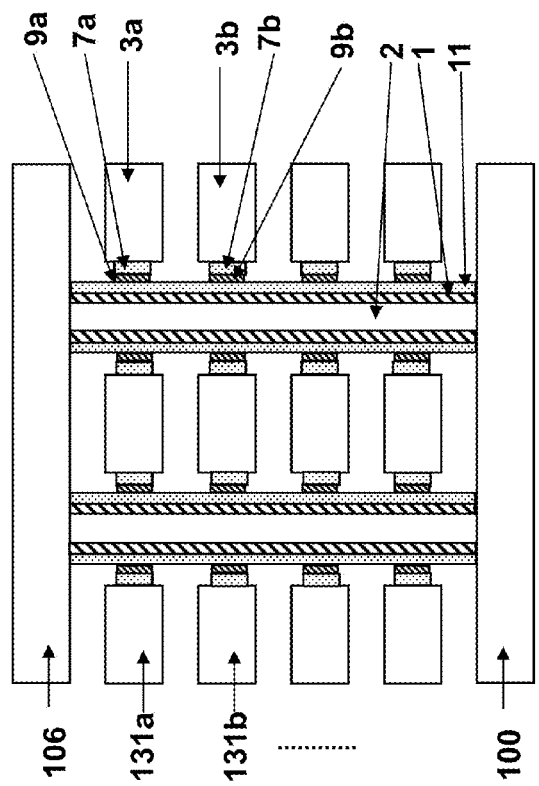
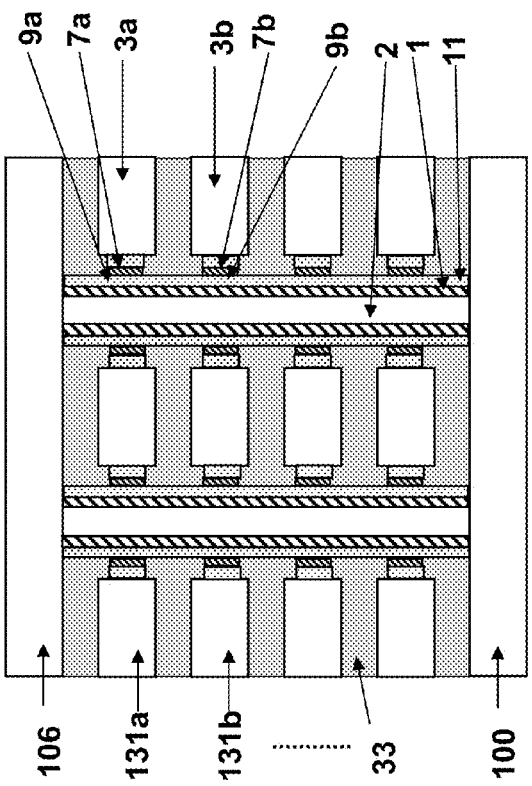
Figure 33
Figure 34

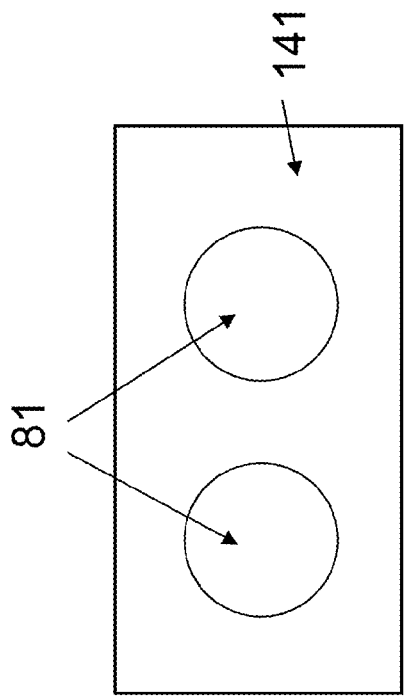
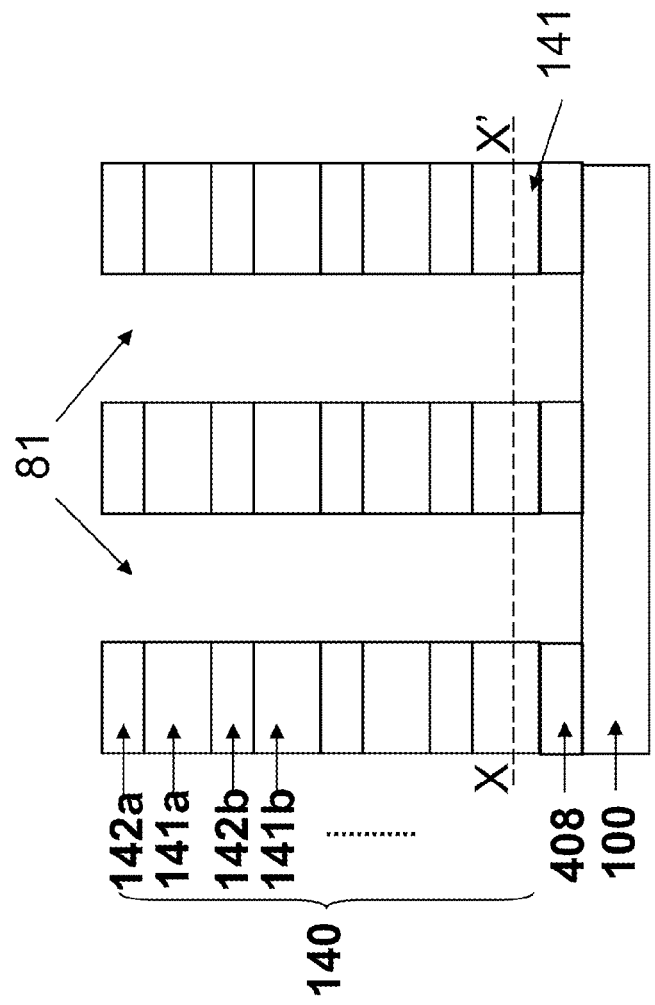
Figure 35B
Figure 35A

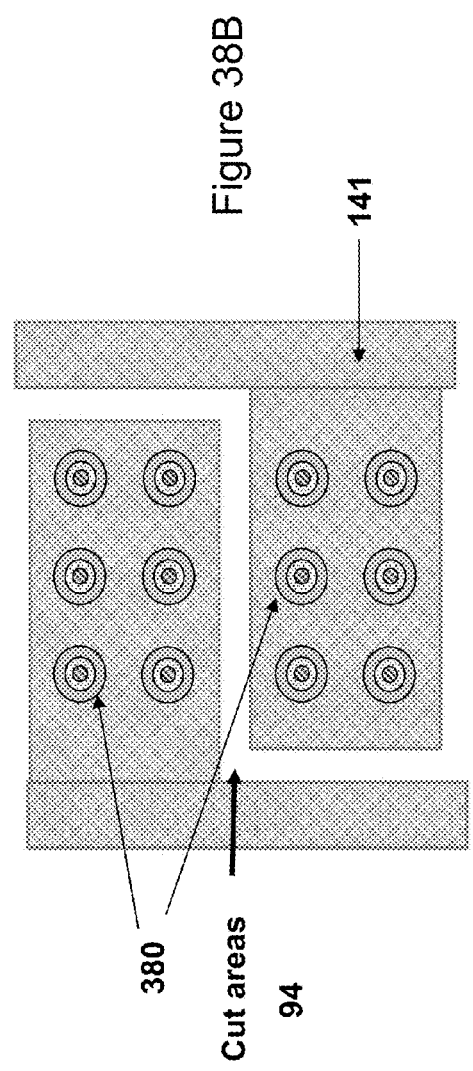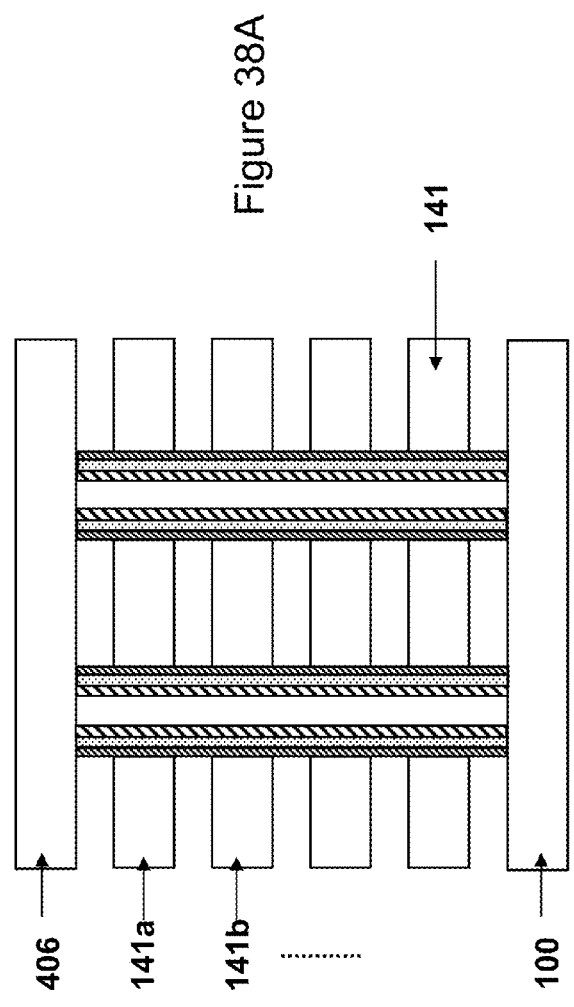

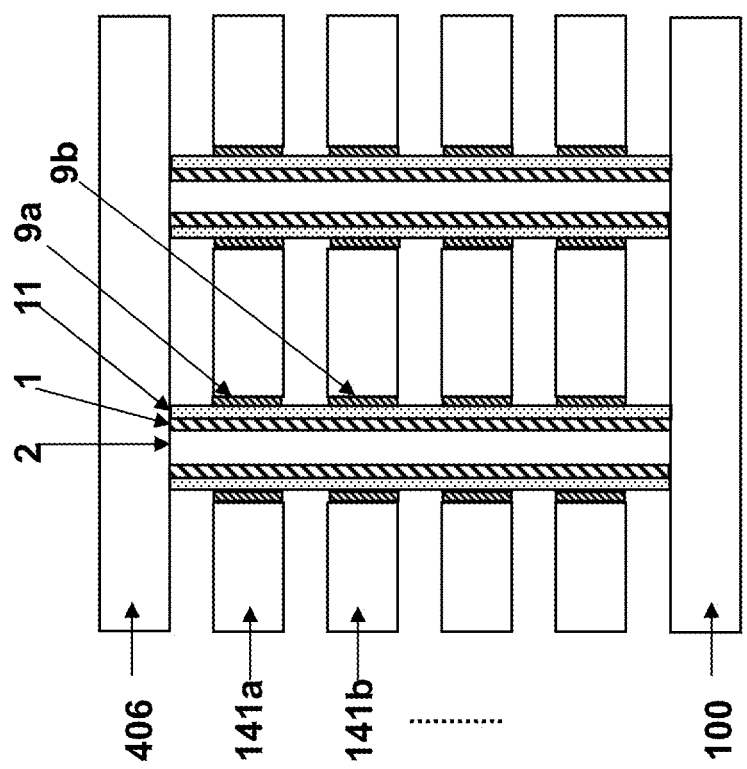

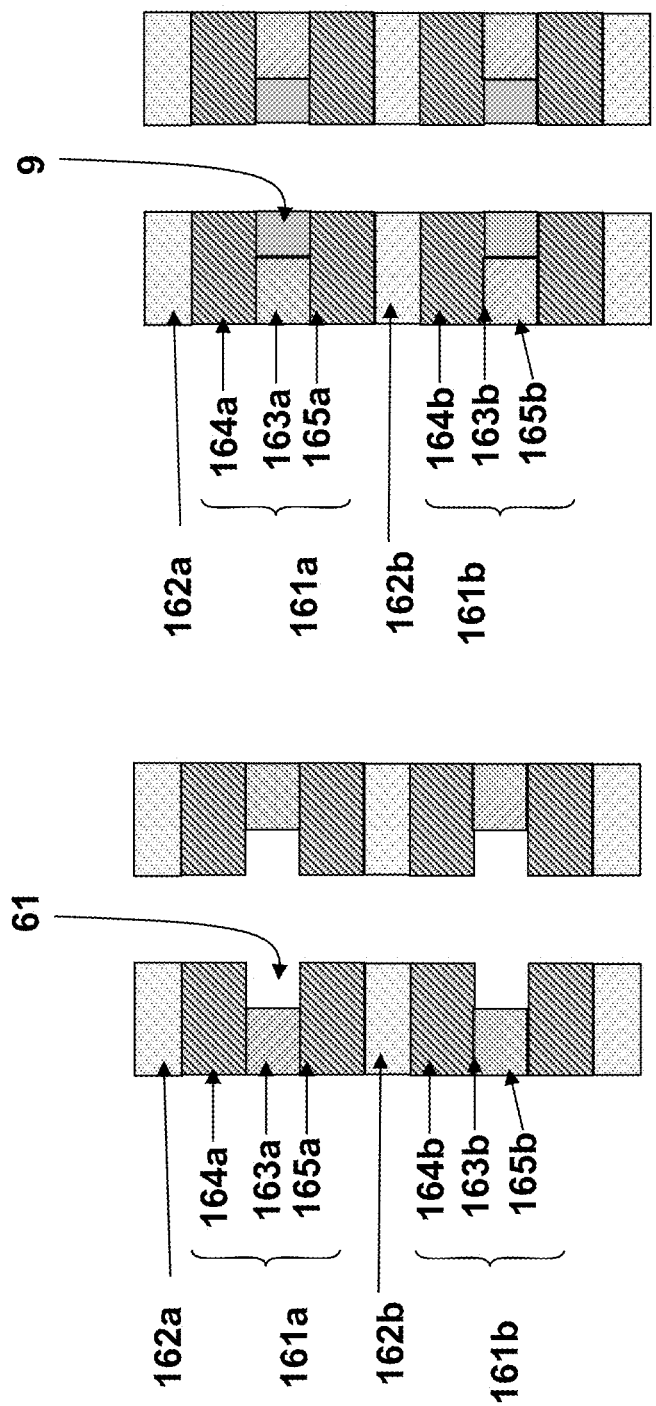

METHOD OF MAKING ULTRAHIGH DENSITY VERTICAL NAND MEMORY DEVICE

BACKGROUND

The present invention relates generally to the field of semiconductor devices and specifically to three dimensional vertical NAND strings and other three dimensional devices and methods of making thereof.

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

According to one embodiment of the invention, a method of making a monolithic three dimensional NAND string comprises forming a stack of alternating layers of a first material and a second material over a substrate, where the first material comprises a conductive or semiconductor control gate material and where the second material comprises an insulating material, etching the stack to form at least one opening in the stack, selectively etching the first material to form first recesses in the first material, forming a blocking dielectric in the first recesses, forming a plurality of discrete charge storage segments separated from each other in the first recesses over the blocking dielectric, forming a tunnel dielectric over a side wall of the discrete charge storage segments exposed in the at least one opening, and forming a semiconductor channel in the at least one opening.

According to another embodiment of the invention, a method of making a monolithic three dimensional NAND string comprises forming at least one sacrificial feature over a substrate, forming a stack of alternating layers of a first material and a second material over the at least one sacrificial feature, where the first material comprises a conductive or semiconductor control gate material and where the second material comprises an insulating material, etching the stack to form at least two openings in the stack, selectively etching the first material to form first recesses in the first material such that at least some of the first recesses are exposed in a first opening and at least some additional first recesses are exposed in a second opening, forming a blocking dielectric in the first recesses, forming a plurality of discrete charge storage segments separated from each other in the first recesses over the blocking dielectric layer, removing the at least one sacrificial feature to form a hollow region extending substantially parallel to a major surface of the substrate which connects the at least two openings to form a hollow U-shaped pipe space comprising the first and the second openings extending substantially perpendicular to the major surface of the substrate connected by the hollow region, forming a tunnel dielectric over a side wall of the plurality of discrete charge storage segments exposed in the at least two openings, and forming a semiconductor channel in the hollow U-shaped pipe space.

According to another embodiment of the invention, a monolithic, three dimensional NAND string comprises a semiconductor channel, at least one end portion of the semiconductor channel extending substantially perpendicular to a major surface of a substrate, a plurality of control gate electrodes having a strip shape extending substantially parallel to the major surface of the substrate, where the plurality of control gate electrodes comprise at least a first control gate electrode located in a first device level and a second control gate electrode located in a second device level located over the major surface of the substrate and below the first device level, a blocking dielectric, the blocking dielectric comprising a plurality of blocking dielectric segments, where each of the plurality of blocking dielectric segments is located in contact with a respective one of the plurality of control gate electrodes, and where at least a portion of each of the plurality of blocking dielectric segments has a clam shape, a plurality of discrete charge storage segments, where each of the plurality of discrete charge storage segments is located at least partially in a respective clam-shaped blocking dielectric segment, and where the plurality of discrete charge storage segments comprise at least a first discrete charge storage segment located in the first device level and a second discrete charge storage segment located in the second device level, and a tunnel dielectric located between each one of the plurality of the discrete charge storage segments and the semiconductor channel.

Another embodiment of the invention provides a monolithic three dimensional NAND string comprising a semiconductor channel located over a substrate, the semiconductor channel having a U-shaped side cross section, where the two wing portions of the U-shaped semiconductor channel which extend substantially perpendicular to a major surface of the substrate are connected by a connecting portion which extends substantially parallel to the major surface of the substrate, an insulating fill located over the connecting portion and separating two wing portions of the U-shaped semiconductor channel, a plurality control gate electrodes having a strip shape extending substantially parallel to the major surface of the substrate, where the plurality of control gate electrodes comprise at least a first control gate electrode located in a first device level and a second control gate electrode located in a second device level located over the substrate and below the first device level, a plurality of blocking dielectric segments, where each of the plurality of blocking dielectric segments is located in contact with a respective one of the plurality of control gate electrodes, a plurality of discrete charge storage segments, and a tunneling dielectric located between the plurality of discrete charge storage segments and the semiconductor channel.

According to another embodiment of the invention, a method of making a monolithic three dimensional NAND string comprises forming a stack of alternating layers of a first material and a second material over a major surface of a substrate, where the first material comprises a conductive or semiconductor control gate material and where the second material comprises an insulating material, etching the stack to form at least one opening in the stack, selectively etching the first material to form first recesses in the first material, forming a blocking dielectric in the first recesses, forming a plurality of discrete charge storage segments separated from each other in the first recesses over the blocking dielectric layer, forming a tunnel dielectric layer over a side wall of the plurality of discrete charge storage segments in the at least one opening, forming a semiconductor material in the at least one opening, etching a middle portion of the semiconductor material to form two wing portions of a semiconductor channel, the two wing portions of the semiconductor channel extending substantially perpendicular to the major surface of the substrate; and forming an insulating fill located over the connecting portion and separating two wing portions of the semiconductor channel.

According to another embodiment of the invention, a monolithic three dimensional NAND string comprises a semiconductor channel located over a substrate, at least one end of the semiconductor channel extending substantially perpendicular to a major surface of the substrate, a plurality of control gate electrodes having a strip shape extending substantially parallel to the major surface of the substrate, where the plurality of control gate electrodes comprise at least a first control gate electrode located in a first device level and a second control gate electrode located in a second device level located over the substrate and below the first device level, a plurality of discrete charge storage segments, where the plurality of discrete charge storage segments comprise at least a first discrete charge storage segment located in the first device level and a second discrete charge storage segment located in the second device level, a blocking dielectric located between the plurality of discrete charge storage segments and the plurality of control gate electrodes, and a tunneling dielectric located between the plurality of discrete charge storage segments and the semiconductor channel, where the first discrete charge storage segment has a height shorter than that of the first control gate electrode and the second discrete charge storage segment has a height shorter than that of the second control gate electrode.

According to another embodiment of the invention, a method of making a monolithic three dimensional NAND string comprises forming a stack of alternating layers of a first material and a second material over a substrate, where the first material comprises a conductive or semiconductor control gate material and where the second material comprises a sacrificial material which can be selectively etched compared to the first material, etching the stack to form at least one opening in the stack, forming a blocking dielectric layer on a side wall of the at least one opening, forming a discrete charge storage material layer on the blocking dielectric layer in the at least one opening, forming a tunnel dielectric layer on the discrete charge storage material layer in the at least one opening, forming a semiconductor channel layer on the tunnel dielectric layer in the at least one opening, removing the second material to expose the blocking dielectric layer between the first material layers, etching the blocking dielectric layer and the discrete charge storage material layer using the first material layers as a mask to form a plurality of separate discrete charge storage segments and blocking dielectric segments, and depositing an insulating material between the first material layers, between the blocking dielectric segments and between the discrete charge storage segments.

According to another embodiment of the invention, a monolithic three dimensional NAND string comprises a semiconductor channel located over a substrate, at least one end of the semiconductor channel extending substantially perpendicular to a major surface of the substrate, a plurality of control gate electrodes having a strip shape extending substantially parallel to the major surface of the substrate, where the plurality of control gate electrodes comprise at least a first control gate electrode located in a first device level and a second control gate electrode located in a second device level located over the substrate and below the first device level, and a plurality of discrete charge storage segments, where the plurality of discrete charge storage segments comprise at least a first discrete charge storage segment located in the first device level and a second discrete charge storage segment located in the second device level, a blocking dielectric located between the plurality of discrete charge storage segments and the plurality of control gate electrodes, and a tunneling dielectric located between the plurality of discrete charge storage segments and the semiconductor channel. The blocking dielectric comprising a plurality of blocking dielectric segments. Each of the plurality of the blocking dielectric segments is located in contact with a respective one of the plurality of control gate electrodes. At least a portion of each of the blocking dielectric segments has a clam shape, and each of the plurality of control gate electrodes is located at least partially in an opening in the clam-shaped portion of a respective blocking dielectric segment.

According to another embodiment of the invention, a method of making a monolithic three dimensional NAND string, comprises forming a stack of alternating layers of a first material and a second material different from the first material over a substrate, etching the stack to form at least one opening in the stack, forming a discrete charge storage material layer on a sidewall of the at least one opening, forming a tunnel dielectric layer on the discrete charge storage material layer in the at least one opening, forming a semiconductor channel material on the tunnel dielectric layer in the at least one opening, selectively removing the second material layers without removing the first material layers, etching the discrete charge storage material layer using the first material layers as a mask to form a plurality of separate discrete charge storage segments, depositing an insulating material between the first material layers to form alternating layers of insulating material layers and the first material layers, selectively removing the first material layers to expose side wall of the discrete charge storage segments, forming a blocking dielectric on the side wall of the discrete charge storage segments exposed between the insulating material layers, and forming control gates on the blocking dielectric between the insulating material layers.

According to another embodiment of the invention, a monolithic three dimensional NAND string comprises a semiconductor channel, at least one end portion of the semiconductor channel extending substantially perpendicular to a major surface of a substrate, a plurality of control gate electrodes extending substantially parallel to the major surface of the substrate, where the plurality of control gate electrodes comprise at least a first control gate electrode located in a first device level and a second control gate electrode located in a second device level located over the major surface of the substrate and below the first device level, an interlevel insulating layer located between the first control gate electrode and the second control gate electrode, a blocking dielectric, the blocking dielectric comprising a plurality of blocking dielectric segments, where each of the plurality of blocking dielectric segments is located in contact with a respective one of the plurality of control gate electrodes, a plurality of discrete charge storage segments, where each of the plurality of discrete charge storage segments is located at least partially in contact with a respective blocking dielectric segment, and where the plurality of discrete charge storage segments comprise at least a first discrete charge storage segment located in the first device level and a second discrete charge storage segment located in the second device level, a tunnel dielectric located between each one of the plurality of the discrete charge storage segments and the semiconductor channel, and at least a first conductive or semiconductor shielding wing located between the first discrete charge storage segment and the second discrete charge storage segment.

According to another embodiment of the invention, a method of making a monolithic three dimensional NAND string comprises forming a stack of alternating layers of a first layer and a second layer, where the first layer comprises a conductive or semiconductor control gate material, and where the second layer comprises an insulating sub-layer and a first sacrificial sub-layer, etching the stack to form at least one opening in the stack, selectively etching the first layer to form first recesses, forming a blocking dielectric in the first recesses, forming a plurality of discrete charge storage segments separated from each other in the first recesses over the blocking dielectric, forming a tunnel dielectric over a side wall of the discrete charge storage segments exposed in the at least one opening, forming a semiconductor channel in the at least one opening, etching the stack to expose a back side of the stack, removing the first sacrificial sub-layer to form second recesses, and forming a plurality of conductive or semiconductor shielding wings separated from each other in the second recesses, where the first sacrificial sub-layer is located above or below the insulating sub-layer in each second layer.

According to another embodiment of the invention, a method of making a monolithic three dimensional NAND string, comprises forming a stack of alternating layers of a first layer and a second layer, where the first layer comprises a first sacrificial sub-layer, a second sacrificial sub-layer and a third sacrificial sub-layer located between the first sacrificial sub-layer and the second sacrificial sub-layer, etching the stack to form at least one opening in the stack, selectively etching the third sacrificial sub-layer to form first recesses, forming a plurality of discrete charge storage segments separated from each other in the first recesses, forming a tunnel dielectric over a side wall of the discrete charge storage segments exposed in the at least one opening, forming a semiconductor channel in the at least one opening, etching the stack to expose a back side of the stack, removing the first sacrificial sub-layer, the second sacrificial sub-layer and the third sacrificial sub-layer to form clam-shaped openings such that the plurality of discrete charge storage segments are exposed in the clam-shaped openings, forming a plurality of clam-shaped blocking dielectric segments in the clam-shaped openings over the plurality of discrete charge storage segments, and forming a plurality of clam-shaped control gate electrodes in the clam-shaped openings over the plurality of the clam-shaped blocking dielectric segments. The second layer comprises an insulating layer, and the third sacrificial sub-layer comprises a sacrificial material different from the first sacrificial sub-layer, the second sacrificial sub-layer, and the second layer.

According to another embodiment of the invention, a method of making a monolithic three dimensional NAND string comprises forming a stack of alternating layers of a first layer and a second layer over a substrate, where the first layer comprises a conductive or semiconductor control gate material and where the second layer comprises an insulating material, etching the stack to form at least one opening in the stack, selectively etching the first layer to form first recesses, forming a conductive or semiconductor liner in the first recesses, the conductive or semiconductor liner having a clam shape, forming a blocking dielectric over the conductive or semiconductor liner in the first recesses, forming a plurality of discrete charge storage segments separated from each other in the first recesses over the blocking dielectric, forming a tunnel dielectric over a side wall of the discrete charge storage segments exposed in the at least one opening, and forming a semiconductor channel in the at least one opening.

BRIEF DESCRIPTION OF THE DRAWINGS

FIGS. 1A-1B are respectively side cross sectional and top cross sectional views of a NAND string of one embodiment.

FIG. 1A is a side cross sectional view of the device along line Y-Y' in FIG. 1B, while FIG. 1B is a side cross sectional view of the device along line X-X' in FIG. 1A.

FIGS. 2A-2B are respectively side cross sectional and top cross sectional views of a NAND string of another embodiment. FIG. 2A is a side cross sectional view of the device along line Y-Y' in FIG. 2B, while FIG. 2B is a side cross sectional view of the device along line X-X' in FIG. 2A.

FIG. 5A is a perspective view and FIG. 5B is a side cross sectional view along line Y-Y' in FIG. 5A.

FIGS. 14A-21 illustrate steps of the method of making NAND strings shown in FIGS. 3 and 4 according to an embodiment of the invention. FIG. 14A is a side cross sectional view. FIG. 14B is a top cross sectional view along line X-X' in the side cross sectional view shown in FIG. 14A, and FIG. 14C is a top cross sectional view along line Z-Z' in the side cross sectional view shown in FIG. 14A, while FIG. 14A is a side cross sectional view along line Y-Y' in the top cross sectional views shown in FIGS. 14B and 14C. FIGS. 15-21 are side cross sectional views of the method steps, except that FIG. 18B is a side cross sectional view along line Y-Y' in the perspective view shown in FIG. 18A. FIG. 20B is a side cross sectional view along line Y-Y' in the perspective view shown in FIG. 20A.

FIG. 22A shows a perspective view of a NAND string according to one embodiment of the invention. FIG. 22B is a side cross sectional view along line Y-Y' in the perspective view shown in FIG. 22A.

FIGS. 23A-27 illustrate steps of the method of making the NAND string shown in FIG. 22A-22B according to one embodiment of the invention. FIGS. 22B, 23B, 24B and 25B are side cross sectional views along line Y-Y' in the perspective views shown in FIGS. 22A, 23A, 24A and 25A, respectively.

FIGS. 29A-34 illustrate steps of a method of making the NAND string shown in FIG. 28A according to one embodiment of the invention. FIG. 29B is a top cross sectional view along line X-X' in the side cross sectional view shown in FIG. 29A. FIG. 30B is a top cross sectional view along line X-X' in the side cross sectional view shown in FIG. 30A. FIG. 32B is a top cross sectional view along line X-X' in the side cross sectional view shown in FIG. 32A. FIGS. 31, 33 and 34 are side cross sectional views.

FIGS. 35A-42 illustrate steps of a method of making the NAND string shown in FIG. 28B according to one embodiment of the invention. FIG. 35B is a top cross sectional view along line X-X' in the side cross sectional view shown in FIG. 35A. FIG. 38B is a top cross sectional view along line X-X' in the side cross sectional view shown in FIG. 38A. FIGS. 37 and 39-42 are side cross sectional views.

FIGS. 53-57 illustrate steps of a method of making the NAND string shown in FIG. 52 according to one embodiment of the invention.

DETAILED DESCRIPTION

Embodiments of the present invention will be described below with reference to the accompanying drawings. It should be understood that the following description is intended to describe exemplary embodiments of the invention, and not to limit the invention.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

The embodiments of the invention provide a monolithic, three dimensional array of memory devices, such as an array of vertical NAND strings. The NAND strings are vertically oriented, such that at least one memory cell is located over another memory cell. The array allows vertical scaling of NAND devices to provide a higher density of memory cells per unit area of silicon or other semiconductor material.

Embodiment I

Figure 3:
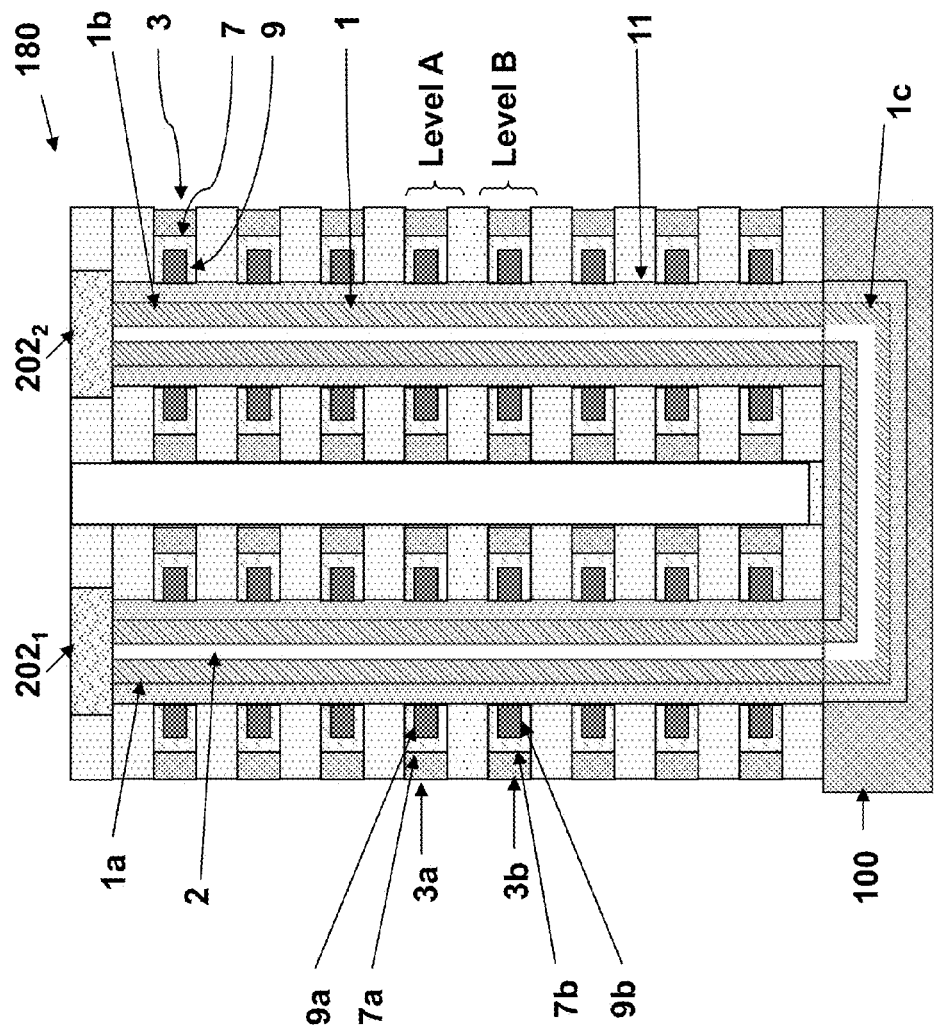
FIGS. 3-4 are side cross sectional views of NAND strings of another two embodiments.
Figure 4:
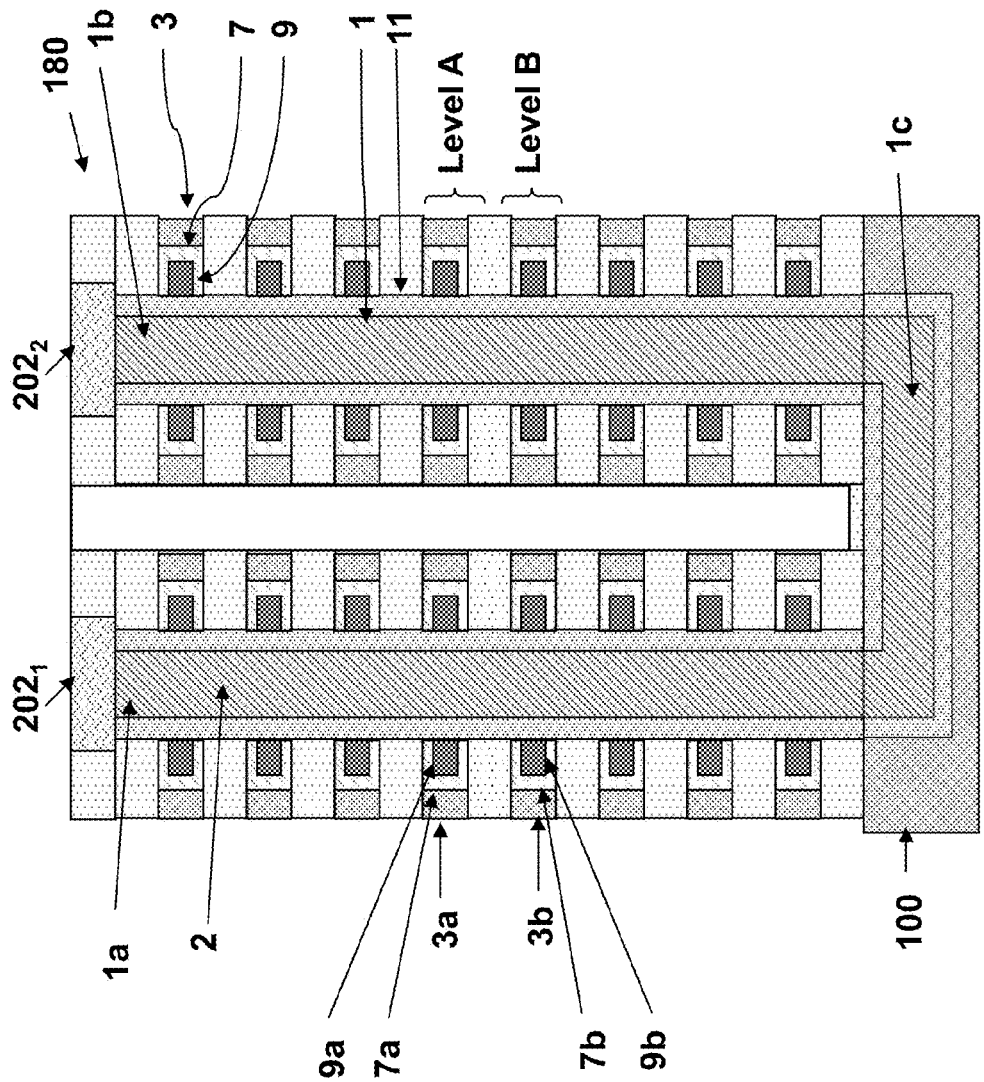

In some embodiments, the monolithic three dimensional NAND string 180 comprises a semiconductor channel 1 having at least one end portion extending substantially perpendicular to a major surface 100a of a substrate 100, as shown in FIGS. 1A, 2A, and 3-4. For example, the semiconductor channel 1 may have a pillar shape and the entire pillar-shaped semiconductor channel extends substantially perpendicularly to the major surface of the substrate 100, as shown in FIGS. 1A and 2A. In these embodiments, the source/drain electrodes of the device can include a lower electrode 102 provided below the semiconductor channel 1 and an upper electrode 202 formed over the semiconductor channel 1, as shown in FIGS. 1A and 2A. Alternatively, the semiconductor channel 1 may have a U-shaped pipe shape, as shown in FIGS. 3 and 4. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially perpendicular to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are now shown in FIGS. 1-4 for clarity. These transistors are described in more detail below.

In some embodiments, the semiconductor channel 1 may be a filled feature, as shown in FIGS. 2A-2B and 4. In some other embodiments, the semiconductor channel 1 may be hollow, for example a hollow cylinder filled with an insulating fill material 2, as shown in FIGS. 1A-1B and 3. In these embodiments, and an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, and 3-4. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, in some embodiments, polysilicon is preferred to allow easy processing.

A blocking dielectric 7 is located adjacent to and may be surrounded by the control gate(s) 3. The blocking dielectric 7 may comprise a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIGS. 1A-1B, 2A-2B, and 3-4. In some embodiments, at least a portion of each of the plurality of blocking dielectric segments 7 has a clam shape.

As used herein a "clam" shape is a side cross sectional shape configured similar to an English letter "C". A clam shape has two segments which extend substantially parallel to each other and to the major surface 100a of the substrate 100. The two segments are connected to each other by a third segment which extends substantially perpendicular to the first two segments and the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments and having a fourth side open. The opening may be filled by another material or layer.

The monolithic three dimensional NAND string also comprise a plurality of discrete charge storage segments 9, each of which is located at least partially in an opening of a respective clam-shaped blocking dielectric segment 7. Similarly, the plurality of discrete charge storage segments 9 comprise at least a first discrete charge storage segment 9a located in the device level A and a second discrete charge storage segment 9b located in the device level B.

The tunnel dielectric 11 of the monolithic three dimensional NAND string is located between each one of the plurality of the discrete charge storage segments 9 and the semiconductor channel 1. In some embodiments, the tunnel dielectric 11 has a non-uniform thickness and/or a not straight sidewall near the plurality of discrete charge storage segments 9. In other embodiments described in more detail below, the tunnel dielectric 11 has a uniform thickness and/or a straight sidewall.

The blocking dielectric 7 and the tunnel dielectric 11 may be independently selected from any one or more same or different electrically insulating materials, such as silicon oxide, silicon nitride, silicon oxynitride, or other high-k insulating materials.

The discrete charge storage segments 9 may comprise a conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a discrete charge storage dielectric (e.g., silicon nitride or another dielectric) feature. For example, in some embodiments, the discrete charge storage segments 9 are discrete charge storage dielectric features, each of which comprises a nitride feature located in the respective clam-shaped blocking dielectric segment 7, where the silicon oxide blocking dielectric segment 7, the nitride feature 9 and the silicon oxide tunnel dielectric 11 form oxide-nitride-oxide discrete charge storage structures of the NAND string. In some of the following description, a polysilicon floating gate is used as a non-limiting example. However, it should be understood that a dielectric charge storage feature or other floating gate material may be used instead.

FIGS. 5-13 illustrate a method of making a NAND string according to a first embodiment of the invention.

Figure 5B:
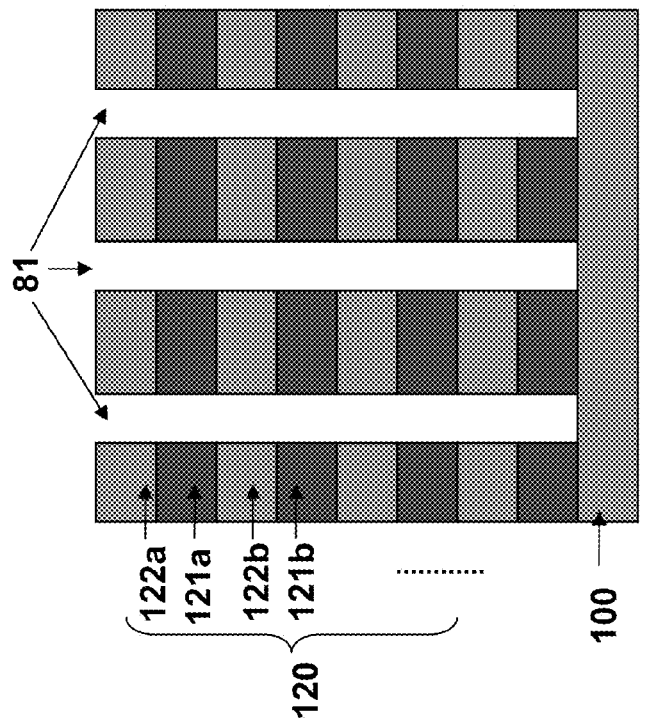
FIGS. 5A-5B illustrate a first step of a method of making a NAND string according to a first embodiment of the invention.
Figure 5A:
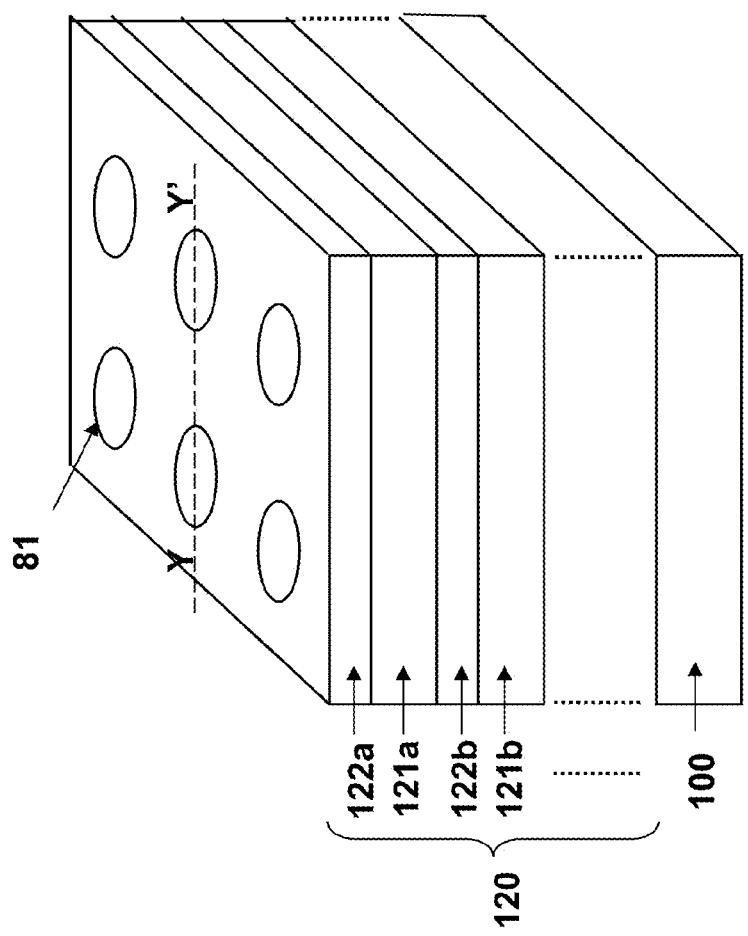

Referring to FIG. 5A (a perspective view) and FIG. 5B (a side cross sectional view along line Y-Y' in FIG. 5A), a stack 120 of alternating layers 121 (121a, 121b, etc.) and 122 (122a, 122b etc.) are formed over the major surface of the substrate 100. Layers 121, 122 may be deposited over the substrate by any suitable deposition method, such as sputtering, CVD, MBE, etc. The layers 121, 122 may be 6 to 100 nm thick.

In this embodiment, the first layers 121 comprise a first conductive (e.g., metal or metal alloy) or semiconductor (e.g., heavily doped n+ pr p+ polysilicon) control gate material, and the second layers 122 comprise a second insulating material (e.g., silicon nitride, silicon oxide, etc.). The term heavily doped includes semiconductor materials doped n-type or p-type to a concentration of above $10^{18}$ cm$^{-3}$.

The deposition of layers 121, 122 is followed by etching the stack 120 to form at least one opening 81 in the stack 120. An array of openings 81 may be formed in locations where vertical channels of NAND strings will be subsequently formed.

Next, the first material is selectively etched compared to the second material 122 to form first recesses 62 in the first layers 121 (i.e., layers 121a, 121b, etc). The recesses 62 may be formed by selective, isotropic wet or dry etching which selectively etches the first material 121 compared to the second material 112. The depth of each recess 62 may be 6 to 100 nm.

Figure 6:
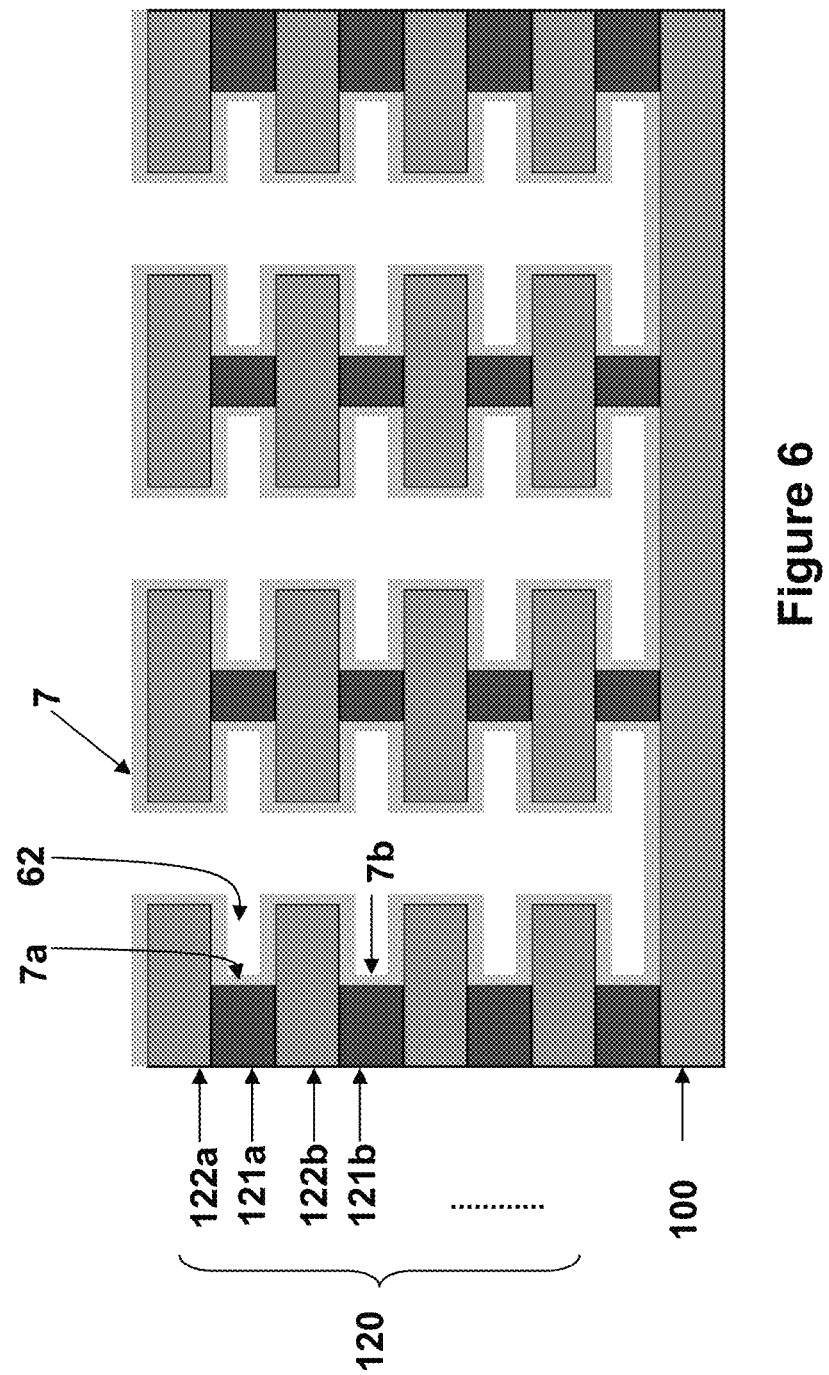
FIGS. 6-13 are side cross sectional views illustrating steps of the method of making a NAND string according to the first embodiment of the invention.

A blocking dielectric 7 (also known as an inter-poly dielectric, IPD) is then formed in the openings 81 such that the blocking dielectric coats the sides of the first recesses 62, resulting in a structure as shown in FIG. 6. The blocking dielectric 7 may comprise a silicon oxide layer deposited by conformal atomic layer deposition (ALD) or chemical vapor deposition (CVD). Other high-k dielectric materials, such as hafnium oxide, may be used instead or in addition to silicon oxide. Dielectric 7 may have a thickness of 6 to 20 nm. The blocking dielectric 7 comprises a plurality of clam-shaped blocking dielectric segments (e.g., blocking dielectric segments 7a and 7b) in the first recesses 62 between overhanging portions of the second material 122.

Figure 7A:
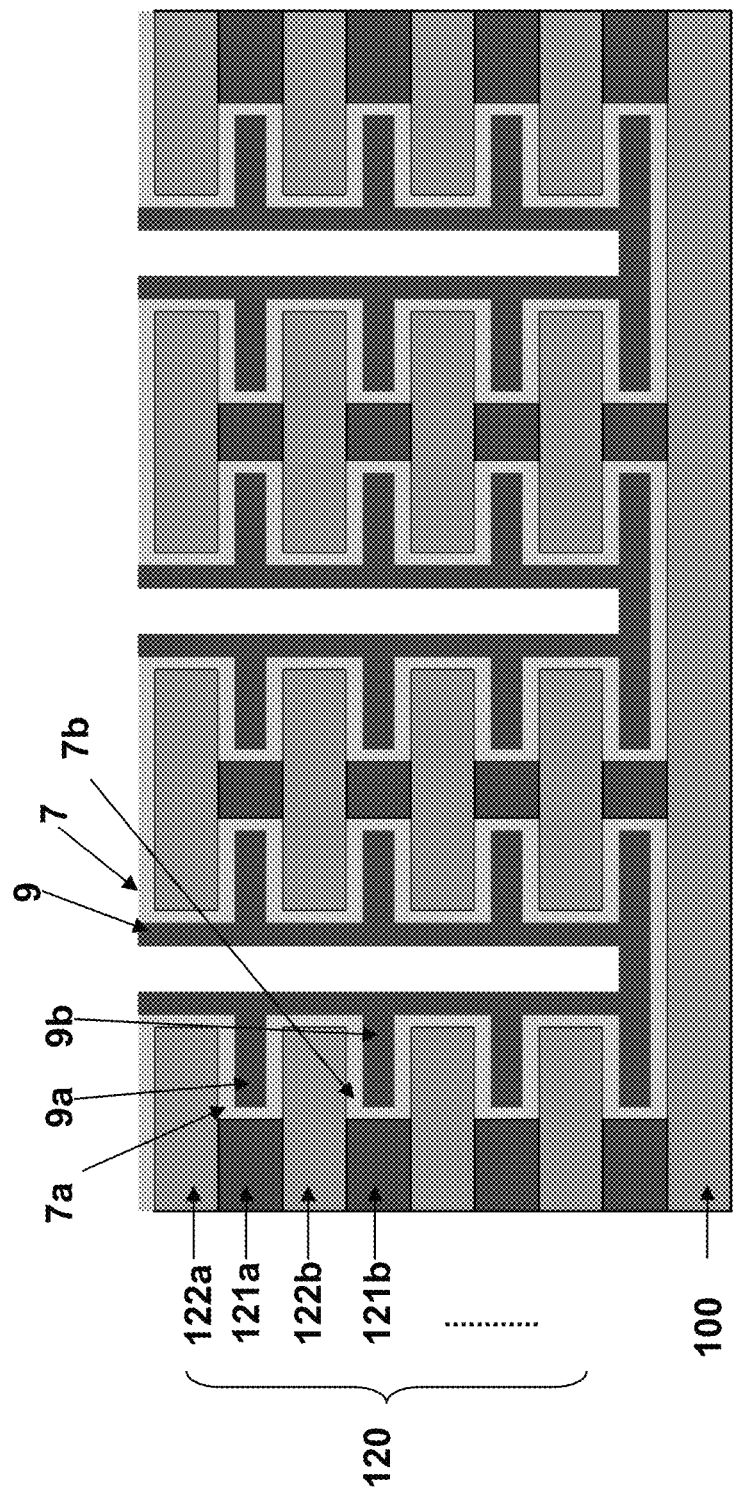

Further, a charge storage material 9 is formed in the openings 81 and in the first recesses 62 over the blocking dielectric material 7, resulting in the structure shown in FIG. 7A. The charge storage material 9 comprises a plurality of discrete charge storage segments (e.g., 9a and 9b) formed inside an opening in a respective one of the plurality of clam-shaped blocking dielectric segments (e.g., 7a or 7b). The discrete charge storage segments 9a, 9b are connected to each other by outer portions of the charge storage material 9 layer which extends in the openings 81 adjacent to the protruding portions of the second material 122.

As explained above, in some embodiments, the discrete charge storage material 9 may comprise a charge storage dielectric material (e.g., silicon nitride discrete charge storage dielectric feature). Alternatively, the discrete charge storage material may comprise a conductive or semiconductor floating gate material (e.g., a metal, metal alloy such as TiN, metal silicide, or heavily doped polysilicon floating gate material). Any desired methods may be used to form the charge storage material 9, such as ALD or CVD.

Figure 8A:
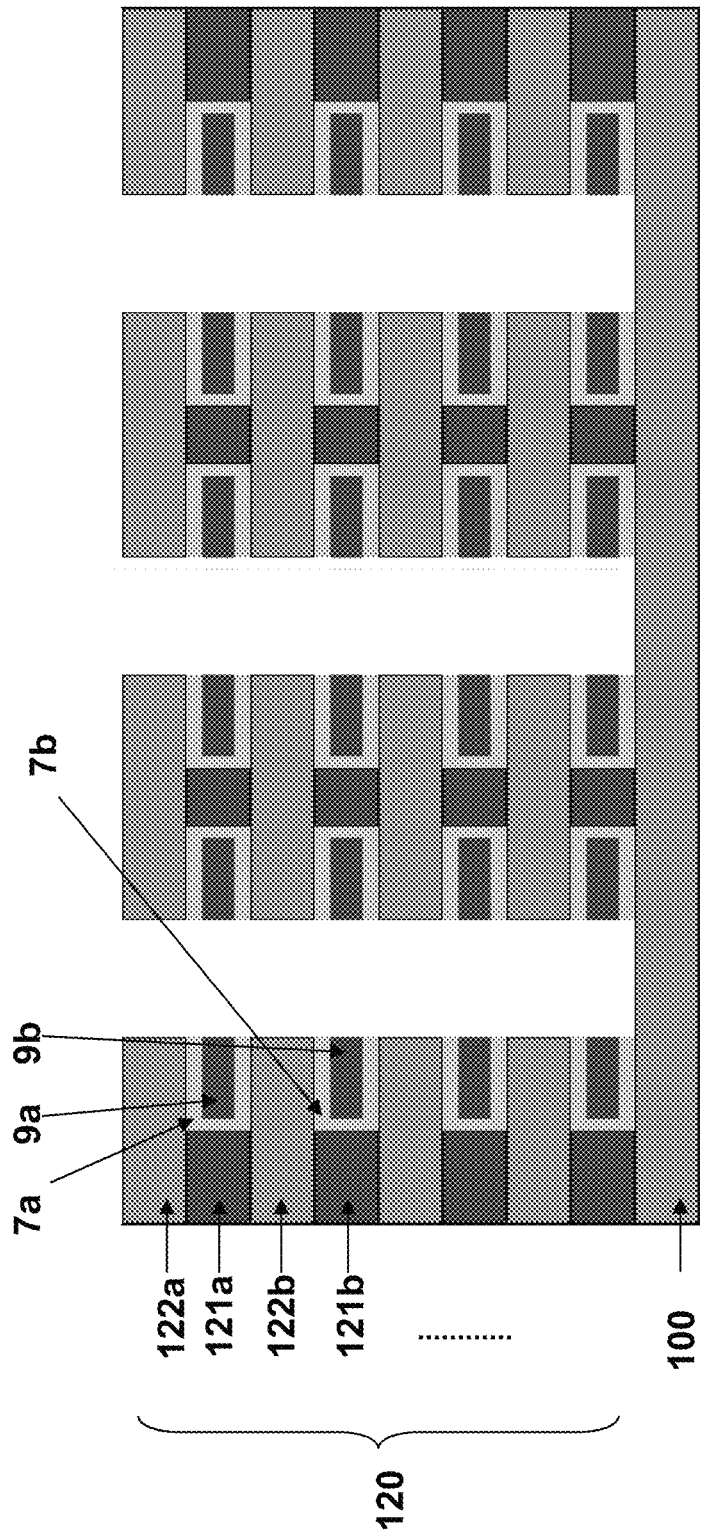

In some embodiments, the outer portions of the charge storage material 9 which extend in the openings 81 adjacent to the protruding portions of the second material 122 can then be removed to separate the discrete charge storage segments (e.g., 9a and 9b) from each other, resulting in a structure shown in FIG. 8A. The outer portions of the blocking dielectric 7 which extend in the openings 81 adjacent to the protruding portions of the second material 122 can then be removed to separate the discrete blocking dielectric (e.g., 7a and 7b) from each other if desired. For example, the charge storage material and the blocking dielectric material may be anisotropically dry or wet etched in the openings 81 in one step or two separate steps to leave the charge storage material 9 only in the recesses 62 (i.e., inside the clam shaped portions of the blocking dielectric 7). The anisotropic etch may be extended to also etch the insulating material 122 to enlarge the size of the openings 81 if desired.

If it is desirable to form a metal silicide floating gates 9a, 9b rather than polysilicon floating gates 9a, 9b, then a thin silicide forming metal layer, such as titanium, cobalt or nickel is formed by any suitable method, such as ALD or sputtering, over the polysilicon floating gates 9a, 9b shown in FIG. 8A. After a silicidation anneal, the floating gates 9a, 9b are converted to a metal silicide (e.g., titanium, cobalt, nickel, etc. silicide) by the reaction of the metal and the polysilicon. Unreacted portions of the metal layer which remain over portions of insulating material 122 and blocking dielectric 7 are then selectively etched away by any suitable selective etching method, such as a piranha etch for a Ti metal layer.

FIGS. 7B, 8B, 8C and 8D illustrate alternative methods to form polysilicon floating gate charge storage segments 9a, 9b using oxidation or silicidation followed by selective oxide or silicide etch. FIG. 7B illustrates structure similar to that of FIG. 7A, where a polysilicon floating gate layer 9 is formed in the openings 81.

As shown in FIG. 8B, the floating gate layer 9 is partially oxidized by wet or dry oxidation (i.e., oxidation in water vapor or air containing ambient at an elevated temperature) such that polysilicon floating gate charge storage segments 9a, 9b in recesses 62 remain unoxidized while the rest of layer 9 (e.g., the outside part over protruding second material 122) is converted to a silicon oxide layer 19a. The segments 9a, 9b remain unoxidized because the polysilicon layer 9 is thicker in the recesses 62 than outside of the recesses 62 in openings 81. The partial oxidation may be a timed oxidation which is timed to terminate before the segments 9a, 9b are converted to silicon oxide.

As shown in FIG. 8D, after the oxidation step, the silicon oxide layer 19a is selectively etched away using any suitable selective wet or dry etch which selectively etches away silicon oxide compared to polysilicon, such as an oxide wet etch, to leave polysilicon floating gates 9a, 9b in the recesses 62. While layer 19a is described as a silicon oxide layer, it may comprise a silicon nitride or silicon oxynitride layer formed by nitriding or oxynitriding the polysilicon layer 9.

In the second alternative method shown in FIG. 8C, a silicide forming metal layer, such as a titanium, cobalt, nickel, etc., layer is formed over the floating gate layer 9 in the openings 81. The polysilicon layer 9 is then partially converted to a metal silicide layer 19b (e.g., titanium, cobalt, nickel, etc., silicide) by annealing the structure to partially react layer 9 with the metal layer.

After the silicidation anneal, the polysilicon floating gate charge storage segments 9a, 9b in recesses 62 are not converted to a silicide while the rest of layer 9 (e.g., the outside part over protruding second material 122) is converted to the silicide layer 19b. The segments 9a, 9b remain unsilicided because the polysilicon layer 9 is thicker in the recesses 62 than outside of the recesses 62 in openings 81. The partial silicidation may be a timed silicidation which is timed to terminate before the segments 9a, 9b are converted to a silicide. Alternatively, the partial silicidation may be controlled by the relative thicknesses of the polysilicon and metal layers such that excess polysilicon is provided in the recesses 62 which lacks access to sufficient metal to form a silicide. Any remaining portion of the metal layer may be removed from the silicide layer 19b by selective etching.

As shown in FIG. 8D, after the silicidation step, the silicide layer 19b is selectively etched away using any suitable selective wet or dry etch which selectively etches away a silicide material compared to polysilicon, such as a titanium silicide piranha etch.

One difference between the structures of 8A and 8D is the shape of the blocking dielectric 7. In the structure of FIG. 8A made by an anisotropic etching method, the blocking dielectric comprises a plurality of discrete regions 7a, 7b, etc. In contrast, in the structure of FIG. 8D formed by the selective silicide etch, the blocking dielectric 7 comprises a continuous layer which contains regions 7a, 7b in the recesses 62.

In the resulting structure shown in FIGS. 8A and 8D, the plurality of the discrete charge storage segments (e.g., 9a and 9b) separated from each other are disposed in the recesses between overhanging portions of the second material 122. One advantage of the methods of selectively removing outer portion of the charge storage material layer 9 according to FIGS. 7B and 8B-8D is that a potential defect of forming 'poly-stringers' on the side wall (i.e., incomplete removal of the outer portion by dry etching methods) may be completely eliminated. In addition, in contrast to dry etch methods, the selective wet etch of a silicon oxide layer 19a or a silicide layer 19b may result in lower damage to the charge storage segments 9.

Figure 9:
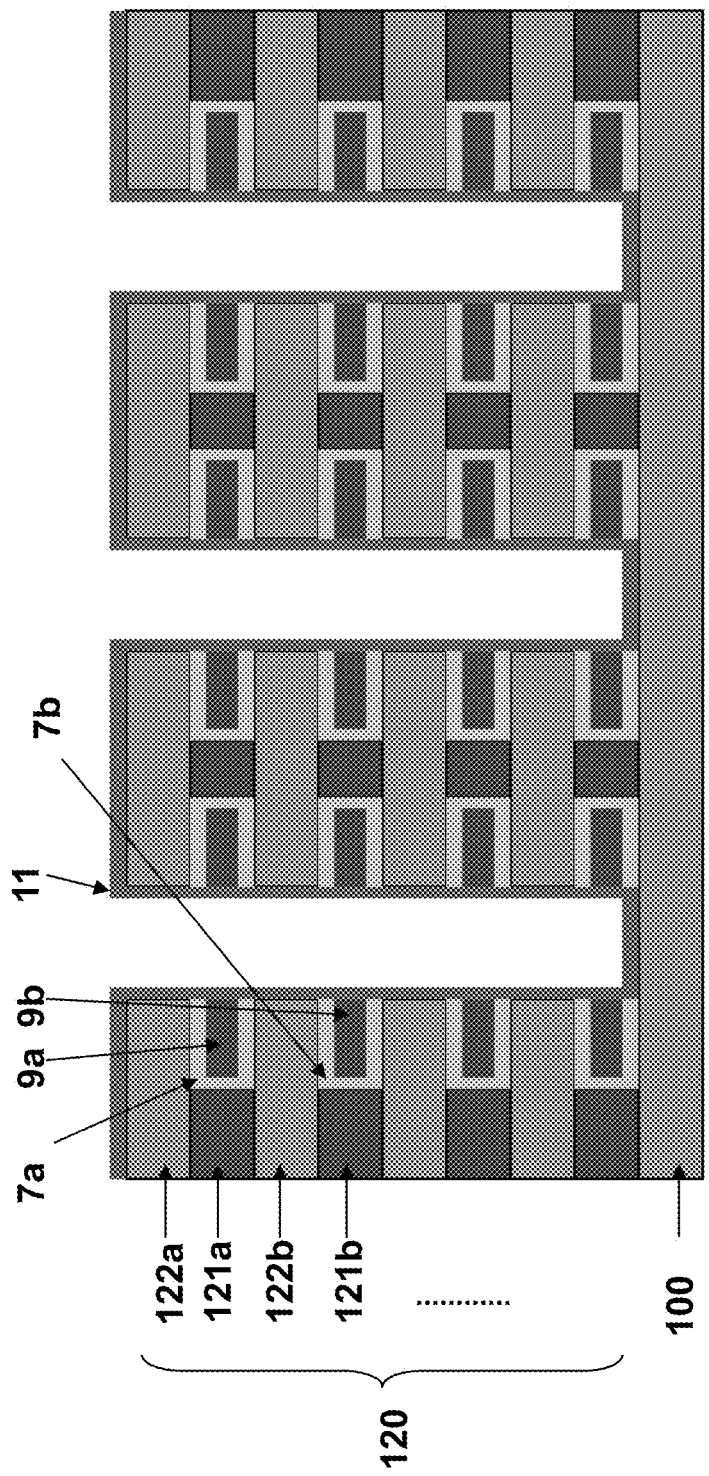

Next, a tunnel dielectric 11 is formed over the side wall of the charge storage material 9 (e.g. the discrete charge storage segments 9a and 9b) and material 122 exposed in the at least one opening 81, resulting in a structure shown in FIG. 9. If the wet etching method of FIGS. 8B-8D is used to form the charge storage material storage segments 9a, 9b, then the tunnel dielectric is formed over the side wall of the charge storage material 9 (e.g. the discrete charge storage segments 9a and 9b) and the outer portion of the blocking oxide dielectric located on protruding portions material 122 in the at least one opening 81. The tunnel dielectric may comprise a relatively thin insulating layer (e.g., 4 to 10 nm thick) of silicon oxide or other suitable material, such as oxynitride, oxide and nitride multi layer stacks, or a high-k dielectric (e.g., hafnium oxide). The tunnel dielectric may be deposited by any suitable method, such as ALD, CVD, etc.

In an alternative method, the tunnel dielectric 11 may be formed by directly converting (e.g., oxidizing) the outer portion of the semiconductor charge storage material layer 9 in one step, rather than by the two-step process of removing the outer portion of the layer 9 and forming tunnel dielectric 11 over the side wall of the charge storage material 9 in the above described method. In this alternative method, a polysilicon floating gate layer 9 is formed as shown in FIG. 7B. The polysilicon layer 9 is then partially oxidized in a timed oxidation to form a relatively thin oxide layer 19a as shown in FIG. 8B. Any oxidation method that can provide an oxide with good quality to be used as the tunneling dielectric, such as a high temperature radical oxidation process, may be used. The thin oxide layer 19a is not removed as shown in FIG. 8D, but is retained in the final device as the tunnel dielectric, as shown in FIG. 8B. Thus, a deposition of a separate tunnel dielectric 11 is not required.

Figure 10:
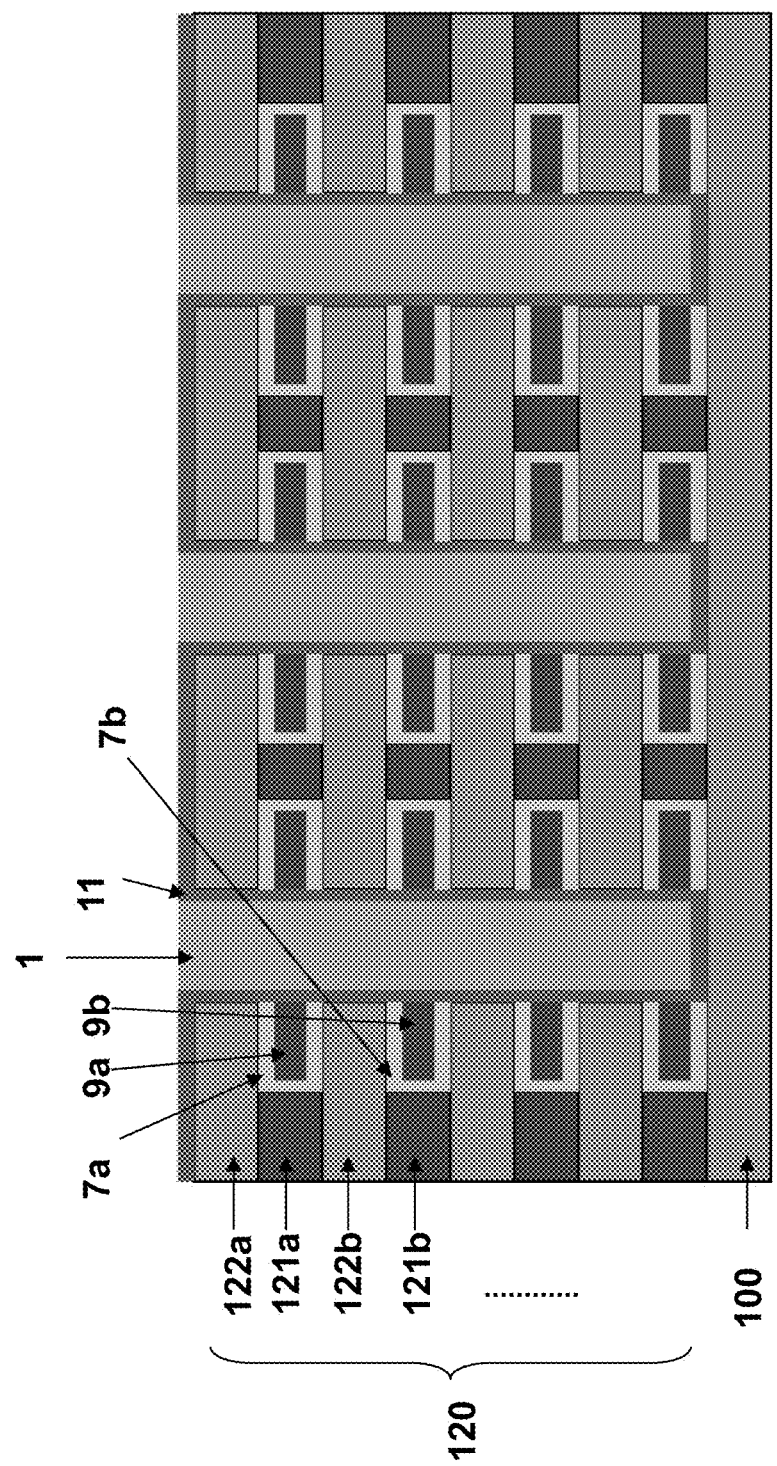
Figure 11:
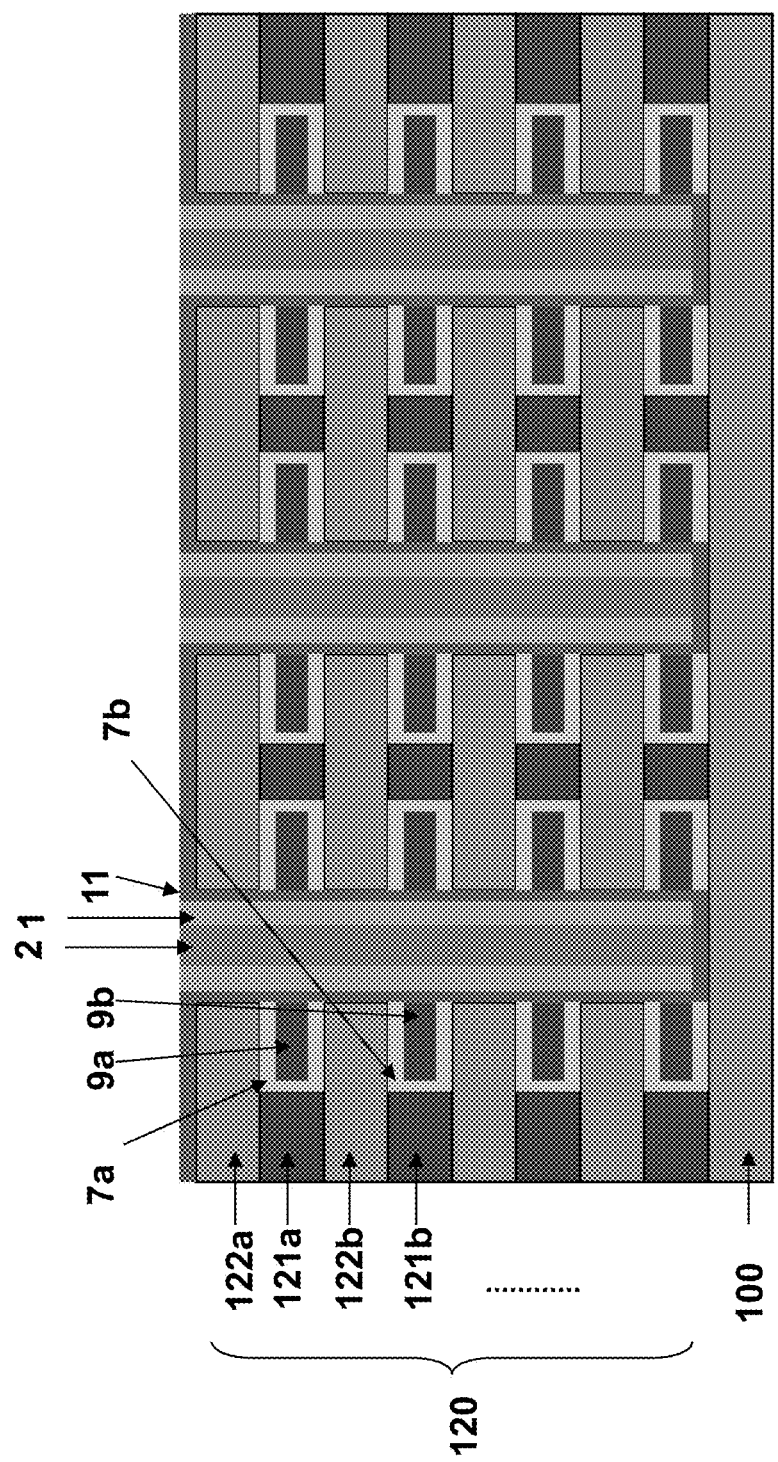

Further, a semiconductor channel material 1 is formed in the at least one opening 81. In some embodiments, the semiconductor channel material 1 completely fills the at least one opening 81 with a semiconductor channel material, as shown in FIG. 10. Alternatively, the step of forming the semiconductor channel 1 in the at least one opening forms a semiconductor channel material 1 on the side wall(s) of the at least one opening 81 but not in a central part of the at least one opening 81 such that the semiconductor channel material 1 does not completely fill the at least one opening 81. In these alternative embodiments, an insulating fill material 2 is formed in the central part of the at least one opening 81 to completely fill the at least one opening 81, as shown in FIG. 11. Preferably, the channel 1 material comprises lightly doped p-type or n-type (i.e., doping below $10^{17}$ cm$^{-3}$) silicon material. An n-channel device is preferred since it is easily connected with n+ junctions. However, a p-channel device may also be used.

The semiconductor channel 1 may be formed by any desired methods. For example, the semiconductor channel material 1 may be formed by depositing semiconductor (e.g., polysilicon) material in the opening 81 and over the stack 120, followed by a step of removing the upper portion of the deposited semiconductor layer by chemical mechanical polishing (CMP) or etchback using top surface of the stack 120 as a polish stop or etch stop.

In some embodiments, a single crystal silicon or polysilicon vertical channel 1 may be formed by metal induced crystallization ("MIC", also referred to as metal induced lateral crystallization) without a separate masking step. The MIC method provides full channel crystallization due to lateral confinement of the channel material in the opening 81.

Figure 12:
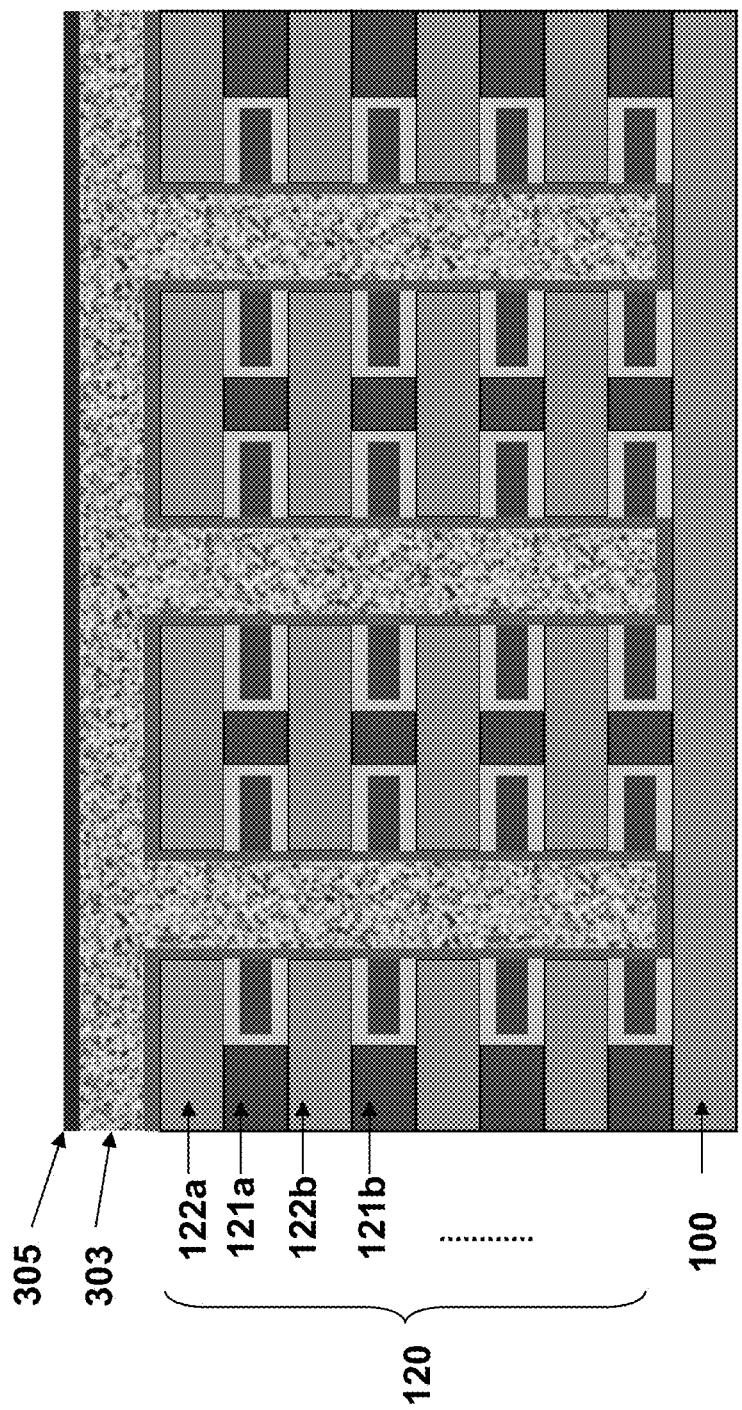

In the MIC method, an amorphous or small grain polysilicon semiconductor (e.g., silicon) layer 303 can be first formed in the at least one opening 81 and over the stack 120, followed by forming a nucleation promoter layer 305 over the semiconductor layer 303, as shown in FIG. 12. The nucleation promoter layer 305 may be a continuous layer or a plurality of discontinuous regions. The nucleation promoter layer may comprise any desired polysilicon nucleation promoter materials, for example but not limited to nucleation promoter materials such as Ge, Ni, Pd, Al or a combination thereof.

Figure 13:
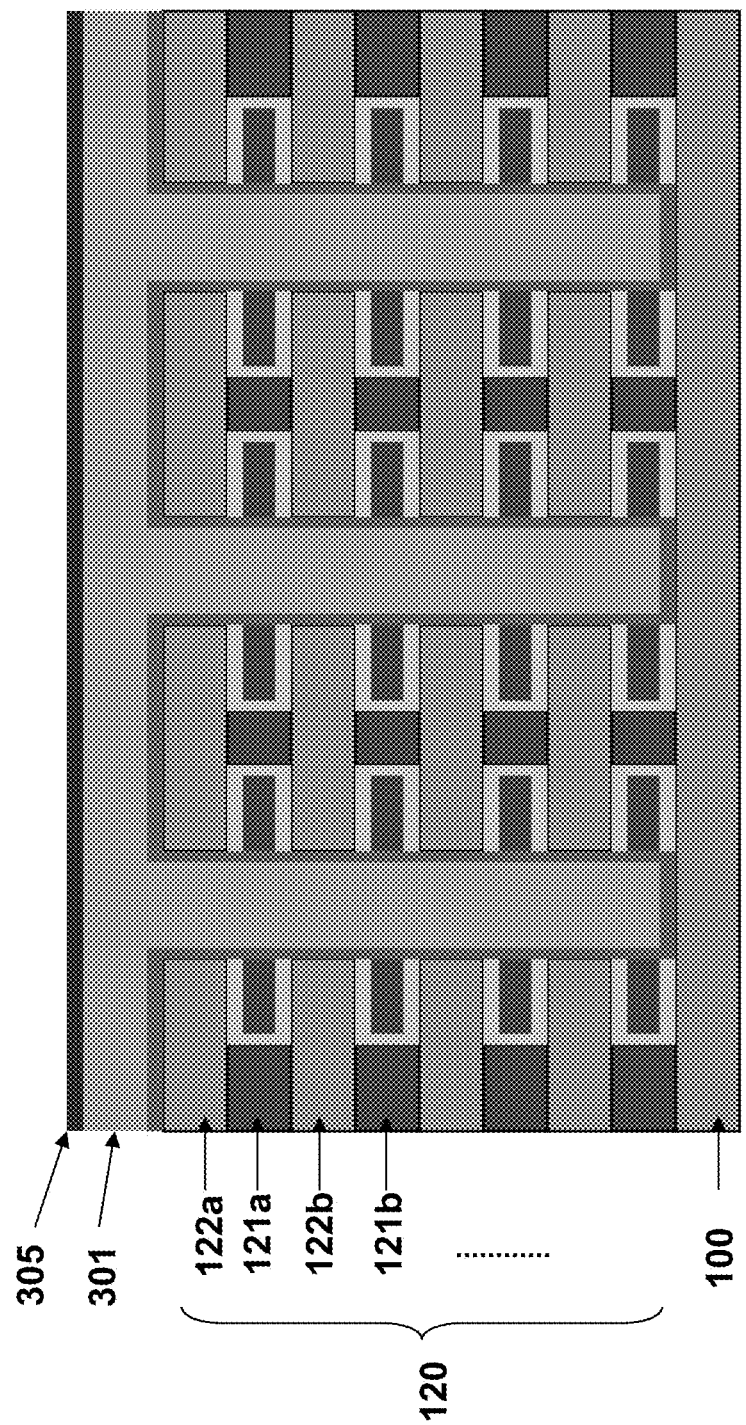

The amorphous or small grain semiconductor layer 303 can then be converted to a large grain polycrystalline or single crystalline semiconductor layer 301 by recrystallizing the amorphous or small grain polycrystalline semiconductor, resulting in a structure illustrated in FIG. 13. The recrystallization may be conducted by a low temperature (e.g., 300 to 600 C) anneal.

The upper portion of the polycrystalline semiconductor layer 301 and the nucleation promoter layer 305 can then be removed by CMP or etchback using top surface of the stack 120 as a stop, resulting in the structure as shown in FIG. 10. The removal may be conducted by selectively wet etching the remaining nucleation promoter layer 305 and any formed silicide in the top of layer 301 following by CMP of the top of silicon layer 301 using the top of the stack 120 as a stop.

Further, an upper electrode 202 may be formed over the semiconductor channel 1, resulting in a structure shown in FIG. 1 or 2. In these embodiments, a lower electrode 102 may be provided below the semiconductor channel 1 prior to the step of forming the stack 120 over the substrate 100. The lower electrode 102 and the upper electrode may be used as the source/drain electrodes of the NAND string.

Embodiment II

In the second embodiment, the source/drain electrodes of the NAND string can both be formed over the semiconductor channel 1 and the channel 1 has a U-shaped pipe shape, for example as shown in FIGS. 3 and 4. In these embodiments, an optional body contact electrode (as will be described below) may be disposed on or in the substrate 100 to provide a body contact to the connecting portion of the semiconductor channel 1 from below.

As used herein a "U-shaped pipe" shape is side cross sectional shape configured similar to an English letter "U". This shape has two segments (referred to herein as "wing portions") which extend substantially parallel to each other and substantially perpendicular to the major surface 100a of the substrate 100. The two wing portions are connected to each other by a connecting segment or portion which extends substantially perpendicular to the first two segments and substantially parallel to the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration.

Any desired methods may be used to form the semiconductor channel 1 having a U-shaped pipe shape. For example, FIGS. 14-21 illustrate a method of making a NAND string having a U-shaped pipe shape semiconductor channel according to the second embodiment of the invention.

The substrate 100 shown in FIG. 14 may comprise a semiconductor substrate optionally containing embedded conductors and/or various semiconductor devices. Alternatively, the substrate 100 may comprise an insulating or semiconductor layer optionally containing embedded conductors.

First, a sacrificial feature 89 may be formed in and/or over the substrate 100, prior to the step of forming the stack 120 of alternating layers of the first material and second materials over the at least one sacrificial feature 89. The sacrificial feature 89 may be formed of any suitable sacrificial material which may be selectively etched compared to the other materials in the stack 120 and in the NAND string, such as an organic material, silicon nitride, tungsten, etc. Feature 89 may have any suitable shape which is similar to the desired shape of the connecting segment of the U-shape as will be described below.

An insulating protective layer 108 may be formed between the sacrificial feature 89 and the stack 120. For example, layer 108 may comprise silicon oxide if feature 89 comprises silicon nitride.

Further, at least two openings 81 and 82 are then formed in the stack 120, resulting in a structure shown in FIG. 14A. FIG. 14B shows a top cross sectional view along line X-X' in FIG. 14A. FIG. 14C shows a top cross sectional view along line Z-Z' in FIG. 14C. FIG. 14A is a side cross sectional view along line Y-Y' in FIGS. 14B and 14C. The openings 81 and 82 are formed above the sacrificial feature 89, as illustrated in FIGS. 14A-C. In some embodiments, the semiconductor channel has a cross section of two circles when viewed from above, as shown in FIG. 14B. Preferably, the protective layer 108 is used as a stop for the etching of the openings 81, 82 such that the top of layer 108 forms the bottom surface of the openings 81, 82.

Figure 15:
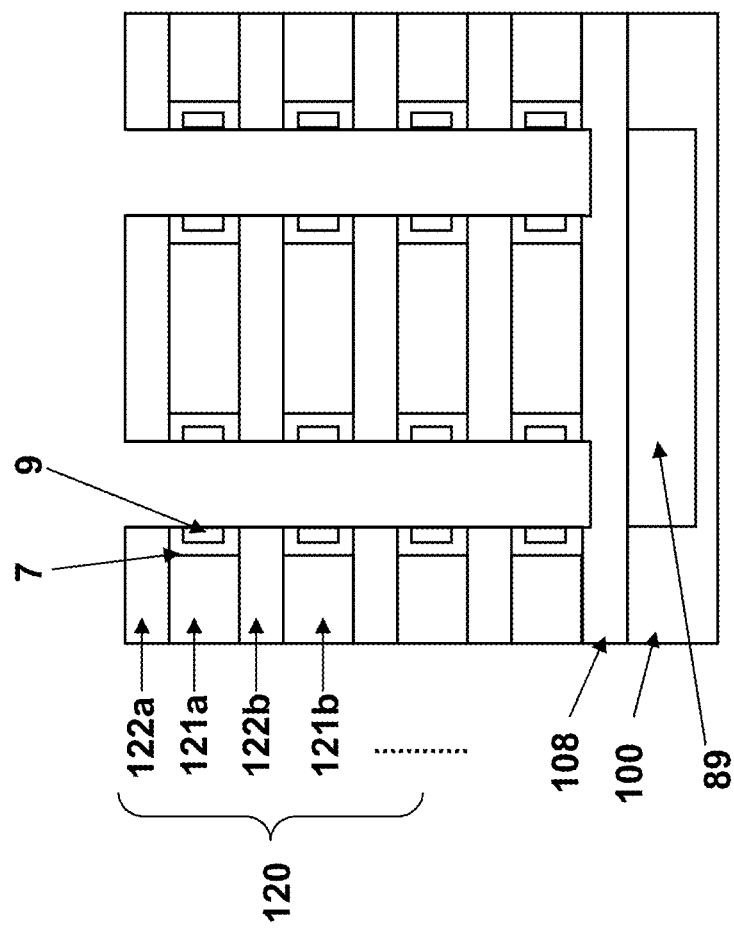

The same or similar methods described above in the first embodiment and illustrated in FIGS. 5-13 can then be used to form the blocking dielectric 7 and the plurality of discrete charge storage segments 9 of the NAND string in the openings 81, 82 resulting in a structure shown in FIG. 15.

Figure 16:
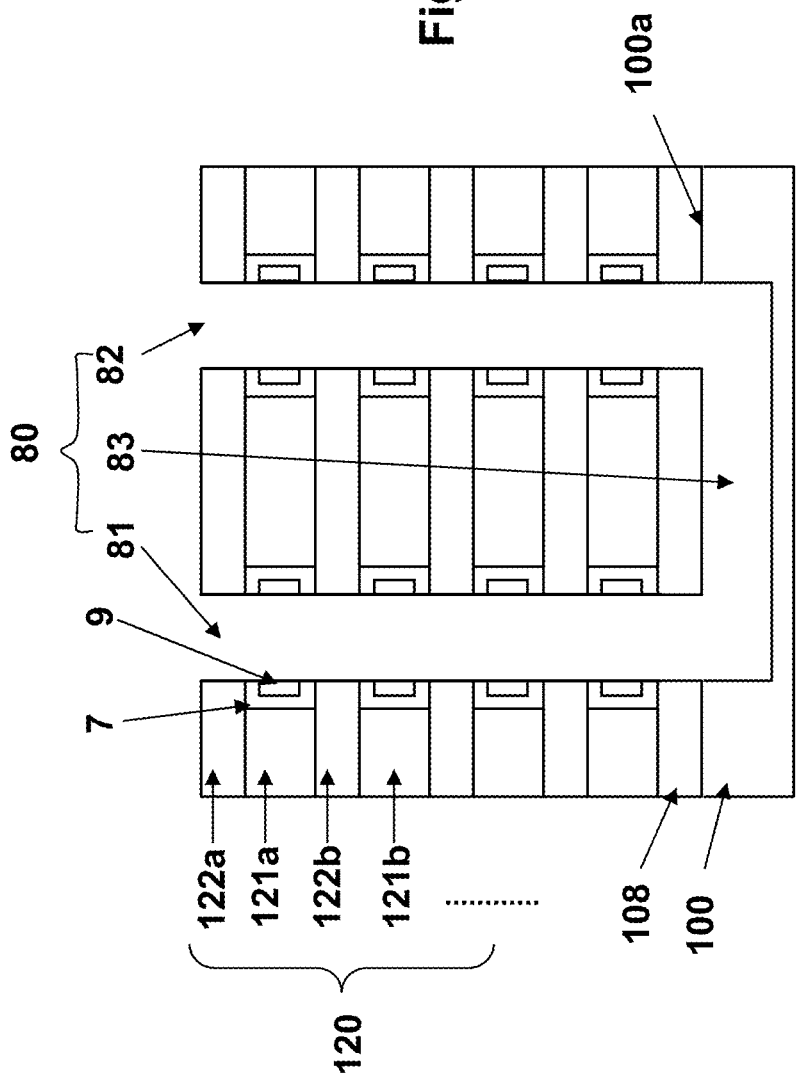
Figure 17:
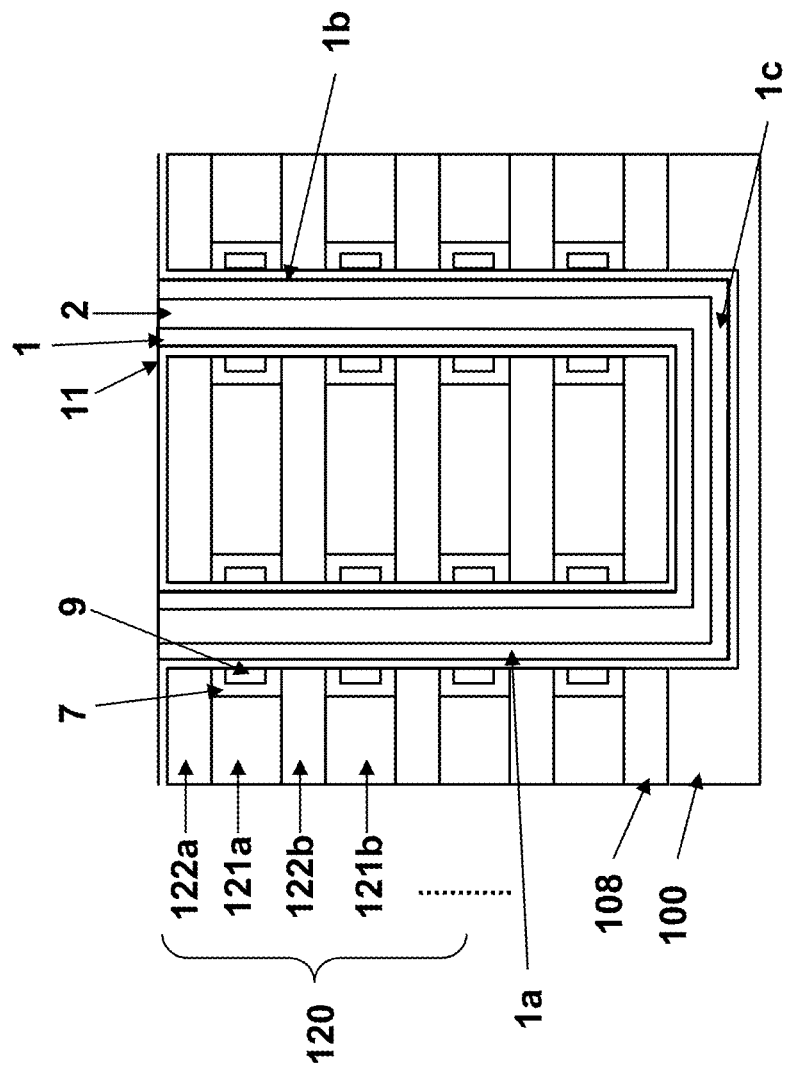
Figure 19:
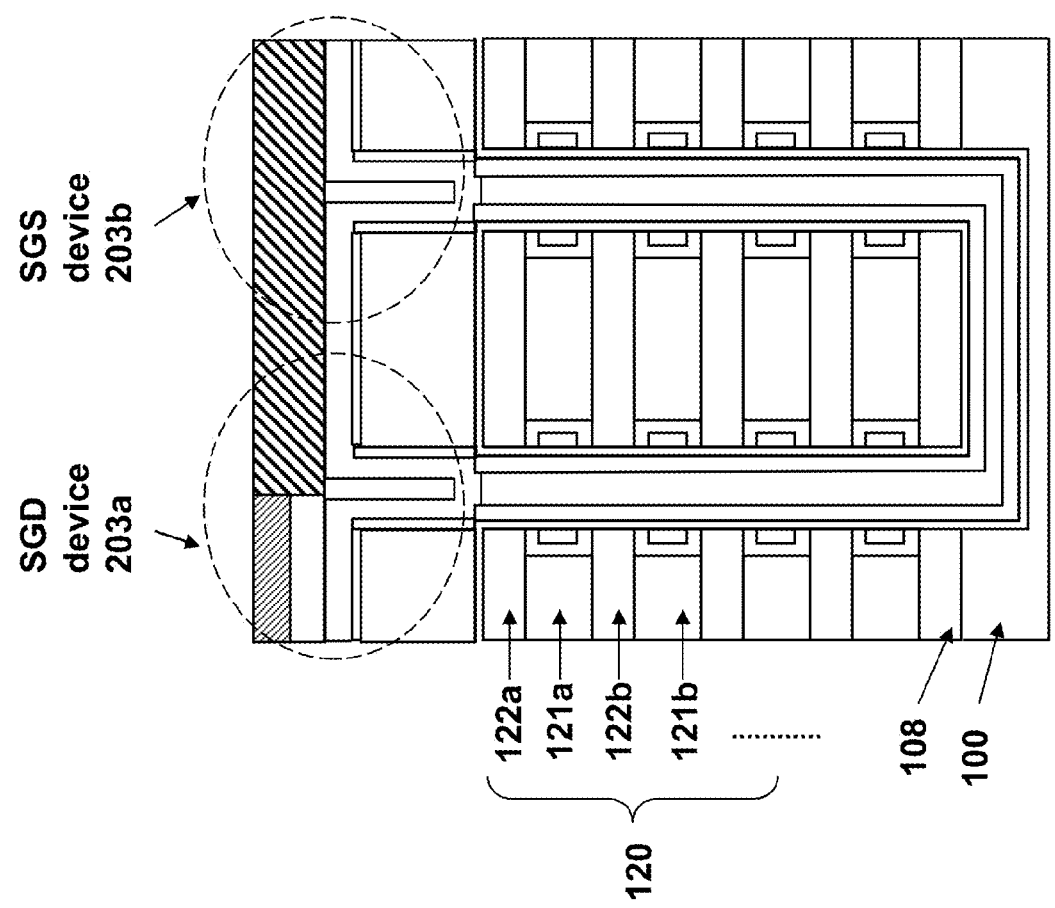

Turning to FIG. 16, the at least one sacrificial feature 89 is then removed to form a hollow region 83 where the feature 89 was located. The hollow region 83 extends substantially parallel to a major surface 100a of the substrate 100, and connects the at least two openings 81 and 82, forming a hollow U-shaped pipe space 80. The hollow region 83 may be formed by further etching the openings 81, 82 (e.g., by anisotropic etching) such that these openings extend through the protective layer 108 to expose the sacrificial feature 89. The sacrificial feature 89 material is then selectively etched using a selective wet or dry etch which selectively removes the sacrificial feature material without substantially etching material 122, blocking dielectric 7 and charge storage segments 9.

Next, a tunnel dielectric 11 and a semiconductor channel 1 over the tunnel dielectric 11 may be formed in the hollow U-shaped pipe space 80. In some embodiments, the step of forming the semiconductor channel 1 on the side wall of the hollow U-shaped pipe space 80 may completely fill the hollow U-shaped pipe space 80 with the semiconductor channel material as shown in FIG. 4. Alternatively, the step of forming the semiconductor channel 1 in the hollow U-shaped pipe space 80 forms a semiconductor channel material on the side wall of the hollow U-shaped pipe space 80 but not in a central part of the hollow U-shaped pipe space 80 such that the semiconductor channel material does not completely fill the hollow U-shaped pipe space 80. In these embodiments, an insulating fill material 2 is then formed in the central part of the semiconductor channel 1 to completely fill the hollow U-shaped pipe space 80, resulting in a structure shown in FIG. 17 (also shown in FIG. 3). The semiconductor channel 1 substantially adopts the shape of the hollow U-shaped pipe space 80, which includes the first and second vertically extending openings 81 and 82 and horizontally extending space 83.

Further, the stack 120 is then etched to form a rail shaped gate cut, which is then filled by an insulating material 185, such as silicon oxide, etc., to electrically isolate the control gate electrodes 3 surrounding the two wing portions of the semiconductor channel 1 from etch other, resulting in a device shown in FIGS. 18A (perspective view) and 18B (side cross sectional view along line Y-Y' in FIG. 18A).

A source or drain electrode may the be formed to contact the wing portion of the semiconductor channel 1 located in the first opening 81 and the other drain or source electrode contacts the other wing portion of the semiconductor channel 1 located in the second opening 82. In some embodiments, the drain electrode connects to the NAND string channel through a drain select transistor 203a (also referred to as SGD device) and the source electrode connects to the other side of the NAND string channel through a source select transistor 203b (also referred to as SGS device). These select transistors can be formed above the semiconductor channel 1 on each wing 1a, 1b, prior to the gate cut, resulting in a structure shown in FIG. 19.

Subsequently, the gate cut step can then be performed to separate the select transistors 203a and 203b from each other in the same step as the step separating the control gate electrodes 3 surrounding the two wing portions of the semiconductor channel 1, resulting in a structure shown in FIGS. 20A (perspective view) and 20B (cross sectional view along lines Y-Y' in FIG. 20B).

Figure 21:
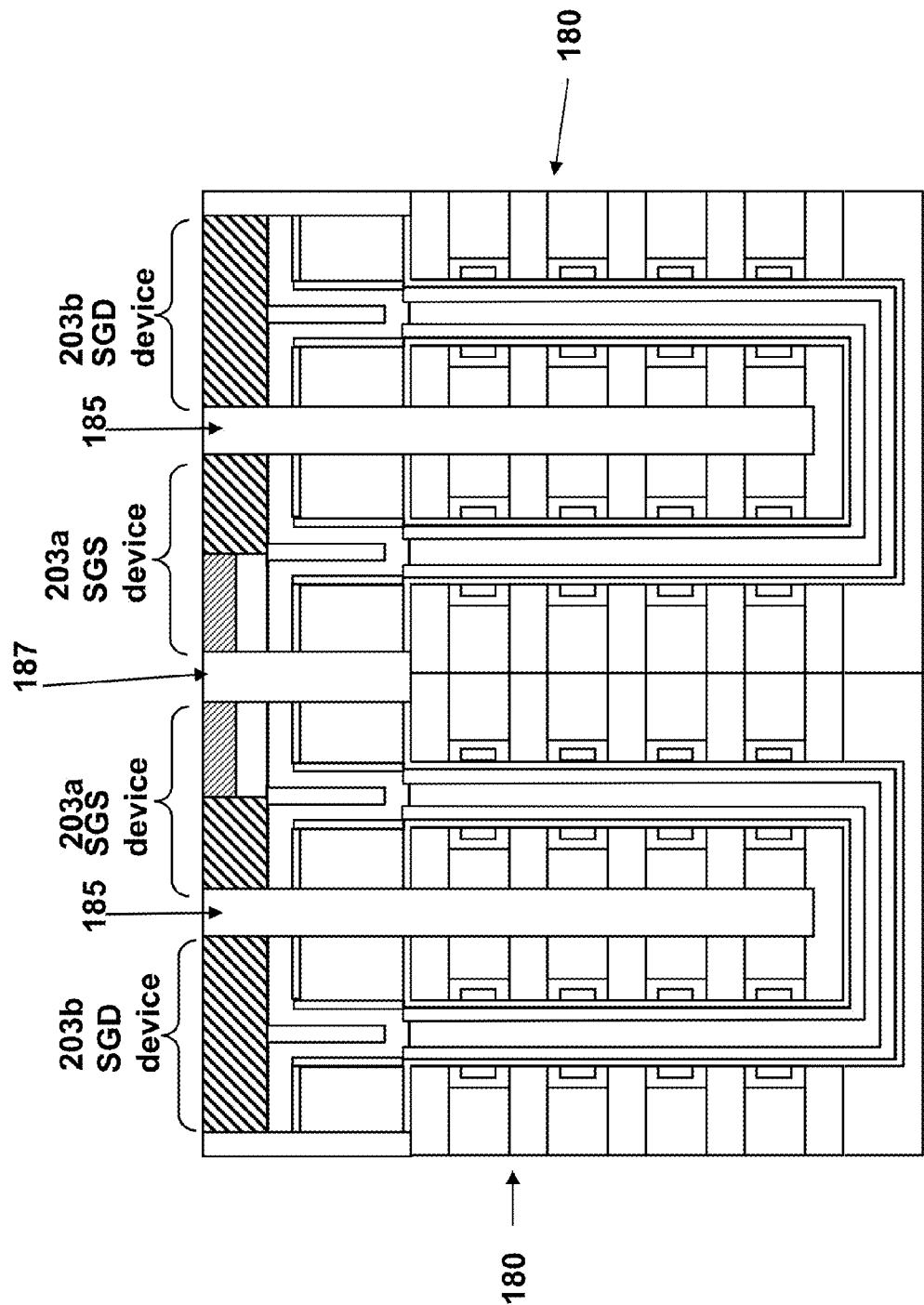

Next, a cut is made between the select transistors of adjacent NAND strings, such as between adjacent SGD devices 203a of adjacent strings as shown in FIG. 21. Finally, an insulating material 187, such as silicon oxide, etc., is formed in the cut between the select transistors, resulting in an array of NAND strings 180 as shown in FIG. 21.

Embodiment III

In a third embodiment, rather than a U-shaped pipe shape shown in FIGS. 3-4 and 17-21, the semiconductor channel 1 may have a "small" U-shaped side cross section, as shown in FIGS. 22A (perspective view) and 22B (cross sectional view along line Y-Y' in FIG. 22A). In the second embodiment, each wing 1a, 1b of the U-shaped pipe shape was formed in a separate opening 81, 82. In the present third embodiment, both wings of the "small" U-shape are formed in the same opening.

Specifically, as shown in FIGS. 22A and 22B, the two wing portions 1w and 1w' of the U-shaped semiconductor channel 1 are formed in the same opening 81. The wing portion extend substantially perpendicular to a major surface 100a of the substrate 100 and are connected by a connecting portion 1w''' at the bottom of the opening 81. The connecting portion extends substantially parallel to the major surface 100a of the substrate 100.

As shown in FIG. 22A, an a plurality of U-shaped NAND strings is formed in each opening 81. For example, as shown in FIG. 22A, the first NAND string 180a in each opening 81 includes wings 1w and 1w'. The second NAND string 180b in each opening includes wings 1x and 1x', and so on. The NAND strings may be arranged in a grid shaped array, which includes one set strings 180a, 180b arranged in a first horizontal "z" direction (i.e., parallel to major surface 100a of the substrate 100) in the each elongated trench shaped opening 81, and a second set of strings 180a, 180a in a second horizontal second "x" direction (i.e., parallel to the major surface 100a and perpendicular to the z direction) in each adjacent opening 81.

FIGS. 23-27 illustrate a method of making a NAND string having semiconductor channel with the "small" U-shaped side cross section shown in FIGS. 22A-B according to the third embodiment of the invention.

In these embodiments, a connecting feature 1w''' may be formed in and/or over the substrate 100, prior to the step of forming the stack 120 of alternating layers of the first material and second materials over the connecting feature 1w'''. The connecting feature 1w''' may be a semiconductor or conductor region formed in or over the substrate 100. For example, the connecting feature 1w''' may comprise a semiconductor or conductor region enclosed by the protective insulating layer 100b and embedded in the semiconductive layer 100a, as shown in FIG. 22B. Features 1w''' may be formed by a damascene process in the trenches in layer 100a. Alternatively, features 1w''' may be formed by lithographically patterning a conductive or semiconductor layer to form the features 1w''' followed by forming the insulating layer 100b and semiconducting layer 100a around the features 1w'''.

Further, the at least one opening 81 is then formed in the stack 120, resulting in a structure as shown in FIGS. 23A (perspective view) and 23B (cross sectional view along line Y-Y' in FIG. 23A). In this non-limiting example, the opening 81 has a square or rectangular shaped top cross-section as shown in FIG. 23A. However, other shapes, for example a circular shape, may be used if desired. An optional body contact electrode 102 may be provided in or over the substrate 100 to contact the connecting portion feature 1w''' from below.

Figures 24A, 24B:
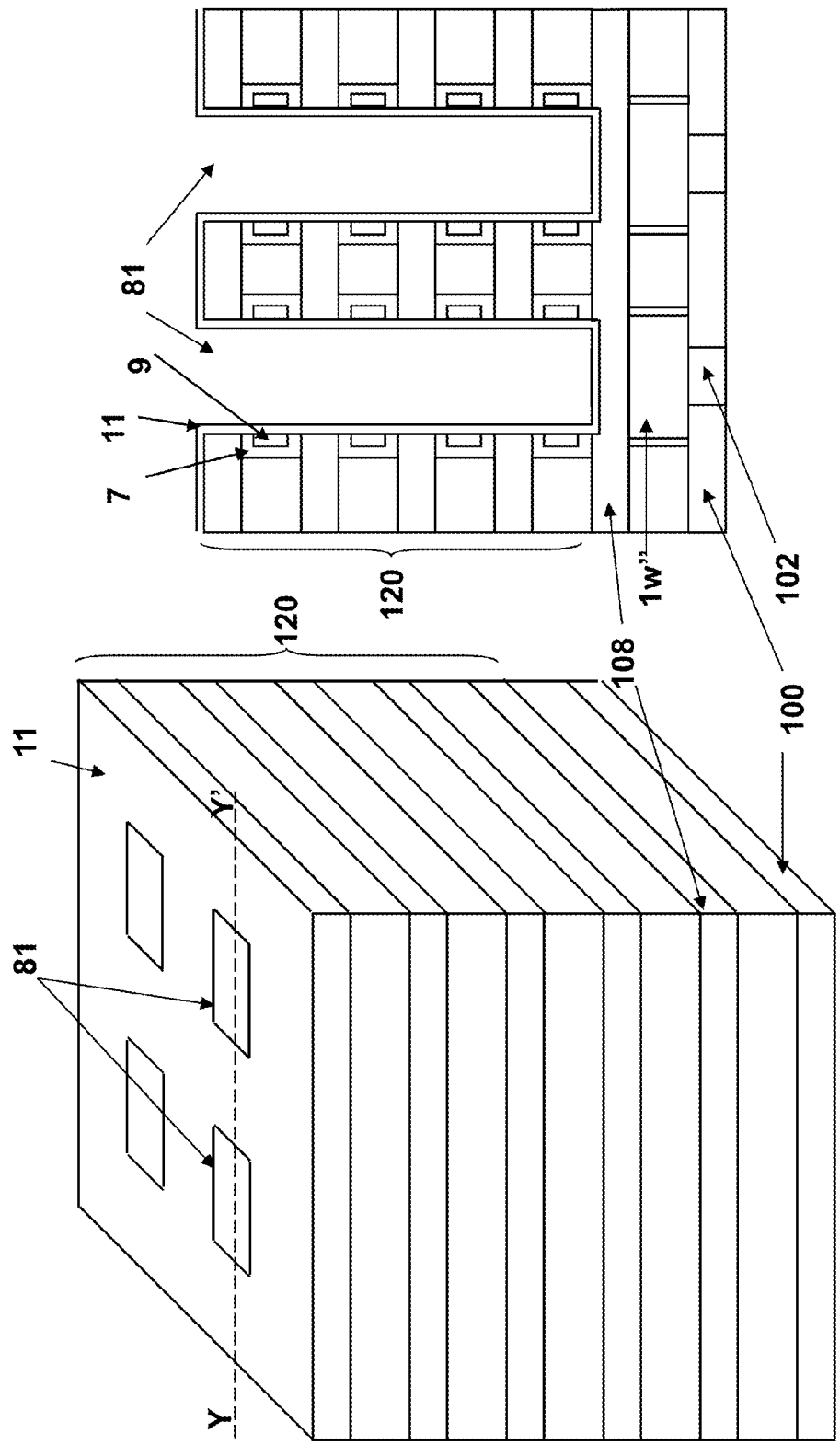

The blocking dielectric 7 and the plurality of discrete charge storage segments 9, and the tunnel dielectric layer 11 can then be formed using methods described above with respect to the first embodiment and FIGS. 5-13, resulting in a structure shown in FIGS. 24A and 24B.

Figures 25A, 25B:
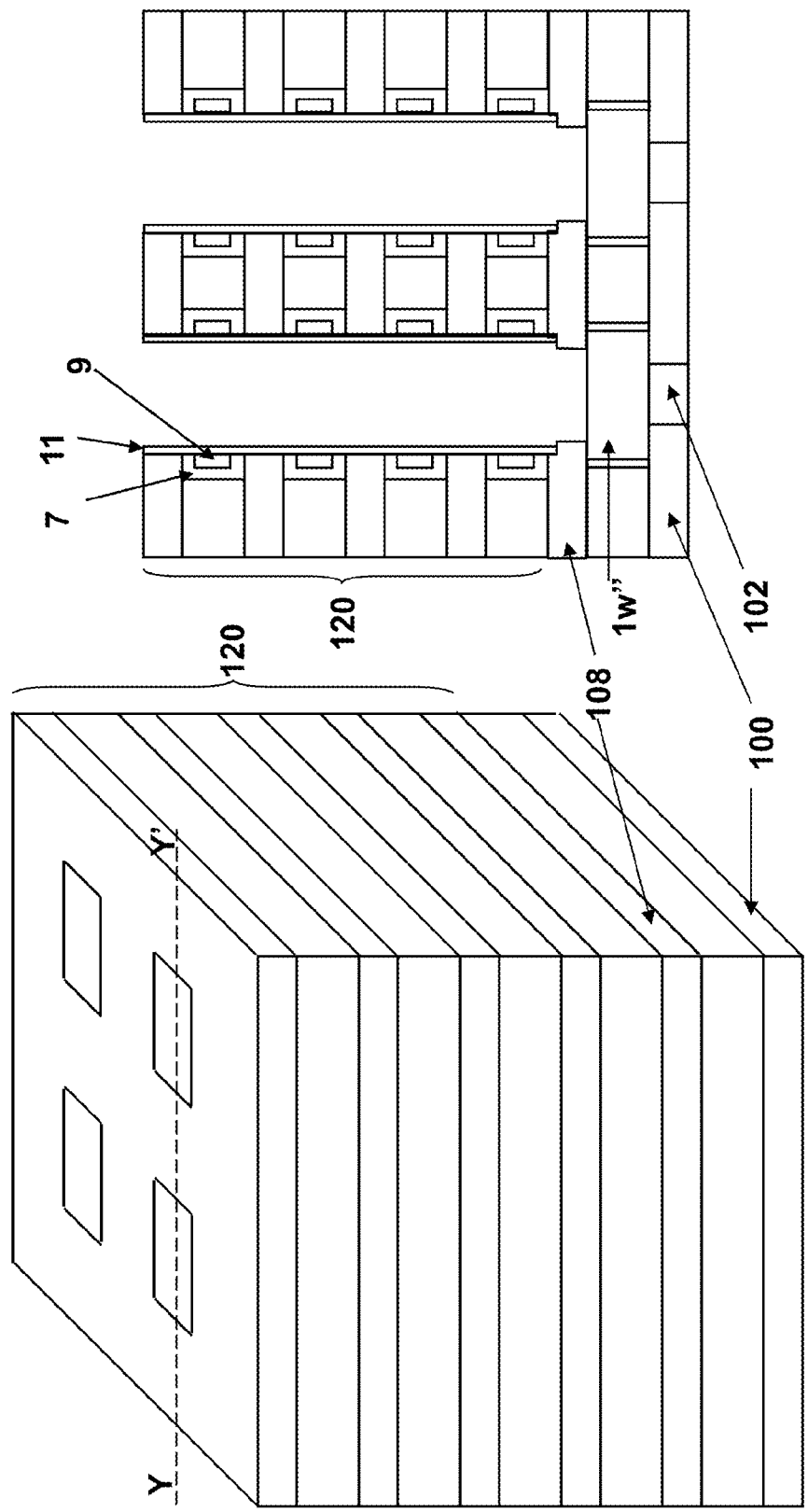

Next, a bottom portion of the tunnel dielectric layer 11 located over the bottom of the at least one opening 81 and the insulating protective layer 108 located below the bottom portion of the tunnel dielectric layer 11 are then etched (e.g., by anisotropic etching) to expose the semiconductor connecting feature 1w''' in the opening 81, resulting in a structure shown in FIG. 25B. The tunnel dielectric layer 11 is also removed from the top of the stack during the same etching step. The tunnel dielectric layer 11 remains on the sidewall(s) of the opening similar to a side wall spacer.

The semiconductor channel material can then be formed in the openings 81 using methods described above. Similarly, the semiconductor channel material may completely or partially fill the opening 81. Then, the middle portion of the semiconductor channel material is etched to form the two wings portions 1w and 1w' of the U-shaped semiconductor channel 1, resulting in the structure shown in FIGS. 22A-B. As shown in FIG. 22B, the two wing portions 1w and 1w' of the U-shaped semiconductor channel 1 are electrically connected by the connecting portion 1w''' (i.e., the connecting feature 1w''') which extends substantially parallel to the major surface of the substrate 100. Alternatively, the connecting feature 1w''' connecting the two wing portions of the semiconductor channel 1w and 1w' may be formed during the step of etching the middle portion of the semiconductor material by leaving a bottom portion of the semiconductor material filling openings 81 unetched, rather than being provided below the stack and exposed prior to the step of forming the semiconductor material.

Figure 26:
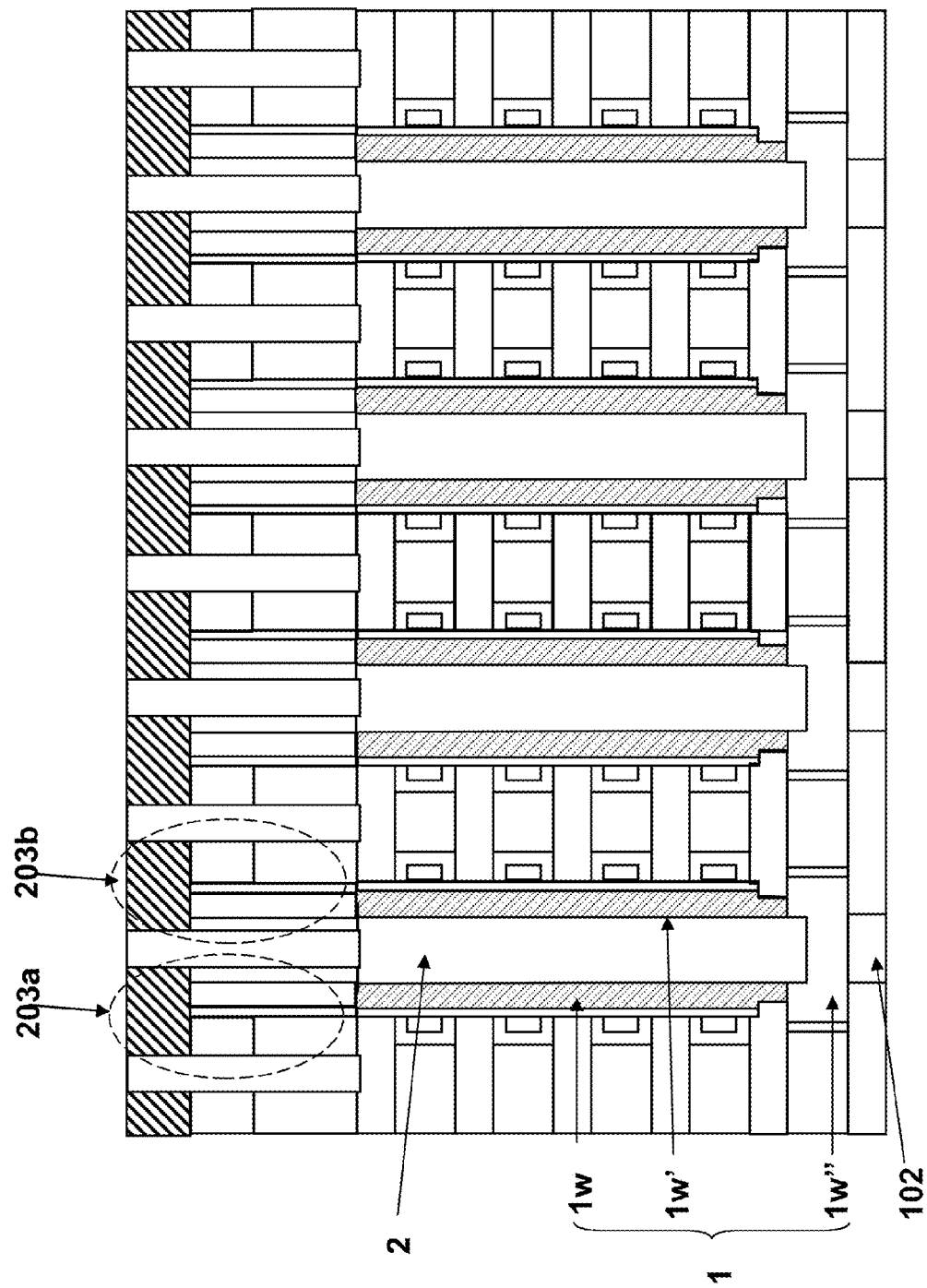

Next, an insulating fill 2 is formed over the connecting feature 1w''' and between the two separated wing portions 1w and 1w' of the U-shaped semiconductor channel 1 as shown in FIG. 26.

Similarly, source and drain electrodes $202_1$ and $202_2$ may be formed over the semiconductor channel 1 as shown in FIGS. 3 and 4. One of the select transistors 203a contacts the first wing portion 1w from above, and another one of the select transistors 203b contacts the second wing portion 1w' from above, as shown in FIG. 26.

Figure 27:
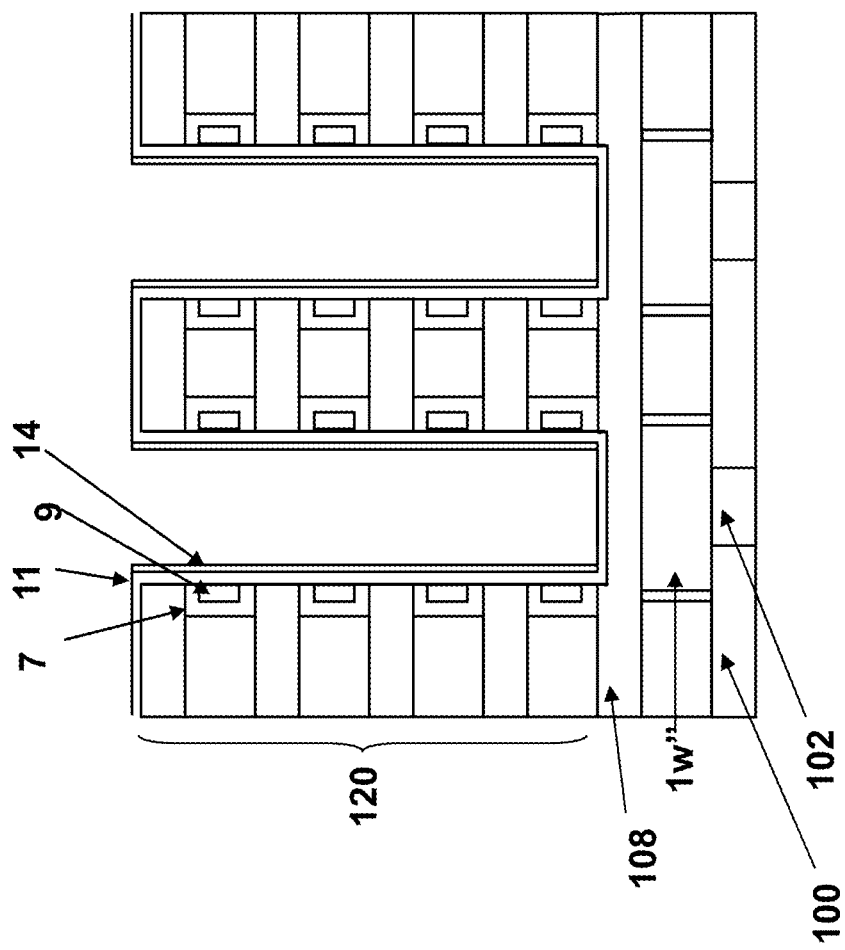

In some embodiments, prior to the step of etching the bottom portion of the tunnel dielectric layer 11 located over the bottom of the at least one opening 81, a masking spacer layer 14 may be formed over portions of the tunneling dielectric layer 11 located on the sidewall of the at least one opening 81 such that the bottom portion of the tunnel dielectric 11 remains exposed, as shown in FIG. 27. In these embodiments, the masking spacer layer 14 protects the tunnel dielectric 11 from being damaged during the step of etching the bottom portion of the tunnel dielectric and the protective layer 108. The masking spacer layer 14 may be removed during or after the steps of etching the bottom portion of the tunnel dielectric layer 11 and the insulating protective layer 108. The spacer layer 14 may comprise any material which has a lower etch susceptibility than the material of layer 11 to the etching medium used to etch the bottom of layer 11. For example, if the tunnel dielectric layer 11 is silicon oxide, then spacer layer 14 may be silicon nitride. The spacer layer may be formed by typical sidewall spacer formation methods, such as forming layer 14 on the sidewall(s) and bottom of the openings 81 and then anisotropically etching layer 14 to leave only sidewall spacer portions of layer 14 over layer 11 on the sidewall(s) of the openings, as shown in FIG. 27.

Embodiment IV

In the fourth embodiment, the monolithic three dimensional NAND string is formed by using an alternative method from that of the first three embodiments to form relatively thin floating gate charge storage segments 9. The resulting vertical NAND string of this embodiment also includes a tunnel dielectric 11 with a straight sidewall and a uniform thickness. In contrast, the tunnel dielectric 11 of the first three embodiments may have a slightly curved sidewall if the charge storage segments 9 protrude into the opening 81 past material 122 or if material 122 protrudes into the opening 81 past the segments 9. This may cause a curve in the sidewall of the tunnel dielectric and a variation in thickness of the tunnel dielectric 11 as it curves around the protrusions in the opening 81.

Figures 28A, 28B:
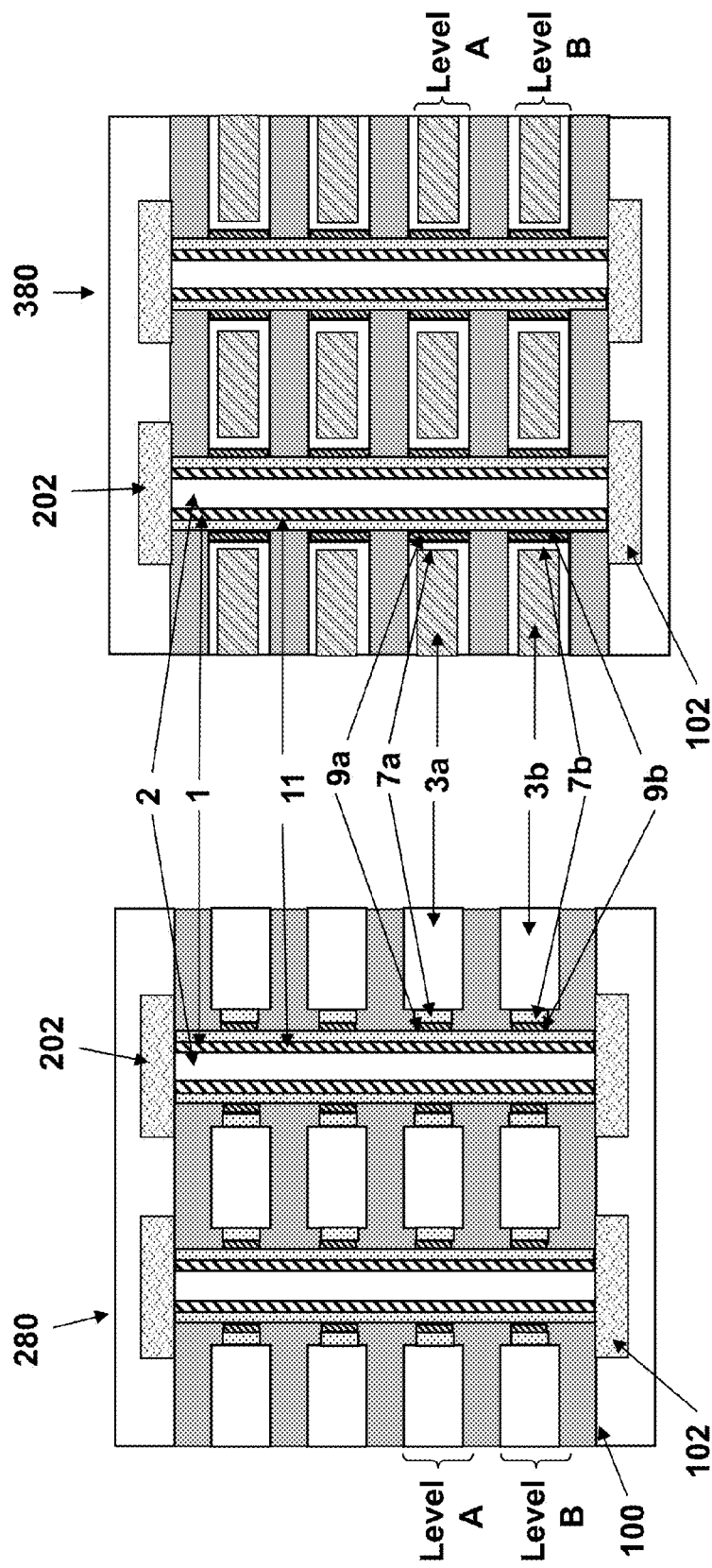
FIGS. 28A-28B are side cross sectional views of NAND strings according another two embodiments, respectively.

In one configuration of the fourth embodiment, each of the discrete charge storage segments 9 may have a height shorter than that of the respective control gate electrode 3 in the same device level. For example, in NAND string 280, a first discrete charge storage segment 9a may have a height shorter than that of a first control gate electrode 3a and a second discrete charge storage segment 9b has a height shorter than that of a second control gate electrode 3b, as shown in FIG. 28A. The term "height" means a vertical direction perpendicular to the major surface 100a of the substrate 100.

As will be described in more detail below, in another configuration of the fourth embodiment, each of the first discrete charge storage segment 9 may have a height greater than that of the respective control gate electrode 3 of the same memory cell. For example, in NAND string 380 a first discrete charge storage segment 9a may have a height greater or longer than that of a first control gate electrode 3a and a second discrete charge storage segment 9b has a height greater or longer than that of a second control gate electrode 3b, as shown in FIG. 28B. The select transistors are omitted for clarity from FIGS. 28A and 28B.

FIGS. 29-34 illustrate a method of making a NAND string shown in FIG. 28A, according to one embodiment of the invention.

Referring to FIG. 29A, a stack 130 of alternating layers of a conductive or semiconductor control gate material layers 131 (e.g., 131a, 131b, etc.) and a sacrificial material layer 132 (e.g., 132a, 132b, etc.) are formed over an insulating protective layer 108 located over a substrate 100. The sacrificial material may comprise any desirable materials that can be selectively etched compared to the conductive or semiconductor control gate material. For example, in one embodiment, when the control gate material layers 131 comprise a polysilicon or tungsten control gate material, the sacrificial material layers 132 may comprise an oxide, such as silicon oxide. The stack 130 may then be etched to form at least one opening 81 in the stack 130. The opening 81 may extend to the major surface 100a of the substrate 100 or to the protective layer 108. FIG. 29B shows a top cross sectional view along line X-X' in FIG. 29A.

Next, a blocking dielectric layer 7 can be formed on a sidewall of the at least one opening 81. This is followed by forming a charge storage material layer 9 on the blocking dielectric layer 7, a tunnel dielectric layer 11 on the charge storage material layer 9, a semiconductor channel layer 1 on the tunnel dielectric layer 11 in the at least one opening 81, as shown in FIGS. 30A and 30B. Since the method of the fourth embodiment does not form recesses 62, the openings 81 have straight sidewall(s). This leads to the tunnel dielectric layer 11 which has straight sidewall(s) and a uniform thickness.

In some embodiments, the step of forming the semiconductor channel layer 1 in the at least one opening 81 does not completely fills the at least one opening 81. In these embodiment, an insulating fill material 2 is then formed in the central part of the at least one opening 81 to completely fill the at least one opening 81, resulting in a structure shown in FIGS. 30A (side cross sectional view) and 30B (top cross sectional view).

Alternatively, the fill material 2 may be omitted when the step of forming the semiconductor channel layer 1 in the at least one opening 81 completely fills the at least one opening 81 with a semiconductor channel material.

Figure 31:
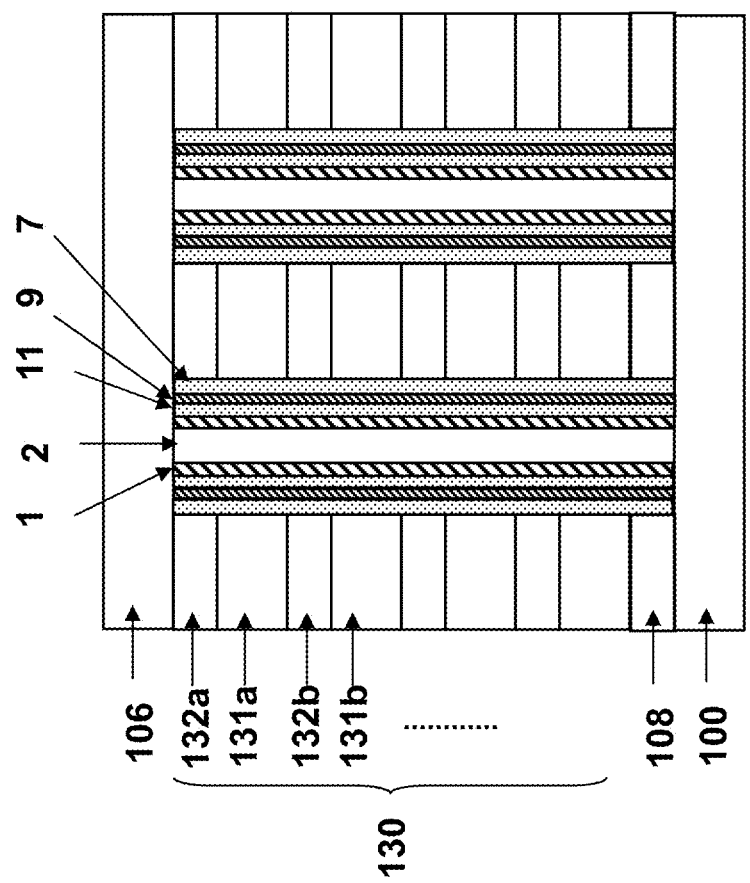

Turning to FIG. 31, another insulating layer 106 is then formed over the stack 130. Next, the sacrificial material layers 132 may then be removed to expose the blocking dielectric layer 7 between the control gate material layers 131 (including between the control gate material layers 131*a* and 131*b*), resulting in a structure as shown in FIG. 32A. The sacrificial material layers 132 are removed from the back side of the stack 130, rather than through the opening(s) 81.

In some embodiments, in order to open access to the back side of stack 130 for removing the sacrificial material layers 132, the cut area(s) 84 of the stack 130 are removed first. A top view of a resulting structure according to a non-limiting example is shown in FIG. 32B. The cut area(s) 84 may be formed by forming a mask by photolithography followed by etching the unmasked cut areas.

Further, the blocking dielectric layer 7 and the charge storage material layer 9 can then be etched using the first material layers 131 as a mask to form a plurality of separate discrete charge storage segments 9*a*, 9*b*, etc., and separate discrete blocking dielectric segments 7*a*, 7*b*, etc. In some embodiments, the step of etching the blocking dielectric layer 7 and the discrete charge storage material layer 9 undercut the blocking dielectric layer 7 and the discrete charge storage material layer 9 such that the discrete charge storage segments 7*a*, 7*b* and the blocking dielectric segments 9A and 9B are shorter than the thickness (i.e., vertical dimension) of the first material layers 131*a* and 132*a* respectively (i.e., the thickness of the control gates in a respective device level), resulting in a structure as shown in FIG. 33.

An insulating fill material 33 can then be formed between the first material layers 131, between the blocking dielectric segments 7 and between the discrete charge storage segments 9 resulting in vertical NAND strings shown in FIG. 34.

Similarly, an upper electrode 202 may be formed over the semiconductor channel 1, resulting in a structure shown in FIG. 28A. In these embodiments, a lower electrode 102 may be provided below the semiconductor channel 1 prior to the step of forming the stack 130 over the substrate 100. The lower electrode 102 and the upper electrode 202 may be used as the source/drain electrodes of the NAND string. The select transistors are not shown for clarity in FIG. 28A. These transistors may be located at the top and bottom of a linear NAND string shown in FIG. 28A or at the top of a U-shaped NAND string of the second and third embodiments which can be made by the backside etching method of this fourth embodiment.

As shown in FIG. 28A, the resulting NAND string 280 may comprise a plurality of device levels over the substrate 100. Each of device levels comprise a respective control gate 3, a respective blocking dielectric segment adjacent 7 to the respective control gate 3, a respective discrete charge storage segment 9 adjacent to respective blocking dielectric segment 7, a respective portion of the tunnel dielectric layer 11 adjacent to the respective discrete charge storage segment 9, and a respective portion of the channel layer 1. As explained above, the discrete charge storage segments 9 have a height shorter than that of the control gate electrodes 3 in each respective device level. The monolithic three dimensional NAND string may further comprise one of a source or drain electrode 202 which contacts the semiconductor channel 1 from above, and another one of a source or drain electrode 102 which contacts the semiconductor channel from below.

FIG. 35-42 illustrate a methods of making a NAND string 380 shown in FIG. 28B, according to another aspect of the fourth embodiment of the invention.

Referring to FIGS. 35A and 35B, a stack 140 of alternating layers of a first sacrificial material 141 (e.g., 141*a*, 141*b*, etc.) and a second sacrificial material 142 (e.g., 142*a*, 142*b*, etc.) are formed over a bottom sacrificial layer 408 located over a substrate 100. The sacrificial materials of layers 141, 142 and 408 may be any desired materials such that the first sacrificial material 141 and the bottom sacrificial material 408 can be selectively etched compared to the second sacrificial material 142. For example, in one embodiment, when the second sacrificial material 142 comprises a nitride (e.g., silicon nitride), the first sacrificial material 141 and the bottom sacrificial material 408 may comprise an oxide (e.g., silicon oxide). In another embodiment, when the second sacrificial material 142 comprise a doped polysilicon, the first sacrificial material 141 and the bottom sacrificial material 408 may comprise an undoped polysilicon. The stack 140 may then be etched to form at least one opening 81 in the stack 140.

Figure 36B:
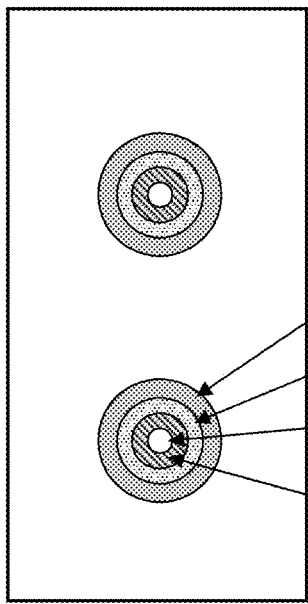
FIG. 36B is a top cross sectional view along line X-X' in the side cross sectional view shown in FIG. 36A.
Figure 36A:
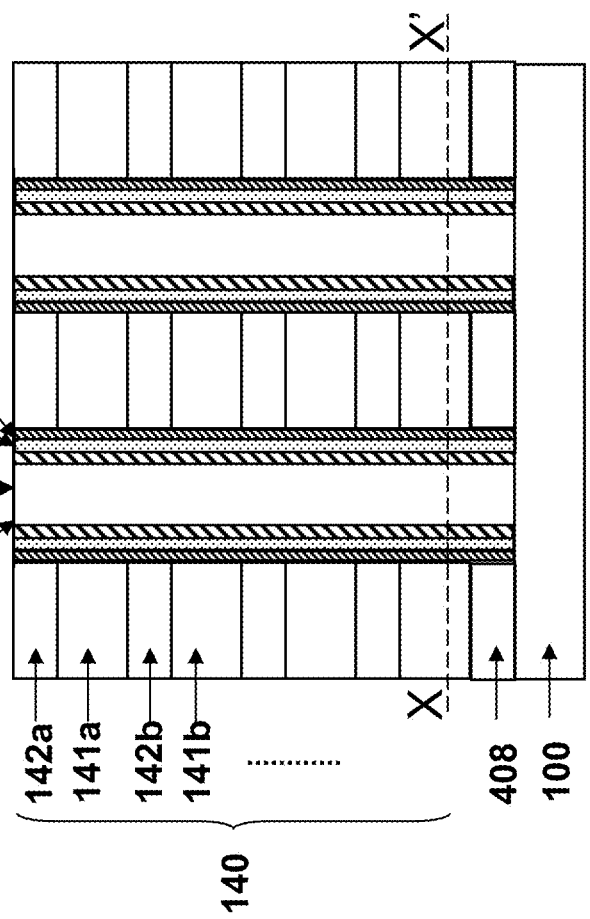

Next, as shown in FIGS. 36A and 36B, a discrete charge storage material layer 9 is formed on a side wall of the at least one opening 81, followed by forming a tunnel dielectric layer 11 on the charge storage material layer 9, and a semiconductor channel layer 1 on the tunnel dielectric layer 11 in the at least one opening 81. In this aspect of the fourth embodiment, the step of forming the semiconductor channel layer 1 in the at least one opening 81 does not completely fills the at least one opening 81. In these embodiment, an insulating fill material 2 is then formed in the central part of the at least one opening 81 to completely fill the at least one opening 81, resulting in a structure shown in FIGS. 36A (side cross sectional view) and 36B (top cross sectional view along line X-X' in FIG. 36A). Alternatively, the fill material 2 may be omitted when the step of forming the semiconductor channel layer 1 in the at least one opening 81 completely fills the at least one opening 81 with a semiconductor channel material.

Figure 37:
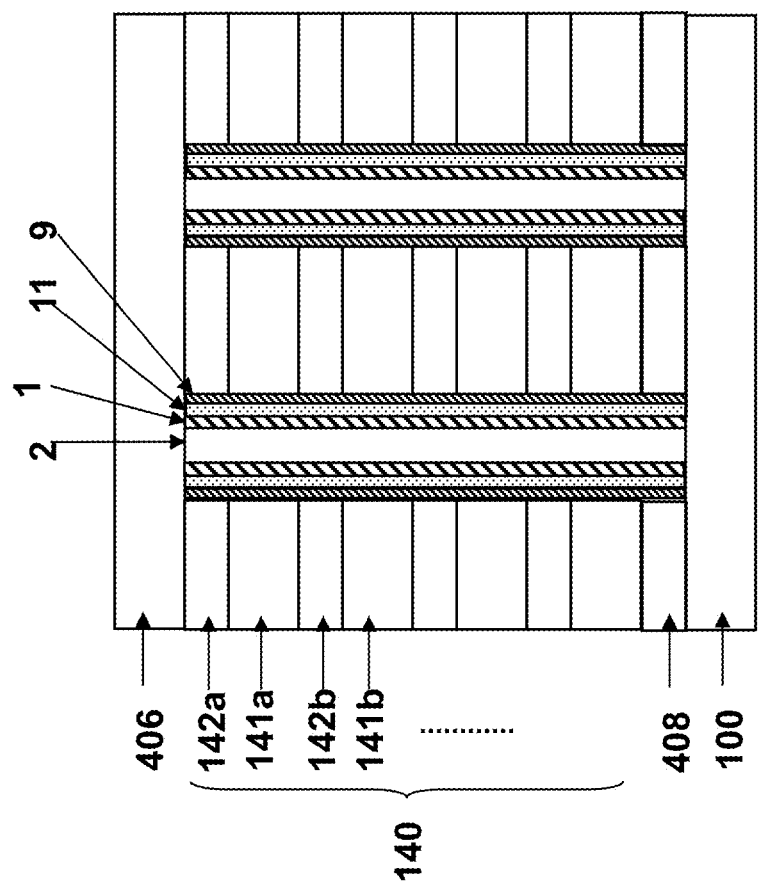

Turning to FIG. 37, an insulating layer 406 is then formed over the stack 140. Next, the second sacrificial material layers 142 and the bottom sacrificial material 408 may then be selectively removed without removing the first material layers 141, resulting in a structure shown in FIG. 38A. Similarly, cut areas 94 through the stack 140 shown in FIG. 38B may be removed prior to the step of selectively removing the second sacrificial material layers 142 to open access to the back side of the stack 140. A resulting structure according to a non-limiting example is shown in FIG. 38A (side cross sectional view) and 38B (top cross sectional view along line X-X' in FIG. 38A).

Next, the charge storage material layer 9 can then be etched using the first sacrificial material layers 141 as a mask to form a plurality of separate discrete charge storage segments, such as 9*a* and 9*b*, etc, resulting in a structure shown in FIG. 39. In some embodiments, an optional etch stop layer (not shown) may be formed on the sidewall of the at least one opening 81 prior to the step of forming the charge storage material layer 9. In these embodiments, the optional etch stop layer is etched using the first material layers 141 a mask to expose portions of a side of the charge storage material layer 9 between the first material layers 141, prior to the step of etching the charge storage material layer 9 using the first sacrificial material layers 141 as a mask.

Figure 40:
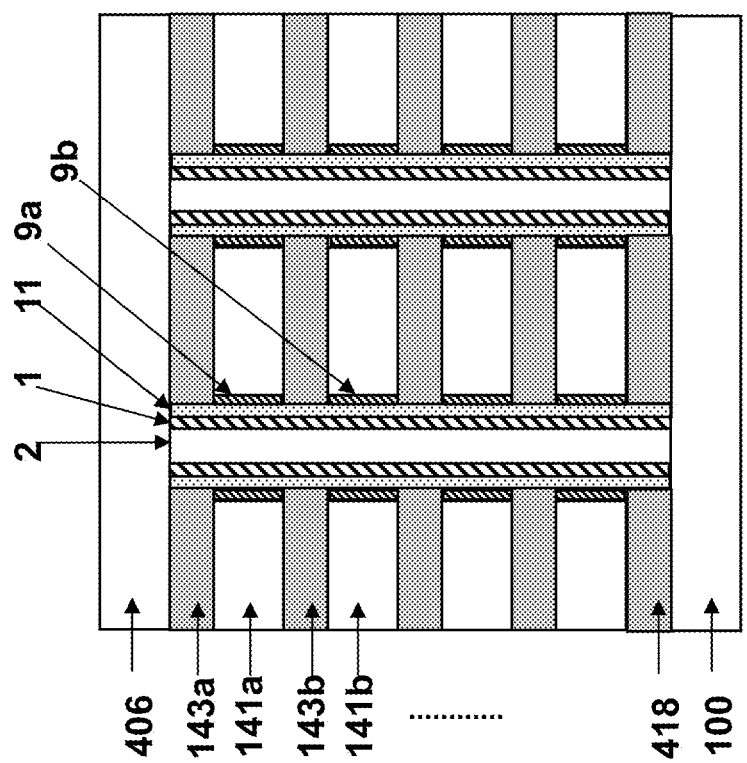
Figure 41:
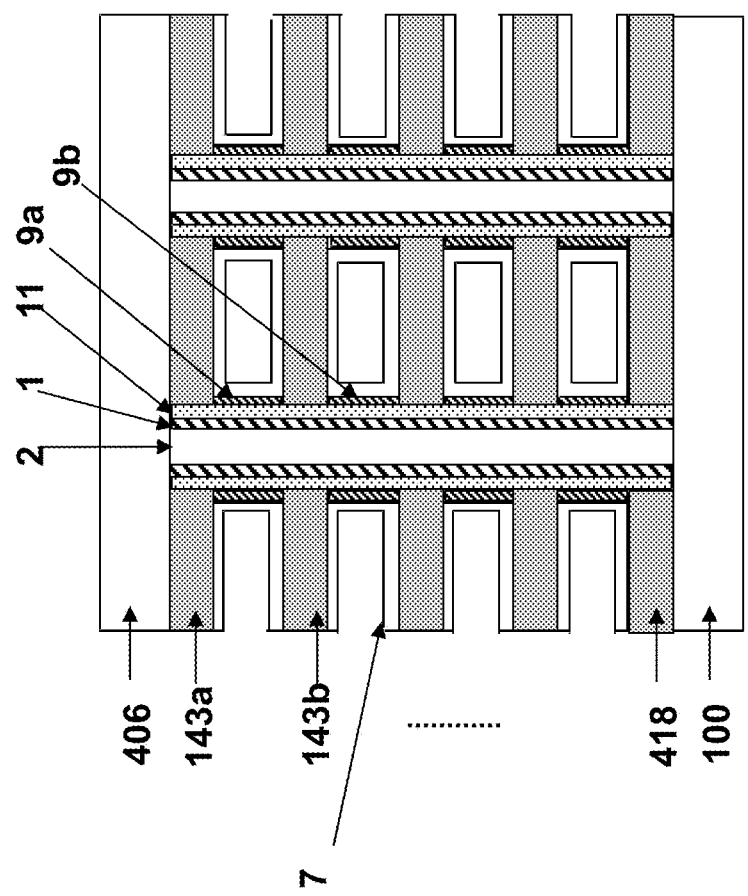
Figure 42:
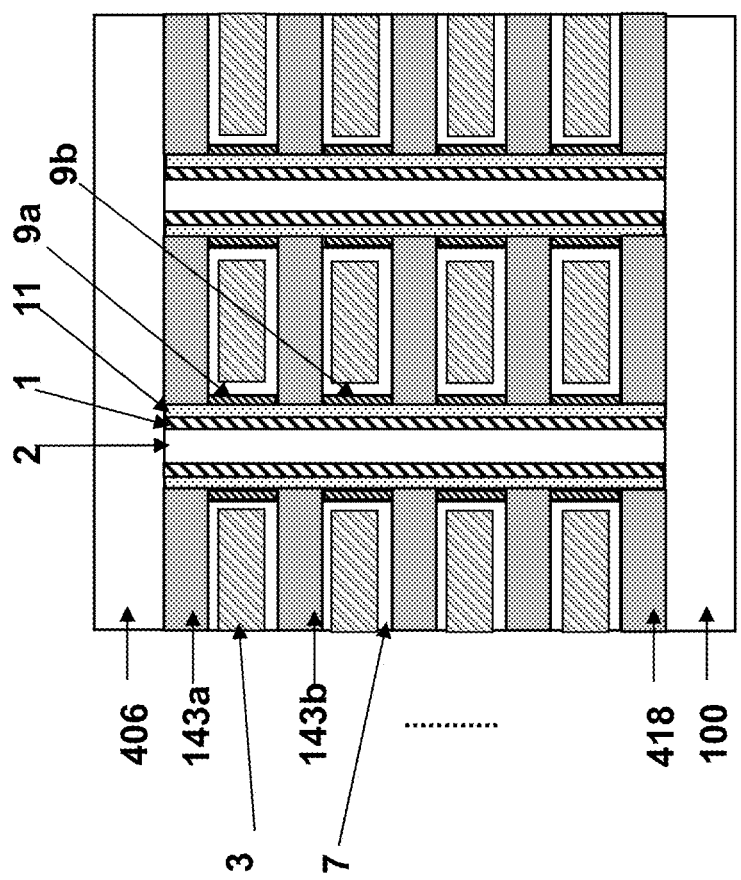

Turning to FIG. 40, an insulating material 143 (for example layers 143*a*, 143*b*, etc) is formed between the first material layers 141 to form alternating layers of insulating material layers 143 and the first material layers 141 through the backside from the cut area region 94. The isolating layer material is than etched out from the cut region 94. A bottom insulating layer 418 may also be formed between the stack 140 and the substrate 100 in the same step, filling the space originally occupied by the bottom sacrificial layer 408 shown in FIG. 36A.

Further, the first material layers 141 are then selectively removed to expose side wall of the discrete charge storage segments 9 using insulating material 143 as a mask. This is followed by forming a blocking dielectric 7 on the side wall of the discrete charge storage segments 9 and on the surfaces of the insulating material layers 143 exposed in the space previously occupied by layers 141 between the insulating material layers 143, resulting in a structure shown in FIG. 41. The blocking dielectric 7 has a "reverse" clam shape where the open side of the clam shape faces away from the opening 81 rather than toward it. Control gates 3 can then be formed in the empty space in the clam shaped blocking dielectric 7 between the insulating material layers 143, resulting in a structure shown in FIG. 42. For example, the isolated control gates 3 may be formed by depositing a conductor (e.g., depositing tungsten by CVD) in the empty space in the clam shaped blocking dielectric 7 and the cut region 94, followed by subsequently etching out the portion of conductor located in the cut region 94.

An upper electrode 202 may be formed over the semiconductor channel 1, resulting in a structure shown in FIG. 28B. In these embodiments, a lower electrode 102 may be provided below the semiconductor channel 1 prior to the step of forming the stack 140 over the substrate 100. The lower electrode 102 and the upper electrode 202 may be used as the source/drain electrodes of the NAND string. As described with respect to FIG. 28A above, the select transistors are not shown in FIG. 28B for clarity.

The resulting NAND string 380, as shown in FIG. 28B, may comprise a plurality of device levels over the substrate 100. Each of device levels comprise a respective control gate 3, a respective blocking dielectric segment adjacent 7 to the respective control gate 3, a respective discrete charge storage segment 9 adjacent to respective blocking dielectric segment 7, a respective portion of the tunnel dielectric layer 11 adjacent to the respective discrete charge storage segment 9, and a respective portion of the channel layer 1. At least a portion of each of the blocking dielectric segments 7 of the NAND string has a clam shape and each of the plurality of control gate electrodes 3 of the NAND is located at least partially in an opening in the clam-shaped portion of a respective blocking dielectric segment 7. In some embodiments, the discrete charge storage segments 9 have a height greater than that of the control gate electrodes 3 in each respective device level because the charge storage segments 9 have the same height as the reverse clam shaped blocking dielectric 7, while the control gate electrodes 3 are located inside the reverse clam shaped blocking dielectric 7. The monolithic three dimensional NAND string may further comprise one of a source or drain electrode 202 which contacts the semiconductor channel 1 from above, and another one of a source or drain electrode 102 which contacts the semiconductor channel from below.

Alternatively, hollow U-shaped pipe space (not shown) may be formed rather than openings 81 shown in FIGS. 29A and 35A. In these alternative embodiments, the semiconductor channel 1 substantially adopts the shape of the hollow U-shaped pipe space, rather than having a pillar shape (as shown in FIGS. 28A and 28B). In these alternative embodiments, two upper electrodes may be used as the source/drain electrodes of the NAND string contacting the semiconductor channel from above, with an optional lower electrode contacting the bottom portion of the semiconductor channel as a body contact, as shown in FIGS. 3, 4 and 22B.

Embodiment V

In the fifth embodiment, at least a first conductive or semiconductor (e.g., heavily doped semiconductor) shielding wing is located between a first discrete charge storage segment and a second discrete charge storage segment. The shielding wing reduces parasitic coupling between adjacent cells in each vertical NAND string through the insulating material which separates each cell from an adjacent cell located above or below.

Figure 43:
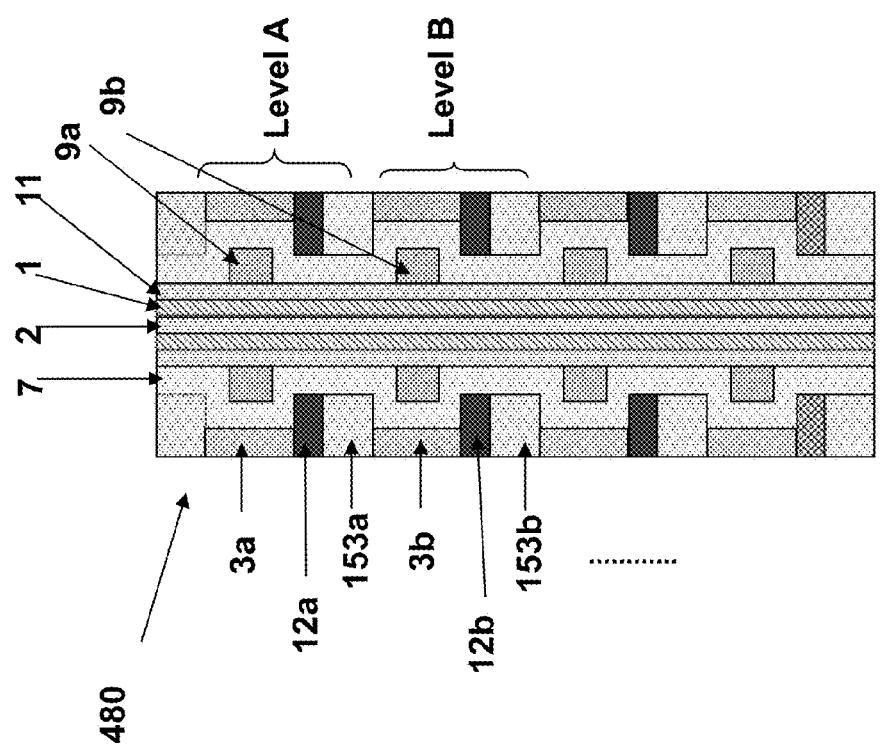
FIG. 43 illustrates a side cross sectional view of a NAND string according to another embodiment.
Figure 44:
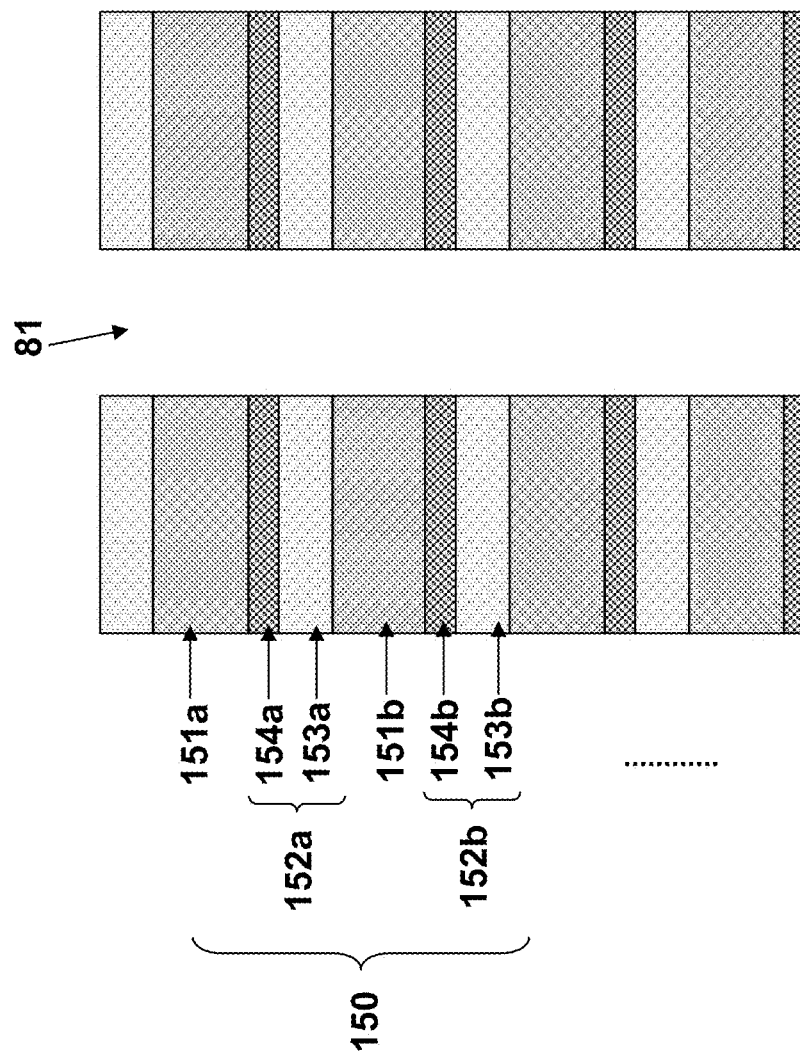
FIGS. 44-47 illustrate steps of a method of making the NAND string shown in FIG. 43 according to one embodiment of the invention.

For example, as shown in FIG. 43, a shielding wing 12a is located between the charge storage segment 9a located in device level A and charge storage segment 9b located in device level B of the NAND string 480. The device level B is located over the major surface of the substrate (not shown for clarity in FIG. 43) and below the device level A.

The shielding wing 12a is located in electrical contact with control gate electrode 3a in the same device level (i.e., device level A). Wing 12a may comprise a portion of a conductive or semiconductor layer located between adjacent, vertically separated cells and which protrudes into the space (e.g., opening 81) between charge storage segments 9. Wing 12 may comprise any conductive material, such as a metal or metal alloy, e.g., tungsten, titanium nitride, titanium silicide etc., or semiconductor material, such as heavily doped polysilicon. In these embodiments, at least a portion of each of the plurality of blocking dielectric segments 7 has a clam shape and each of the plurality of discrete charge storage segments 9 is located at least partially in an opening in a respective clam-shaped blocking dielectric segment 7.

FIG. 44-48 illustrate a method of making a NAND string 480 shown in FIG. 43, according to the fifth embodiment of the invention.

First, a stack 150 of alternating first layers 151 and second layers 152 is formed over the substrate (not shown for clarity). The first layers 151 (e.g., 151a in device level A and 151b in device level B) comprise a conductive or semiconductor control gate material, such as heavily doped polysilicon. The second layers 152 (e.g., 152a in device level A and 152b in device level B) comprise an insulating sub-layer 153 (e.g., 153a in device level A and 153b in device level B), such as silicon oxide, and a first sacrificial sub-layer 154 (e.g., 154a in device level A and 154b in device level B) of a different material (such as silicon nitride) than sub-layer 153. The stack 150 is then etched to form at least one opening 81 in the stack as in the prior embodiments, resulting in a structure shown in FIG. 44.

Figure 45:
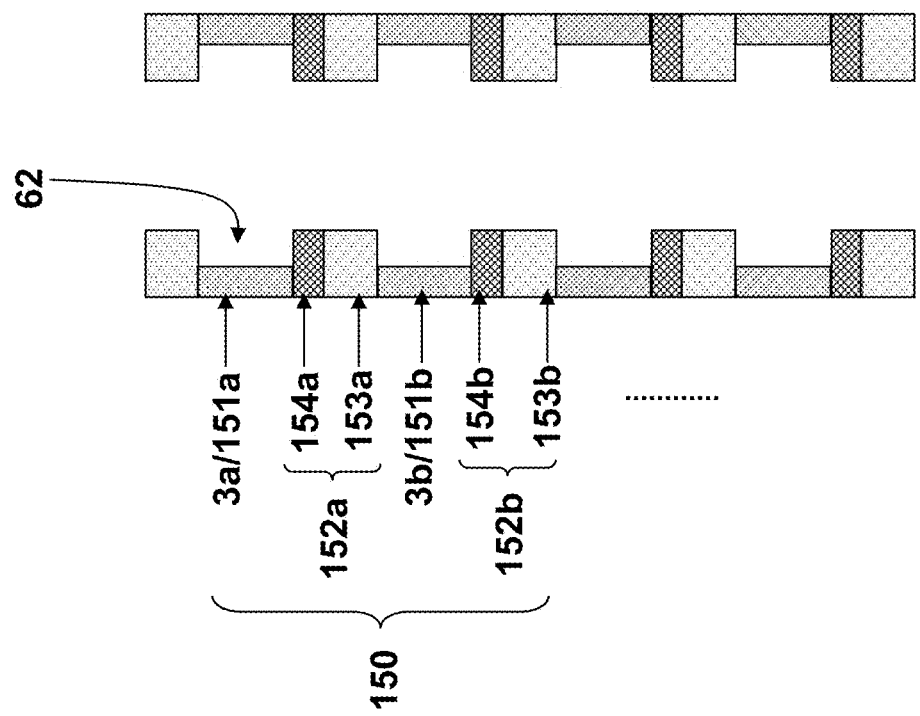
Figure 47:
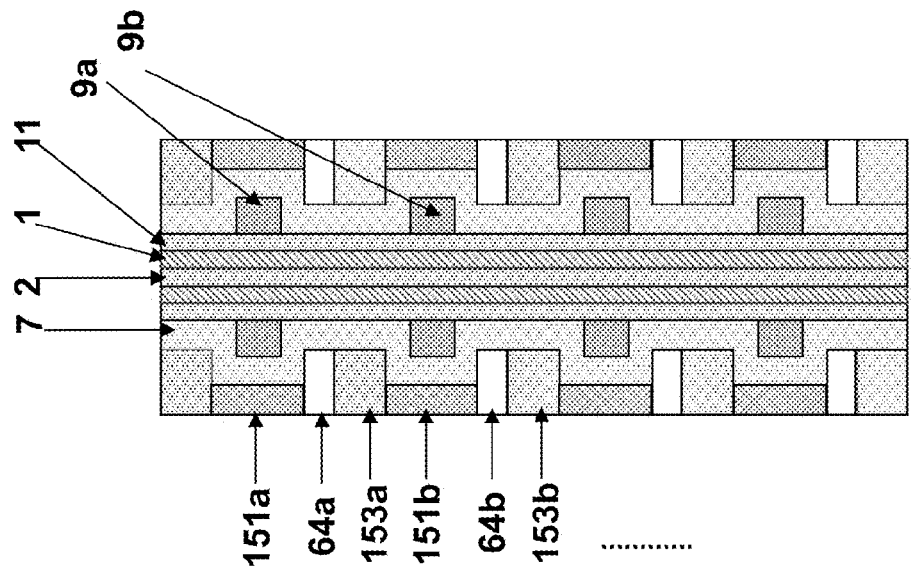
Figure 46:
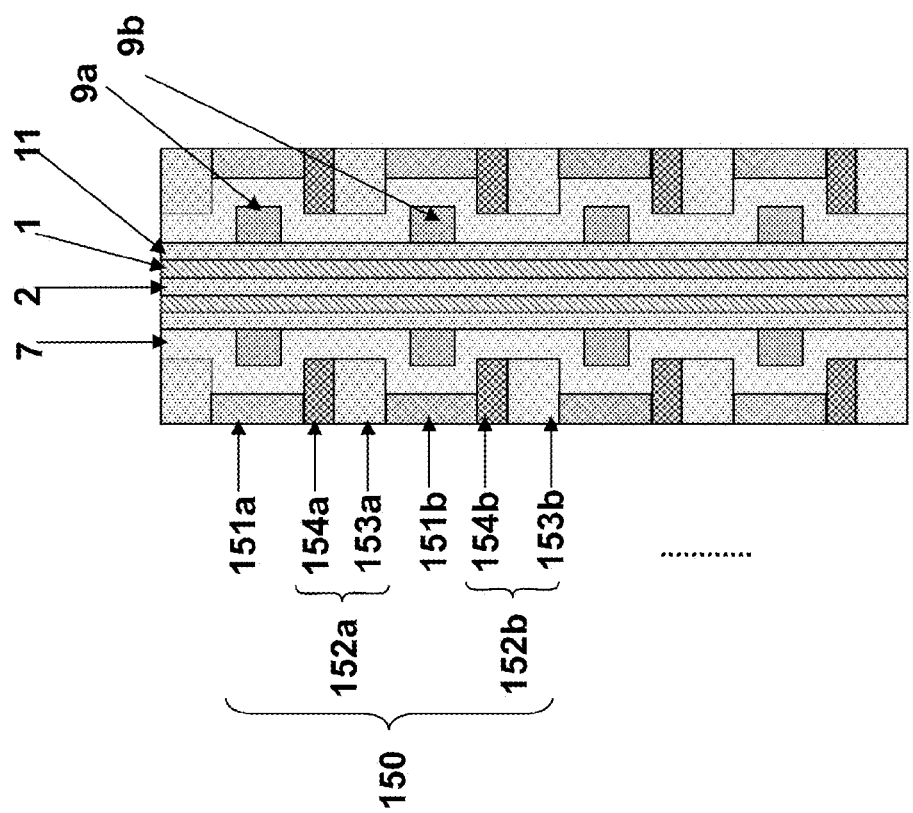

Further, as shown in FIG. 45, a blocking dielectric 7 is then formed in the opening 81 and in the first recesses 62, and a plurality of discrete charge storage segments 9 separated from each other are formed in the first recesses 62 over the blocking dielectric 7 using methods described in the previous embodiment. The step of forming the blocking dielectric 7 in the first recesses 62 comprises forming a plurality of clam-shaped blocking dielectric segments 7 in the first recesses 62, and the step of forming the plurality of discrete charge storage segments 9 comprises forming each of the plurality of discrete charge storage segments 9 inside an opening in a respective one of the plurality of clam-shaped blocking dielectric segments 7.

Next, a tunnel dielectric 11 can then be formed over a side wall of the discrete charge storage segments 9 exposed in the at least one opening 81, followed by forming a semiconductor channel 1 in the at least one opening 81, using methods described above. In some embodiments, the step of forming the semiconductor channel 1 in the at least one opening 81 forms a semiconductor channel material 1 on the side wall of the at least one opening 81 but not in a central part of the at least one opening 81 such that the semiconductor channel material 1 does not completely fill the at least one opening 81. An insulating fill material 2 in the central part of the at least one opening 81 to completely fill the at least one opening 81, resulting a structure shown in FIG. 46. Alternatively, the semiconductor channel material 1 completely fills (not shown) the at least one opening 81 with a semiconductor channel material.

Next, a cut area (not shown for clarity) of the stack 150 is then etched to expose a back side of the stack 150 using methods described in the previous embodiments (e.g., as shown in FIG. 32B). This is followed by removing the first sacrificial sub-layers 154 to form second recesses 64 (e.g., recess 64a in device level A and recess 64b in device level B) from the back side of the stack through the cut area, resulting in a structure shown in FIG. 47. For example, if the sacrificial sub-layers 154 comprise silicon nitride, then these sub-layers may be removed by a selective wet etch which selectively etches silicon nitride compared to polysilicon and silicon oxide.

A plurality of conductive or semiconductor shielding wings 12 separated from each other are then formed in the second recesses 64, resulting in the structure shown in FIG. 43. Wings 12 may comprise ALD or CVD deposited tungsten layers which are provided through the cut region. After wings 12 are deposited through the cut region, the cut region may be etched out.

In the above non-limiting example, each first sacrificial sub-layer 154 is located above the insulating sub-layer 153 in each second layer 152. For example the first sacrificial sub-layer 154a in device level A is located above the insulating sub-layer 153a in device level A, and the first sacrificial sub-layer 154b in device level B is located above the insulating sub-layer 153b in device level B. Thus, the wings 12 are located above each respective sub-layer 153 and below each respective control gate 3 in each memory cell.

Figure 48:
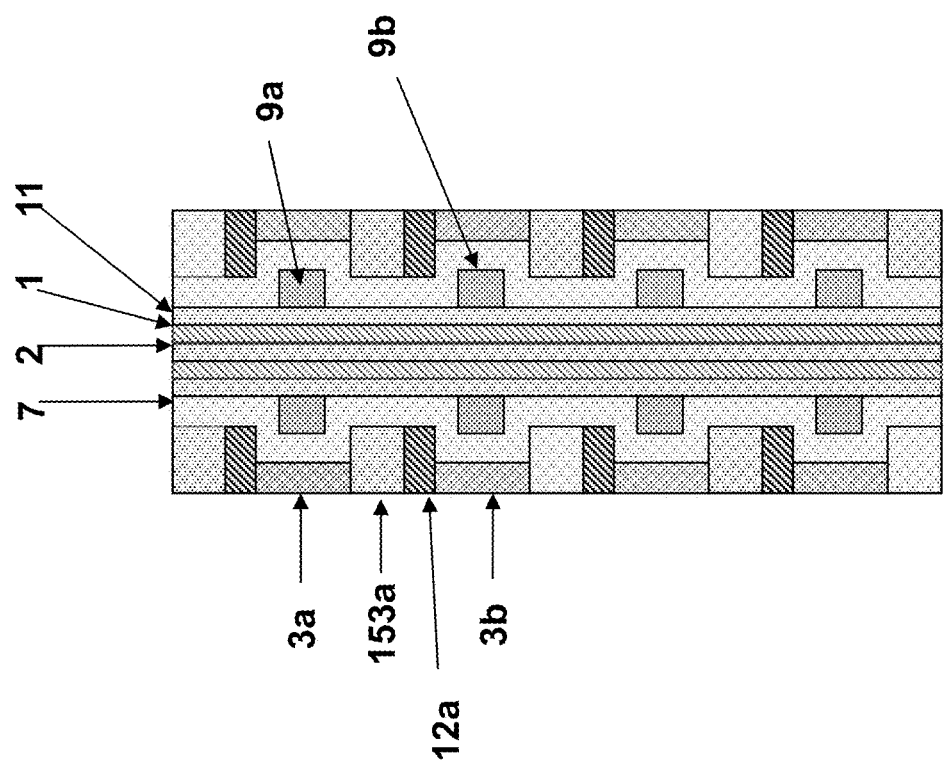
FIGS. 48 and 49 illustrate a side cross sectional view of NAND strings according to other embodiments.

Alternatively, the first sacrificial sub-layers 154 may be located below, rather than above, the insulating sub-layer 153 in each second layer 152. In this configuration, the wings 12 are located below each respective sub-layer 153 and below each respective control gate 3 in each memory cell, as shown in FIG. 48. In this configuration, wing 12a is in electrical contact with gate 3b of the next cell. Alternatively, wing 12a may be considered to be part of the cell in level B since this wing is connected to the control gate in level B.

In FIGS. 43 and 48, each of the plurality of shielding wings 12 is located between adjacent two of the plurality of discrete charge storage segments 9. For example, the shielding wing 12a is located between the discrete charge storage segments 9a and 9b.

Figure 49:
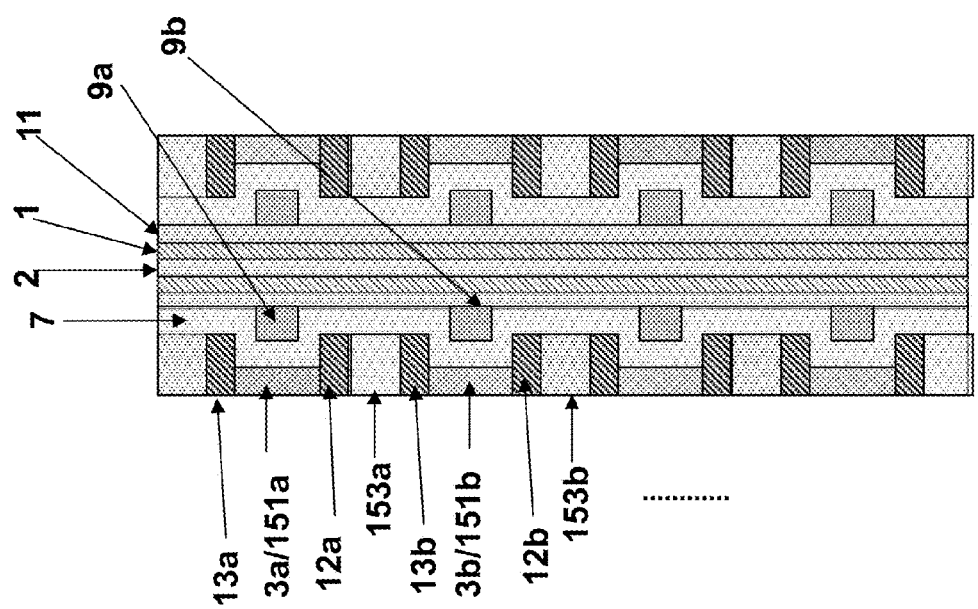

In another configuration, the NAND string contains two shielding wings per cell as shown in FIG. 49. For example, in the cell in level B, in addition to the first shielding wing 12b in contact with control gate 3b, each cell further comprises a second conductive or semiconductor shielding wing 13b located in electrical contact with the control gate electrode 3b (i.e., each gate contacts a wing above and a wing below the gate). Wing 13b extends substantially parallel to the major surface of the substrate 100 and at least partially between the first discrete charge storage segment 9a and the second discrete charge storage segment 9b, as shown in FIG. 49. In other words, instead of one wing in FIGS. 43 and 48, two shielding wings, for example shielding wing 12a and shielding wing 13b, are located between discrete charge storage segments 9a and 9b, as shown in FIG. 49. The shielding wings located in the same device level are separated from each other by the first layer 151 (i.e., the control gate 3 in these embodiments), while the shielding wings located in adjacent device levels are electrically isolated from each other by the interlevel insulating layers (e.g., the insulating sub-layers 153). For example, the shielding wings 12a and 13a located in the device level A are connected to each other by the first layer 151a (i.e., control gate 3a) while the shielding wing 12a located in device level A and 13b located in the device level B are separated from each other by the insulating sub-layer 153a.

Figure 50:
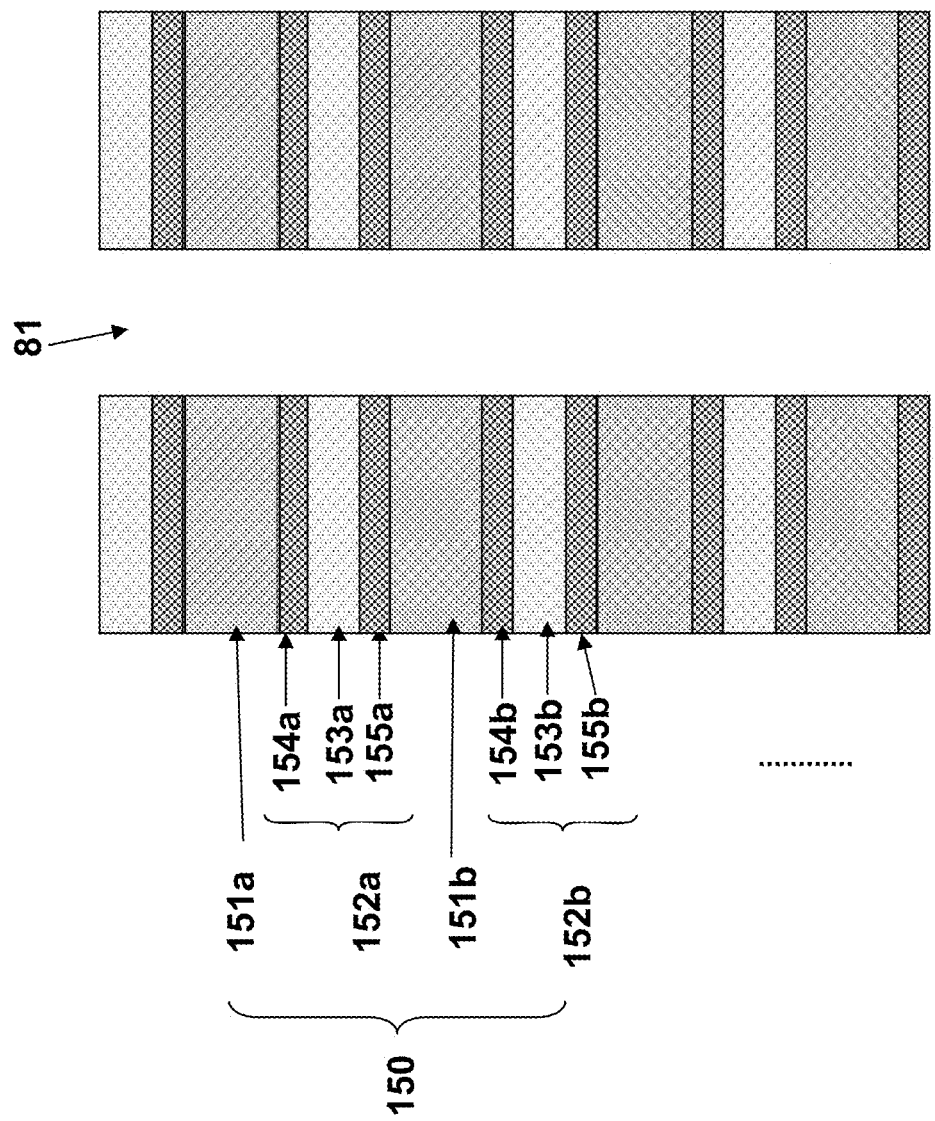
FIGS. 50-51 illustrate steps of a method of making the NAND string shown in FIG. 49 according to one embodiment of the invention.
Figure 51:
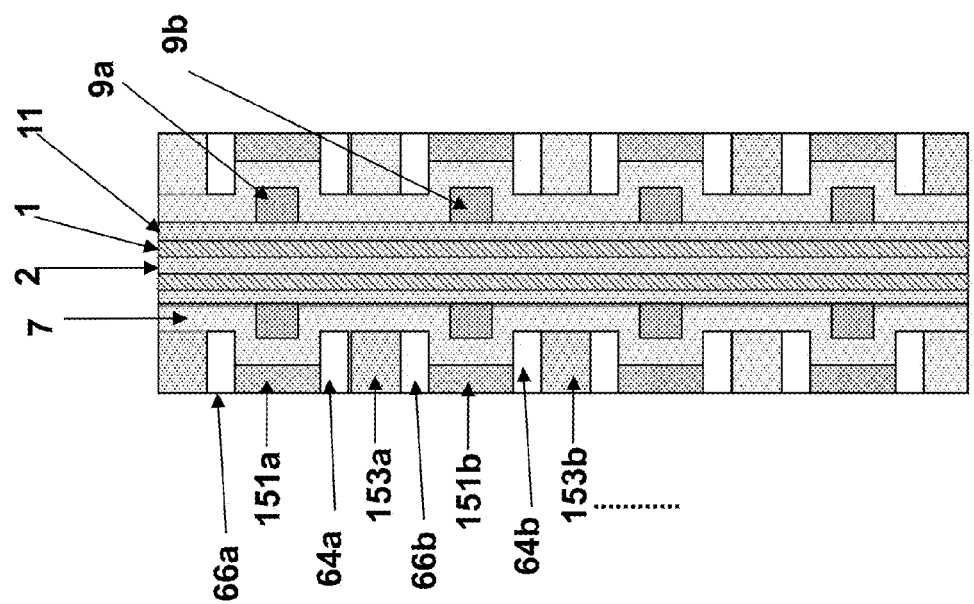

FIGS. 50-51 illustrate a method of making a NAND string shown in FIG. 49, according to one embodiment of the invention. Referring to FIG. 50, the second sacrificial layer 152 of the stack 150 further comprises a second sacrificial sub-layer 155, where the insulating sub-layer 153 is located below the first sacrificial layer 154 and above the second sacrificial layer 155. Further, the step of removing the first sacrificial sub-layer 154a (to form second recess 64a in device level A) also removes the second sacrificial sub-layer 155a to form third recesses 66b in device level B located immediately below the device level A, resulting in a structure shown in FIG. 51. Shielding wings 12 and 13 are then formed in the second 64 and third 66 recesses, resulting in the structure shown in FIG. 49.

Similarly, an upper electrode (not shown) may be formed over the semiconductor channel 1, while a lower electrode (not shown) may be provided below the semiconductor channel 1 prior to the step of forming the stack 150 over the substrate 100. The lower electrode and the upper electrode may be used as the source/drain electrodes of the NAND string.

Optionally, at least one sacrificial feature (not shown) may be provided over a substrate and below the stack 150, such that the at least one sacrificial feature can be then removed to form a hollow region extending substantially parallel to a major surface of the substrate which connects the at least one openings and another opening in the stack to form a hollow U-shaped pipe space, prior to the step of forming the tunnel dielectric 11. In this embodiment, the step of forming the semiconductor channel 1 forms the semiconductor channel in the hollow U-shaped pipe space and adopts the shape of the hollow U-shaped pipe space, as described in the above embodiments.

Figure 52:
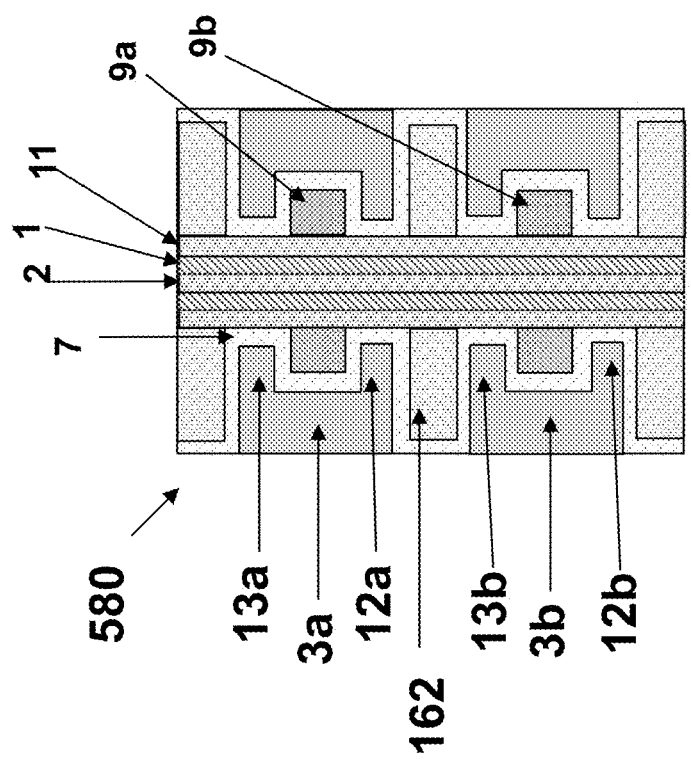
FIG. 52 illustrates a side cross sectional view of a NAND string according to another embodiment.

Alternatively, as shown in FIG. 52, in NAND string 580 the first shielding wings 12, the second shielding wings 13 and the control gate electrodes 3 can be formed in a same step such that each first shielding wing 12 comprises a lower part of a respective control gate electrode 3 and that each second shielding wing 13 comprises an upper part of a respective control gate electrode 3. Preferably, no observable interface exists between the first shielding wing 12, the second shielding wing 13 and the control gate electrode 3 in each device level. In other words, each of the control gates 3 has a clam shape. For example, as shown in FIG. 52, the first shielding wing 12a, the second shielding wing 13a and the control gate electrode 3a can be formed in a same step such that the first shielding wing 12a comprises a lower part of the control gate electrode 3a and that the second shielding wing 13a comprises an upper part of the control gate electrode 3a. The first shielding wing 12b, the second shielding wing 13b and the control gate electrode 3b are formed in a same step (preferably the same step as the gate and wings in level A) such that the first shielding wing 12b comprises a lower part of the control gate electrode 3b and that the second shielding wing 13b comprises an upper part of the control gate electrode 3b.

Each first shielding wing 12 extends at least partially between a first and an adjacent second of the plurality of the discrete charge storage segments 9 and a second shielding wing 13 extends at least partially between the first and an adjacent third of the plurality of the discrete charge storage segments 9. For example, the first shielding wing 12a extends at least partially between the discrete charge storage segments 9a and 9b, while the second shielding wing 13a extends at least partially between the discrete charge storage segment 9a and a discrete charge storage segment of an upper device level (now shown). The second shielding wing 13b in level B and the first shielding wing 12a in level A are both located between discrete charge storage segments 9a and 9b.

Also referring to FIG. 52, at least a portion of each of the plurality of blocking dielectric segments 7 is located at least partially in an opening in a respective clam-shaped control gate electrode 3, while the first discrete charge storage segment 9 is disposed at least partially between the shielding wings 12 and 13 in each device level. For example, segment or floating gate 9a is located between wings 12a and 12b and adjacent to the side of control gate 3a. The wings 12, 13 and control gates 3 may be made of any suitable conductive or heavily doped semiconductor material, such as tungsten or heavily doped polysilicon.

FIG. 53-57 illustrate a method of making a NAND string 680 shown in FIG. 52, according to the fifth embodiment of the invention.

Figure 53:
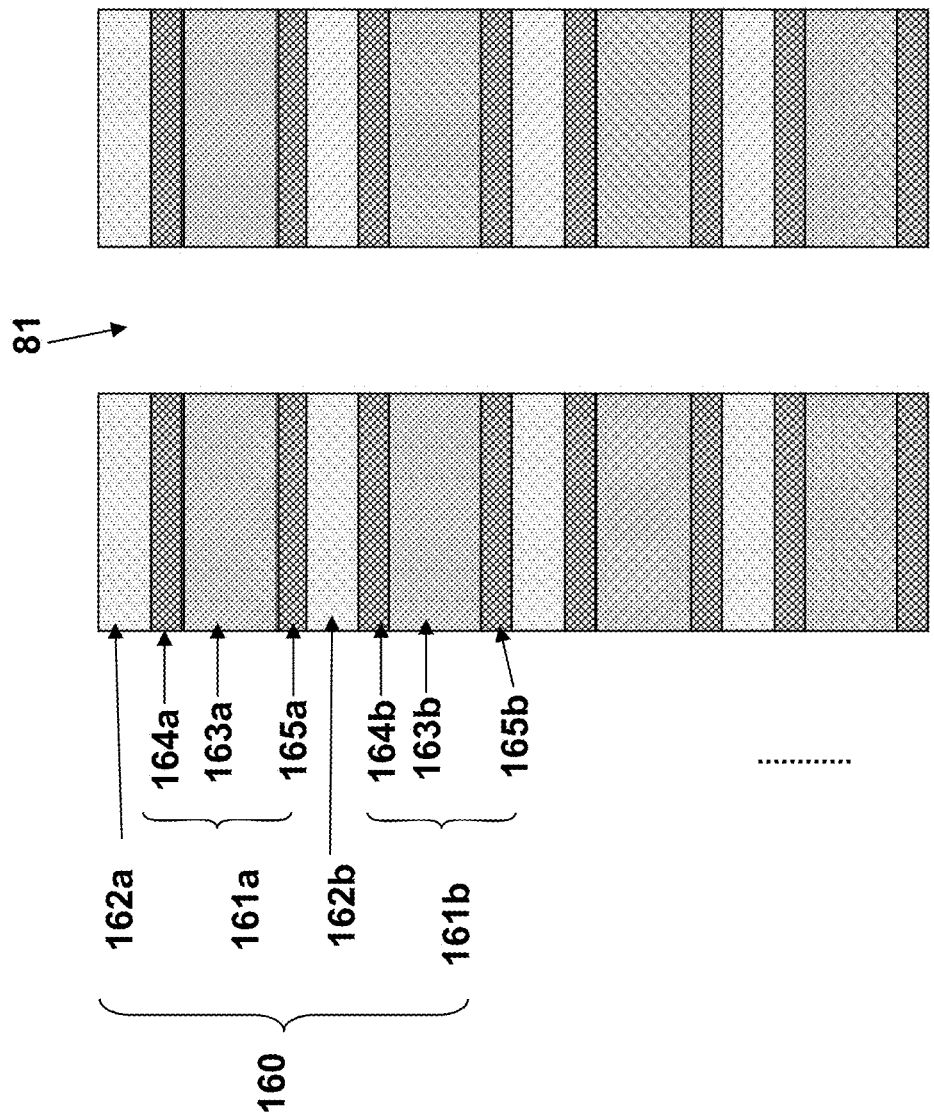

Referring to FIG. 53, a stack 160 of alternating layers of a first layer 161 and a second layer 162 are formed over a substrate (not shown). The first layer 161 comprises a first sacrificial sub-layer 164, a second sacrificial sub-layer 165 and a third sacrificial sub-layer 163 located between the first sacrificial sub-layer 164 and the second sacrificial sub-layer 165. The stack 160 is then etched to form at least one opening 81, resulting in a structure shown in FIG. 53. Next, the third sacrificial sub-layer 163 is selectively etched to form first recesses 61, as shown in FIG. 54. A plurality of discrete charge storage segments 9 separated from each other can then be formed in the first recesses 61 using methods described above, resulting in a structure shown in FIG. 55.

In some embodiments, the second layer 162 comprises an insulating layer, such as silicon oxide. The third sacrificial sub-layer 163 comprises a sacrificial material different from the first sacrificial sub-layer 164, the second sacrificial sub-layer 165, and the second layer 162. In a non-limiting example, the first 164 and second 165 sacrificial sub-layers may comprise silicon nitride, and the third sacrificial sub-layer 163 comprises undoped polysilicon, while the plurality of discrete charge storage segments 9 comprise doped polysilicon.

Similar methods to those described in the previous embodiments above can then be used to form a tunnel dielectric 11 over a side wall of the discrete charge storage segments 9 exposed in the at least one opening 81, and a semiconductor channel 1 over the tunnel dielectric 11 in the at least one opening 81. In some embodiments, the step of forming the semiconductor channel 1 in the at least one opening forms a semiconductor channel material on the side wall of the at least one opening 81 but not in a central part of the at least one opening 81 such that the semiconductor channel material 1 does not completely fill the at least one opening 81, and an insulating fill material 2 is then formed in the central part of the at least one opening 81 to completely fill the at least one opening 81, resulting a structure shown in FIG. 56. Alternatively, the step of forming the semiconductor channel 1 in the at least one opening completely fills the at least one opening 81 with a semiconductor channel material. In this alternative embodiment, the insulating filler material 2 may be omitted.

Figure 57:
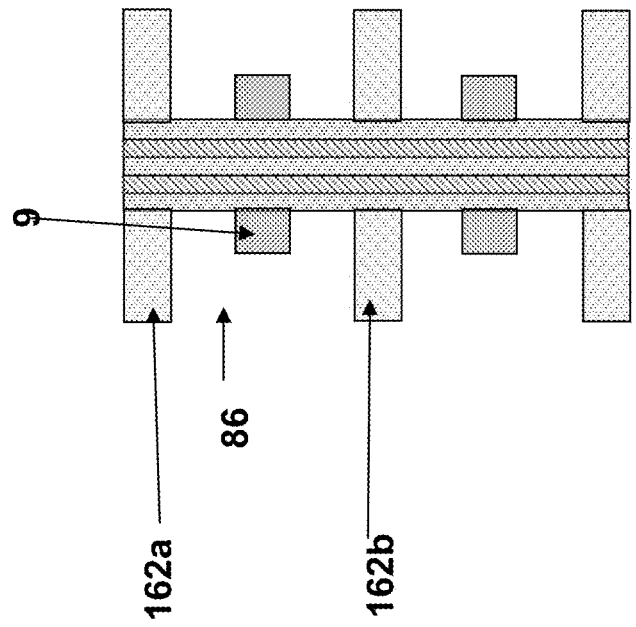
Figure 56:
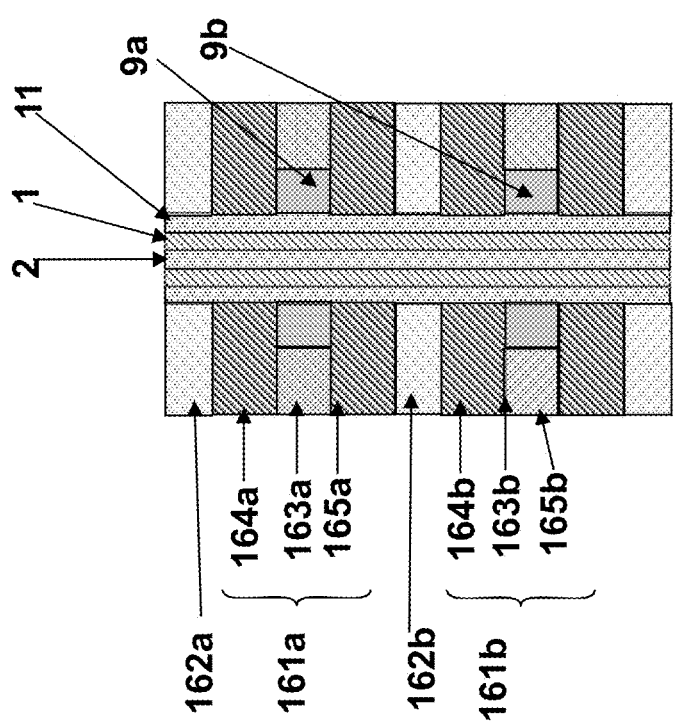

The stack 160 can then be etched to expose a back side of the stack 160, such as through a cut region similar to the one shown in FIG. 32B. This is then followed by removing the first sacrificial sub-layer 164, the second sacrificial sub-layer 165 and the third sacrificial sub-layer 163 from the back side of the stack through the cut region to form clam shaped openings 86 such that the plurality of discrete charge storage segments 9 and portions of the tunneling dielectric 11 are exposed in the clam-shaped openings 86 between layers 162, as shown in FIG. 57.

A blocking dielectric layer is then formed on the stack from the back side such that a plurality of clam-shaped blocking dielectric segments 7 are formed in the clam shaped openings 86 around and over the plurality of discrete charge storage segments 9. Each segment 7 partially fills the respective opening 86. The partially filled openings are then filled by forming a plurality of clam shaped control gate electrodes 3 in the clam shaped openings 86 that are partially filled by the clam shaped blocking dielectric segments 7, resulting in a structure shown in FIG. 52.

Figure 58:
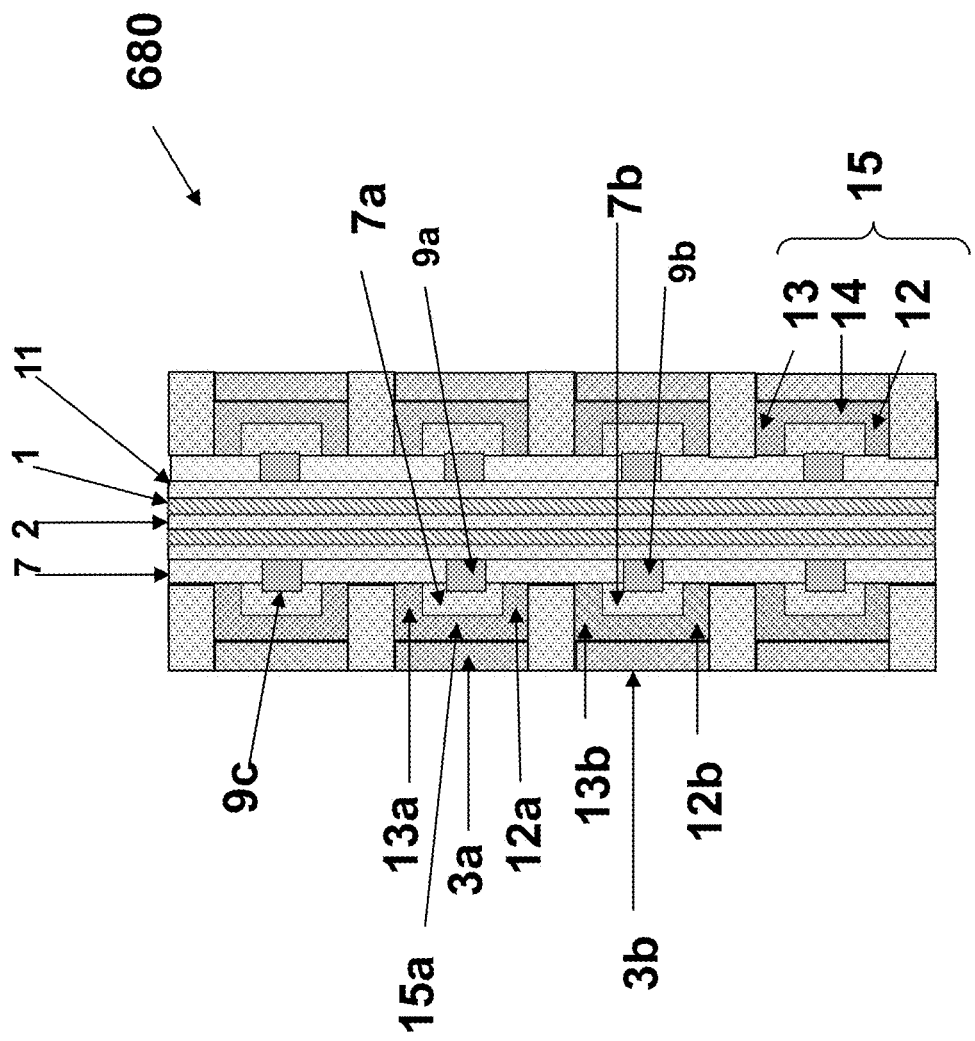
FIG. 58 illustrates a side cross sectional view of a NAND string according to another embodiment.

In another aspect of the fifth embodiment, a conductive or semiconductor liner (e.g., 15a) is located between the control gate electrodes (e.g., 3a) and blocking dielectric segments (e.g., 7a) of NAND string 680 shown in FIG. 58. The conductive or semiconductor liner 15 has a clam shape and comprises a first shielding wing 12 and a second shielding wing 13 connected by a connection portion such that the first discrete charge storage segment 9 is disposed at least partially between the shielding wings 12 and 13 and adjacent to the connecting portion.

For example, as shown in FIG. 58, the first shielding wing 12a extends at least partially between a first 9a and an adjacent second 9b segments of the plurality of the discrete charge storage segments 9. The second shielding wing 13a extends at least partially between the first 9a and an adjacent third 9c segment of the plurality of the discrete charge storage segments 9. Two shielding wings (e.g., 12a and 13b) from adjacent memory cells/device levels are located between the discrete charge storage segments 9a and 9b of the adjacent memory cells. The same structure may be repeated in a plurality of device levels.

Similar to the liner 15, each of the plurality of blocking dielectric segments, e.g., 7a and 7b, may comprise a clam-shaped portion of a blocking dielectric layer 7 which extends substantially perpendicular to the major surface of the substrate (not shown). In these embodiments, the tunnel dielectric 11 has a substantially straight sidewall and a uniform thickness.

FIGS. 59-63 illustrate a methods of making a NAND string 580 shown in FIG. 58, according to one embodiment of the invention.

Figure 59:
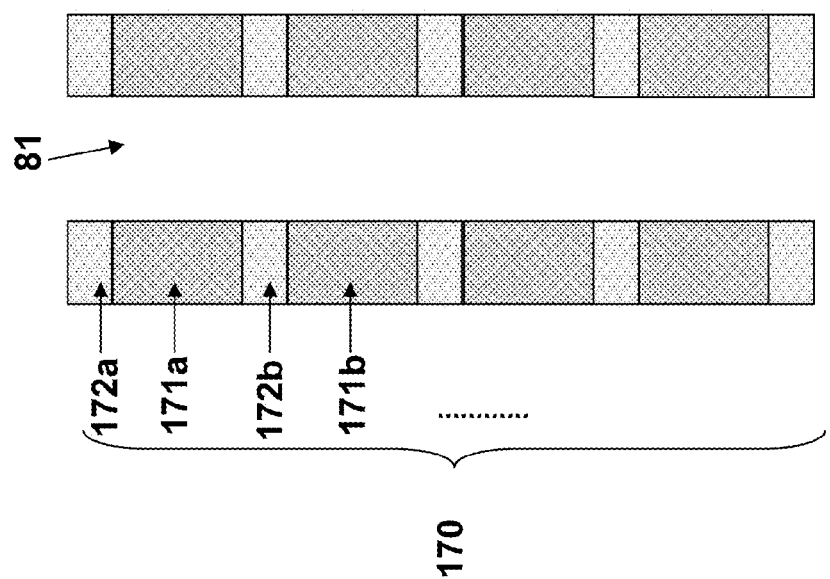

Referring to FIG. 59, a stack 170 of alternating layers of a first layer 171 and a second layer 172 are formed over a substrate (not shown). The first layer 171 comprises a conductive or semiconductor control gate material while the second layer 172 comprises an insulating material. The stack 170 is then etched to form at least one opening 81, resulting in a structure shown in FIG. 59.

Figure 60:
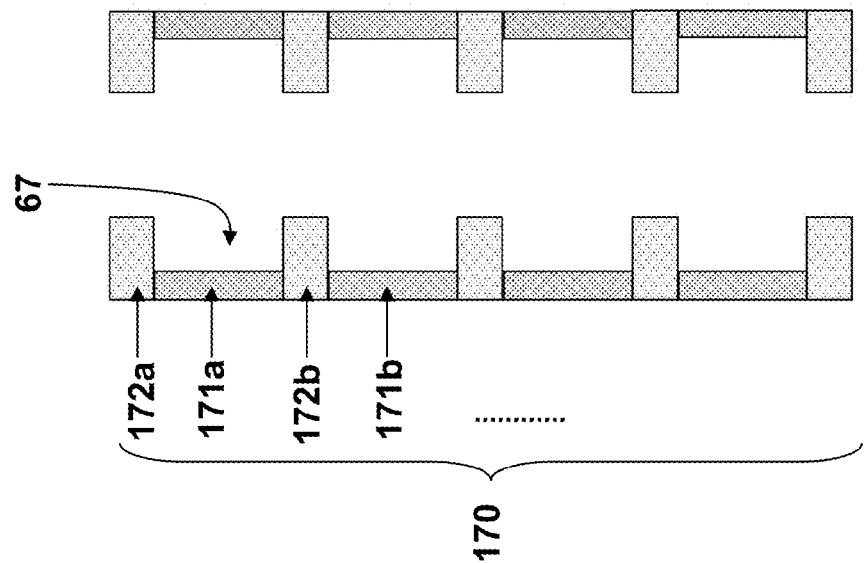
FIGS. 59-63 illustrate steps of a method of making the NAND string shown in FIG. 58 according to one embodiment of the invention.
Figure 61:
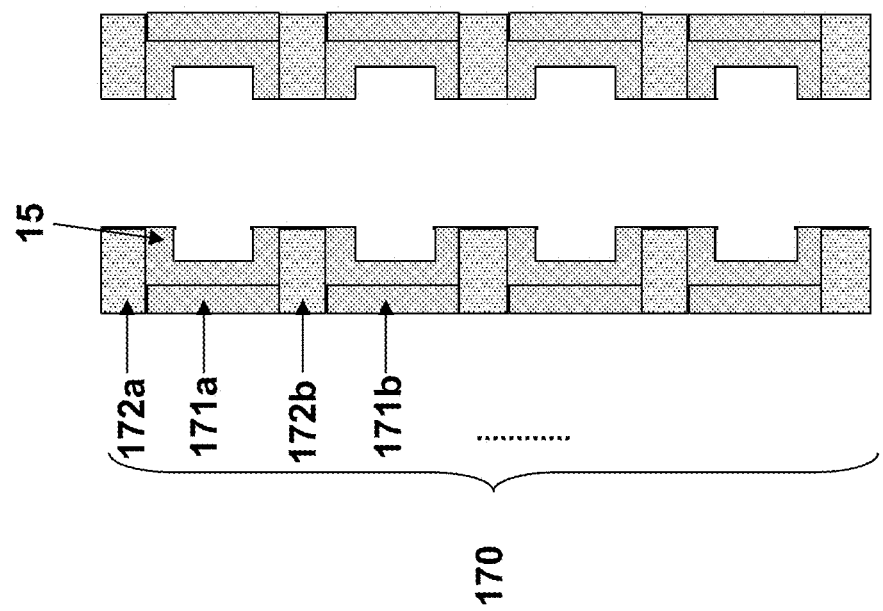
Figure 63:
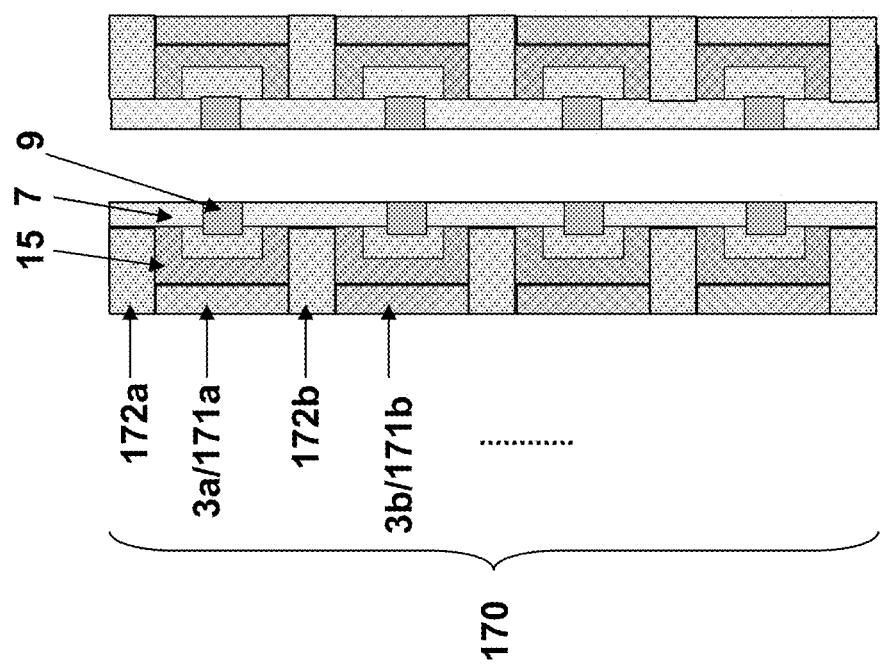

The first layer 171 is then selectively etched to form first recesses 67, resulting in a structure shown in FIG. 60. A conductive or semiconductor liner 15 (e.g., heavily doped polysilicon) is then formed in the first recesses 67 through opening 81 by ALD or CVD and subsequent anisotropic etch step. The conductive or semiconductor liner 15 has a clam shape, as shown in FIG. 61. The conductive or semiconductor liner 15 may comprise a material which is the same as or different from a material of the first layer 171 (i.e., material of control gates 3 shown in FIG. 58).

Figure 62:
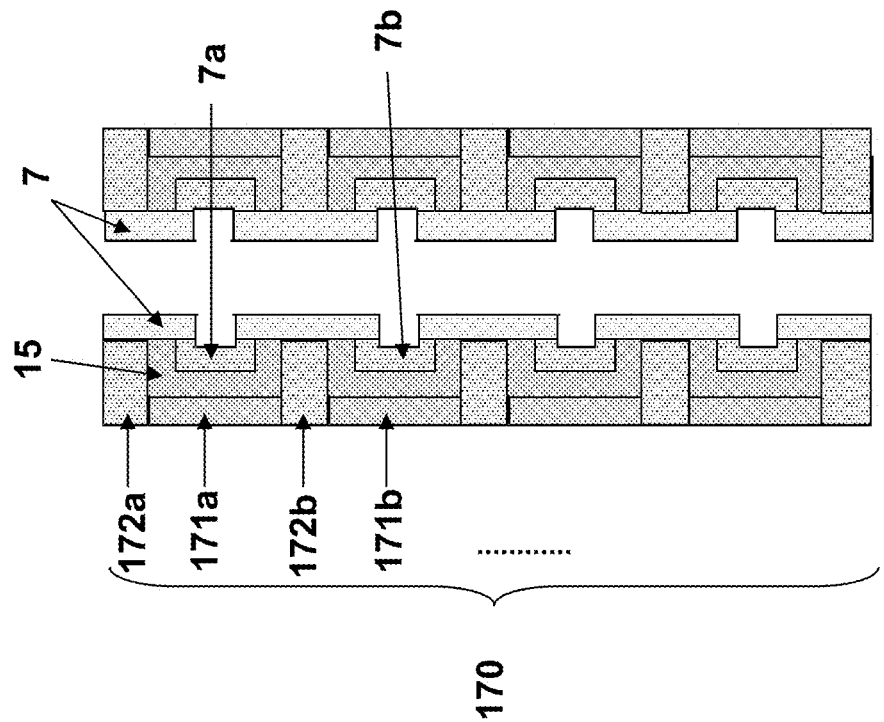

Next, a blocking dielectric layer 7 is formed in openings 81 to partially fill the first recesses 67. The blocking dielectric layer 7 is formed in the openings in the clam shaped liner 15 between overhanging portions of the second material 172. In some embodiments, the blocking dielectric 7 may be a silicon oxide layer which extends inside the liner 15 and outside of portions of the second material 172 in the opening 81 Layer 7 adopts the shape of the liner 15, and thus has a clam shaped segment in each device level. For example, a clam shaped dielectric segment 7a is located in device level A, and a clam shaped dielectric segment 7b is located in device level B, as shown in FIG. 62. The discrete charge storage segments 9 separated from each other can then be formed in the first recesses 67 in openings in the clam shaped blocking dielectric 7 as described in the previous embodiments, resulting in a structure shown in FIG. 63.

Similar methods to those described above can then be used to form a tunnel dielectric 11 over a side wall of the discrete charge storage segments 9 exposed in the at least one opening 81, and a semiconductor channel 1 is formed over the tunnel dielectric 11 in the at least one opening 81. In some embodiments, the step of forming the semiconductor channel 1 in the at least one opening forms a semiconductor channel material on the side wall of the at least one opening 81 but not in a central part of the at least one opening 81 such that the semiconductor channel material 1 does not completely fill the at least one opening 81, and an insulating fill material 2 is then formed in the central part of the at least one opening 81 to completely fill the at least one opening 81, resulting a structure shown in FIG. 58. Alternatively, the step of forming the semiconductor channel 1 in the at least one opening completely fills the at least one opening 81 with a semiconductor channel material. In this alternative embodiment, the insulating filler material 2 may be omitted.

Alternatively, rather than forming separate pillar shaped openings 81 having cylindrical, square or rectangular shape shown in FIGS. 44, 50, 53 and 59, two openings connected by a hollow connecting region having hollow U-shaped pipe shape of the second embodiment may be formed. In these alternative embodiments, the semiconductor channel 1 substantially adopts the shape of the hollow U-shaped pipe space, rather than having a pillar shape (as shown in FIGS. 43, 49 and 52 and 58). In these alternative embodiments, two upper electrodes may be used as the source/drain electrodes of the NAND string contacting the semiconductor channel from above, as shown in FIGS. 3 and 4, with an optional lower electrode contacting the bottom portion of the semiconductor channel as a body contact.

In the above described examples, the semiconductor channel 1 and the openings 81 have either a circular or a square top cross section when viewed from above. However, any other top cross sectional shapes may be used, for example but not limited to oval, triangular, or polygon, such as square, rectangle, pentagon, hexagon, etc.

The foregoing description of the embodiments of the invention has been presented for purposes of illustration and description. It is not intended to be exhaustive or to limit the invention to the precise form disclosed, and modifications and variations are possible in light of the above teaching or may be acquired from practice of the invention. The embodiments were chosen and described in order to explain the principles of the invention and as a practical application to enable one skilled in the art to utilize the invention in various embodiments and with various modification are suited to the particular use contemplated. It is intended that the scope of the invention be defined by the claims appended hereto and their equivalents.

What is claimed is:

1. A method of making a monolithic three dimensional NAND string, comprising:
    providing a stack of alternating first material layers and second material layers different from the first material layer over a substrate, the stack comprising at least one opening containing a charge storage material over a sidewall of the at least one opening, a tunnel dielectric on the charge storage material in the at least one opening, and a semiconductor channel on the tunnel dielectric in the at least one opening;
    selectively removing the second material layers without removing the first material layers from the stack; and
    forming control gates between the first material layers.

2. The method of claim 1, further comprising forming a blocking dielectric between the first material layers and a side wall of the charge storage material exposed between the first material layers.

3. The method of claim 2, further comprising forming a cut area on a back side of stack.

4. The method of claim 3, wherein:
    the second material layers are selectively removed through the cut area;
    the blocking dielectric is formed through the cut area such that the blocking dielectric contacts the sidewall of the charge storage material exposed between the first material layers; and
    the control gates are formed through the cut area.

5. The method of claim 4, wherein portions of the blocking dielectric between the first material layers have a clam shape, and wherein each of the control gates is located at least partially in an opening in a respective clam-shaped portion of the blocking dielectric.

6. The method of claim 1, wherein the tunnel dielectric has a straight sidewall and a uniform thickness.

7. The method of claim 1, wherein the charge storage material comprises a charge storage dielectric material.

8. The method of claim 1, wherein the charge storage material comprises a floating gate material.

9. The method of claim 8, wherein the floating gate material comprises polysilicon, metal, metal alloy or metal silicide.

10. The method of claim 1, wherein the charge storage material comprises conductive nanoparticles.

11. The method of claim 1, wherein one of the first material layers and the second material layers comprise an oxide and the other of the first material layers and the second material layers comprise a nitride.

12. The method of claim 1, wherein the semiconductor channel in the at least one opening completely fills the at least one opening with a semiconductor channel material.

13. The method of claim 1, wherein the semiconductor channel in the at least one opening forms a semiconductor channel material on the side wall of the at least one opening but not in a central part of the at least one opening such that the semiconductor channel material does not completely fill the at least one opening.

14. The method of claim 13, further comprising forming an insulating fill material in the central part of the at least one opening to completely fill the at least one opening.

15. The method of claim 1, furthering comprising forming an upper electrode over the semiconductor channel and forming a lower electrode below the semiconductor channel.

16. The method of claim 1, wherein the control gates comprise conductive or semiconductor control gate material.

17. The method of claim 16, wherein the control gates comprise tungsten, copper, aluminum, tantalum, titanium, cobalt, titanium nitride or alloys thereof.

18. The method of claim 17, wherein the control gates comprise tungsten.

19. The method of claim 1, wherein the step of providing the stack comprises:
   etching the stack to form the at least one opening in the stack;
   forming the charge storage material over a sidewall of the at least one opening;
   forming the tunnel dielectric on the charge storage material in the at least one opening; and
   forming the semiconductor channel on the tunnel dielectric in the at least one opening.

20. The method of claim 1, wherein:
   the semiconductor channel extends substantially perpendicular to a major surface of the substrate;
   the NAND string comprises a plurality of device levels over the substrate;
   the NAND string is vertically oriented, such that at least one memory cell is located over another memory cell in the NAND string; and
   each of the plurality of device levels comprises a respective control gate, a respective blocking dielectric portion adjacent to the respective control gate, a respective charge storage material portion adjacent to respective blocking dielectric portion, a respective tunnel dielectric portion adjacent to the respective charge storage material portion, and a respective portion of the semiconductor channel.

* * * * *